United States Patent
Bushnaq et al.

(10) Patent No.: US 9,767,910 B1
(45) Date of Patent: Sep. 19, 2017

(54) SEMICONDUCTOR MEMORY DEVICE AND MEMORY SYSTEM

(71) Applicant: KABUSHIKI KAISHA TOSHIBA, Minato-ku, Tokyo (JP)

(72) Inventors: Sanad Bushnaq, Yokohama Kanagawa (JP); Takayuki Akamine, Yokohama Kanagawa (JP); Masanobu Shirakawa, Chigasaki Kanagawa (JP)

(73) Assignee: TOSHIBA MEMEORY CORPORATION, Tokyo (JP)

( * ) Notice: Subject to any disclaimer, the term of this patent is extended or adjusted under 35 U.S.C. 154(b) by 0 days.

(21) Appl. No.: 15/264,555

(22) Filed: Sep. 13, 2016

(30) Foreign Application Priority Data

Mar. 14, 2016 (JP) .................................. 2016-050113

(51) Int. Cl.
*G11C 16/04* (2006.01)
*G11C 16/10* (2006.01)
*G11C 16/24* (2006.01)

(52) U.S. Cl.
CPC .............. *G11C 16/10* (2013.01); *G11C 16/24* (2013.01)

(58) Field of Classification Search
CPC ................................ G11C 16/10; G11C 16/24
USPC ........................................ 365/185.17, 185.18
See application file for complete search history.

(56) References Cited

U.S. PATENT DOCUMENTS

| | | | | |
|---|---|---|---|---|
| 7,725,645 | B2* | 5/2010 | Qawami | G11C 7/1051 711/103 |
| 7,813,212 | B2* | 10/2010 | Kim | G11C 5/025 365/185.04 |
| 8,644,074 | B2* | 2/2014 | Chang | G11C 16/0483 365/185.17 |
| 9,235,488 | B2* | 1/2016 | Norrie | G06F 11/2215 |
| 9,269,445 | B1 | 2/2016 | Abe et al. | |
| 9,384,128 | B2* | 7/2016 | Tuers | G06F 12/0246 |
| 2009/0267128 | A1 | 10/2009 | Maejima | |
| 2009/0268522 | A1 | 10/2009 | Maejima | |
| 2010/0207195 | A1 | 8/2010 | Fukuzumi et al. | |
| 2010/0214838 | A1 | 8/2010 | Hishida et al. | |
| 2011/0284946 | A1 | 11/2011 | Kiyotoshi | |
| 2012/0069663 | A1 | 3/2012 | Itagaki et al. | |
| 2012/0307557 | A1 | 12/2012 | Itagaki | |
| 2015/0370705 | A1 | 12/2015 | Yoon et al. | |

OTHER PUBLICATIONS

Taiwanese Office Action dated Jun. 6, 2017 issued in counterpart Taiwanese Application No. 105126138.

\* cited by examiner

*Primary Examiner* — Pho M Luu
(74) *Attorney, Agent, or Firm* — Holtz, Holtz & Volek PC

(57) ABSTRACT

A semiconductor memory device includes: a first memory unit including first to fourth memory cells; a second memory unit including fifth to eighth memory cells; a first word line coupled to gates of the first and fifth memory cells; a second word line coupled to gates of the second and sixth memory cells; a third word line coupled to gates of the third and seventh memory cells; and a fourth word line coupled to gates of the fourth and eighth memory cells. In a write operation, writes to the fourth memory cell, the first memory cell, the eighth memory cell, and the fifth memory cell are executed in order.

20 Claims, 39 Drawing Sheets

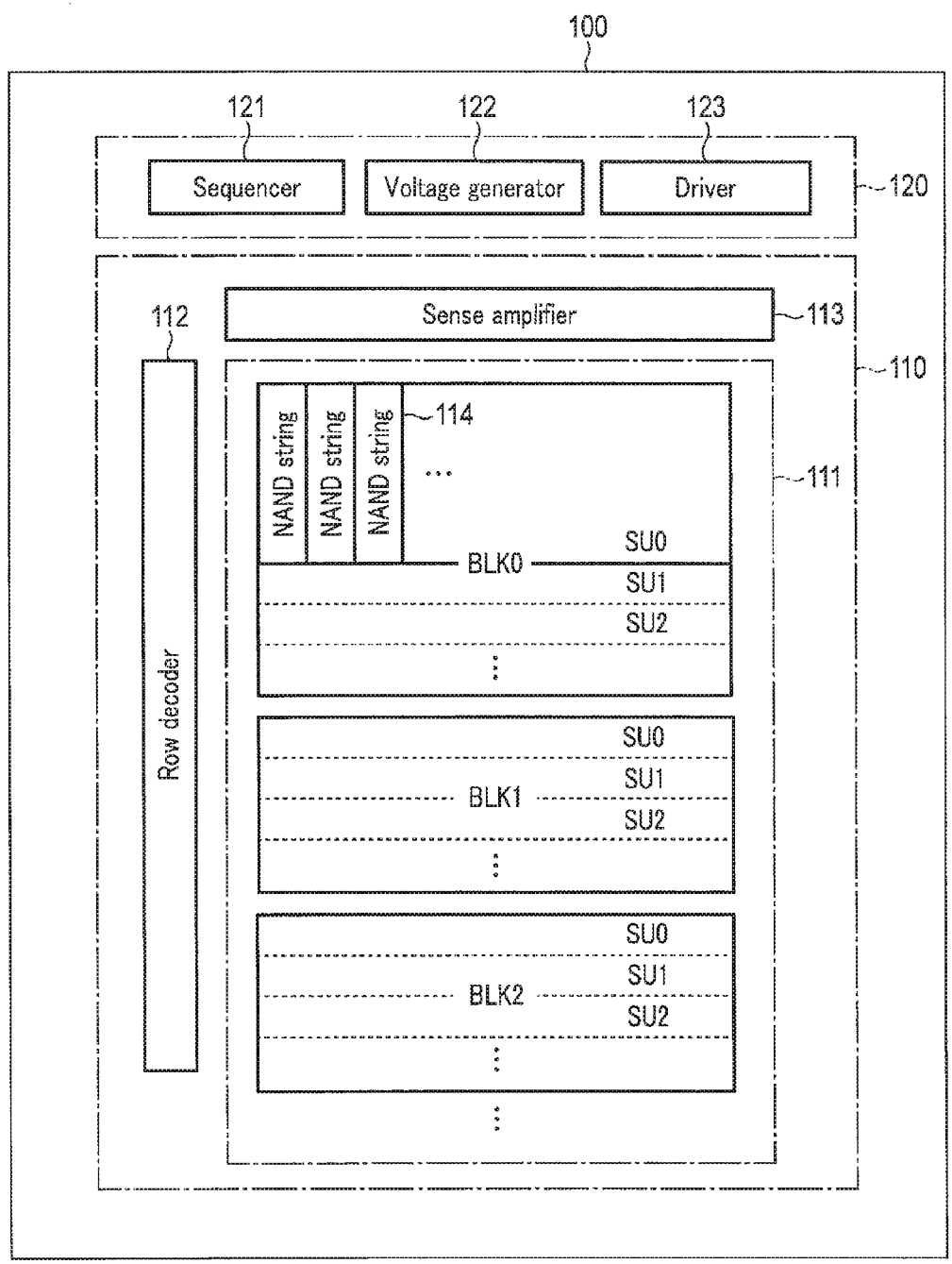
F I G. 2

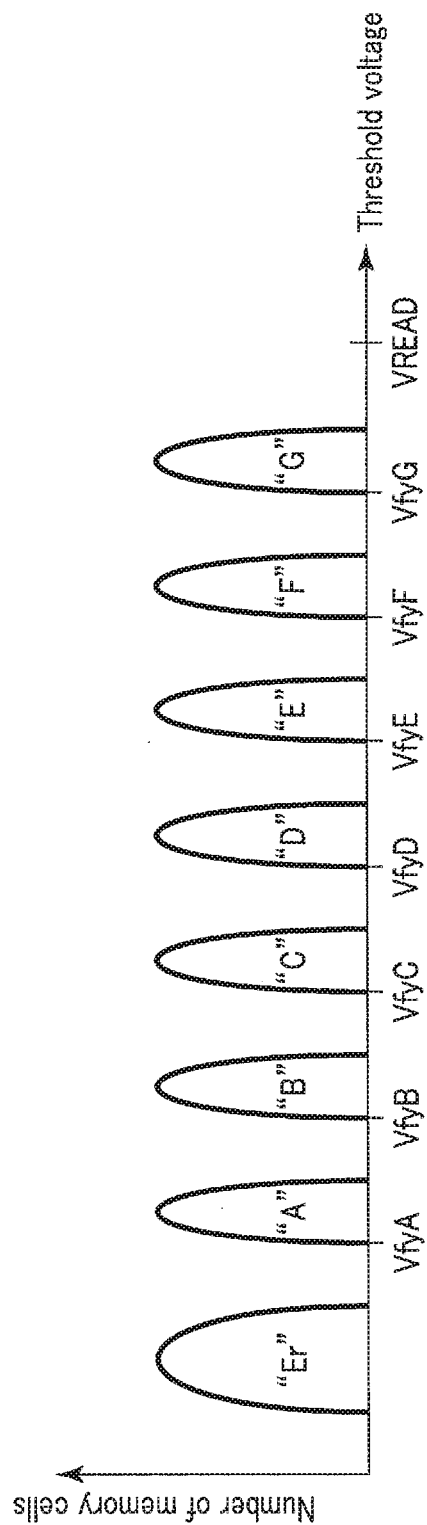
F I G. 5

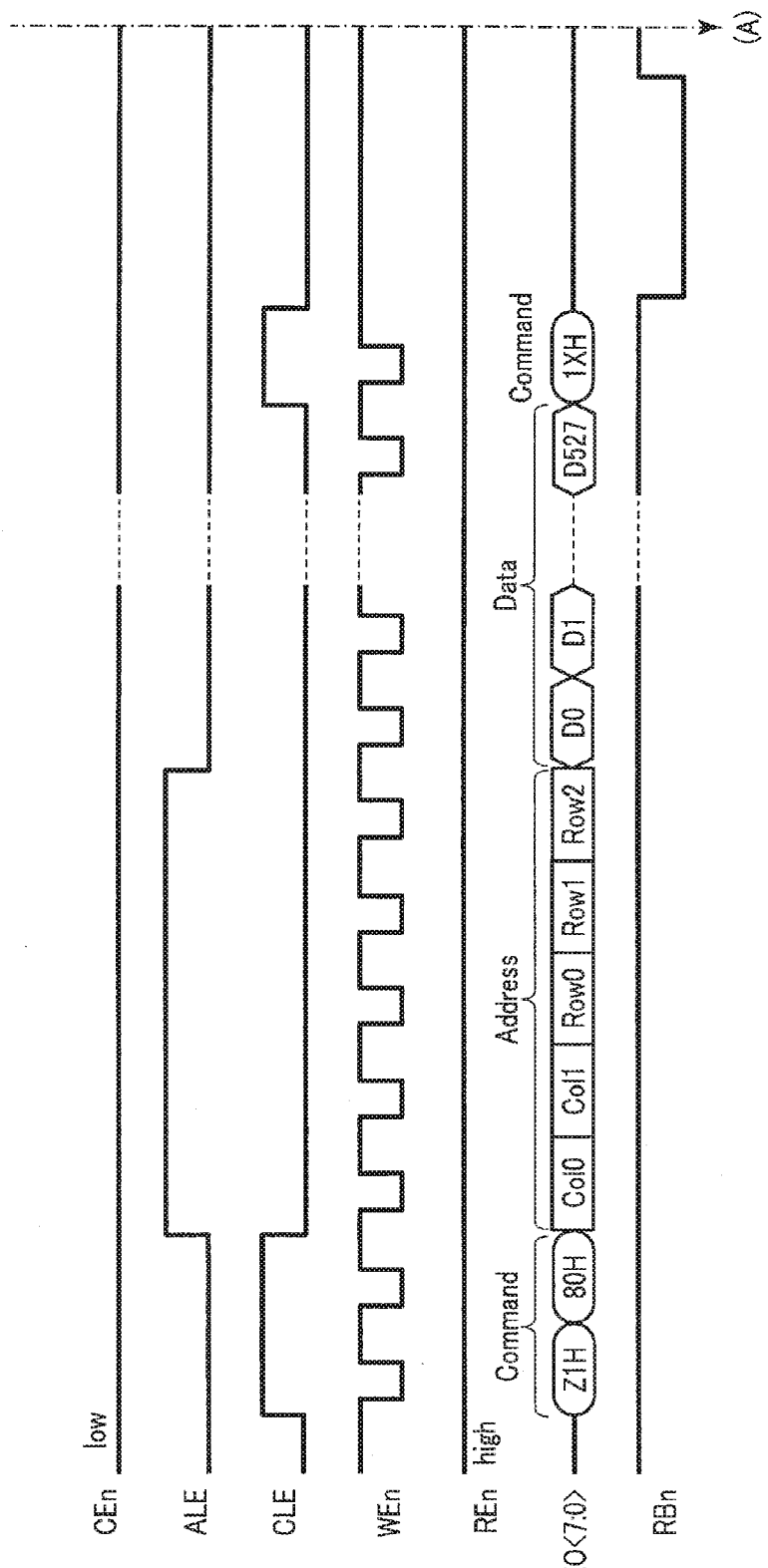
F I G. 6

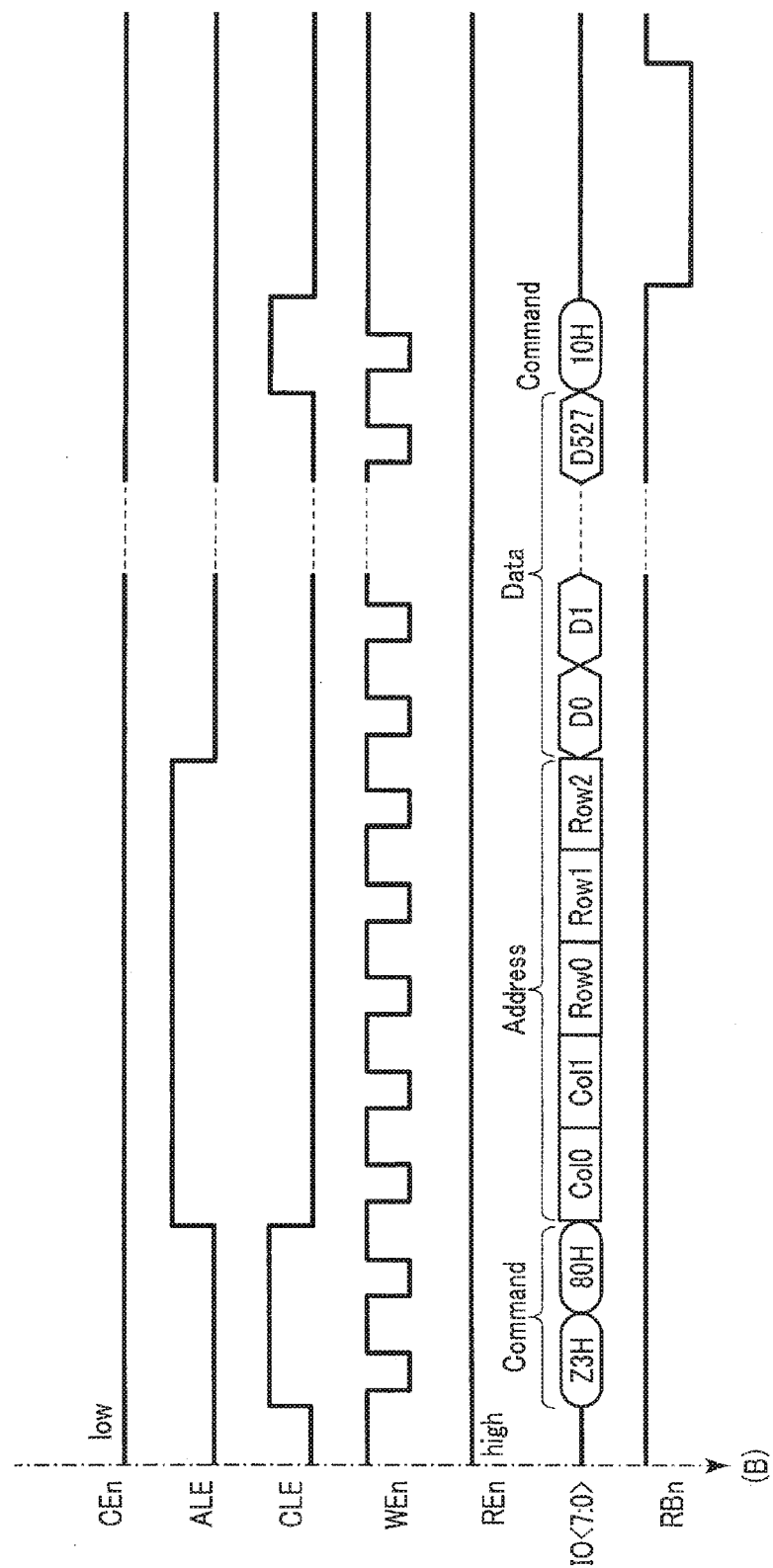
F I G. 8

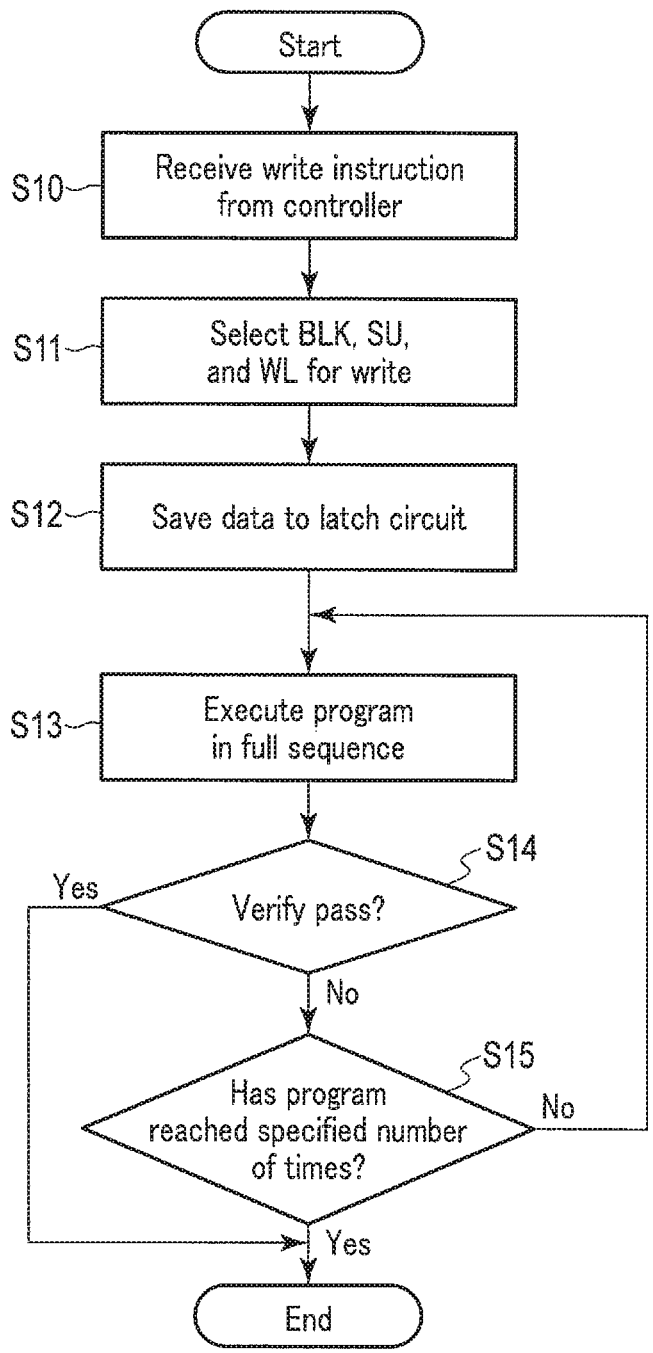
F I G. 10

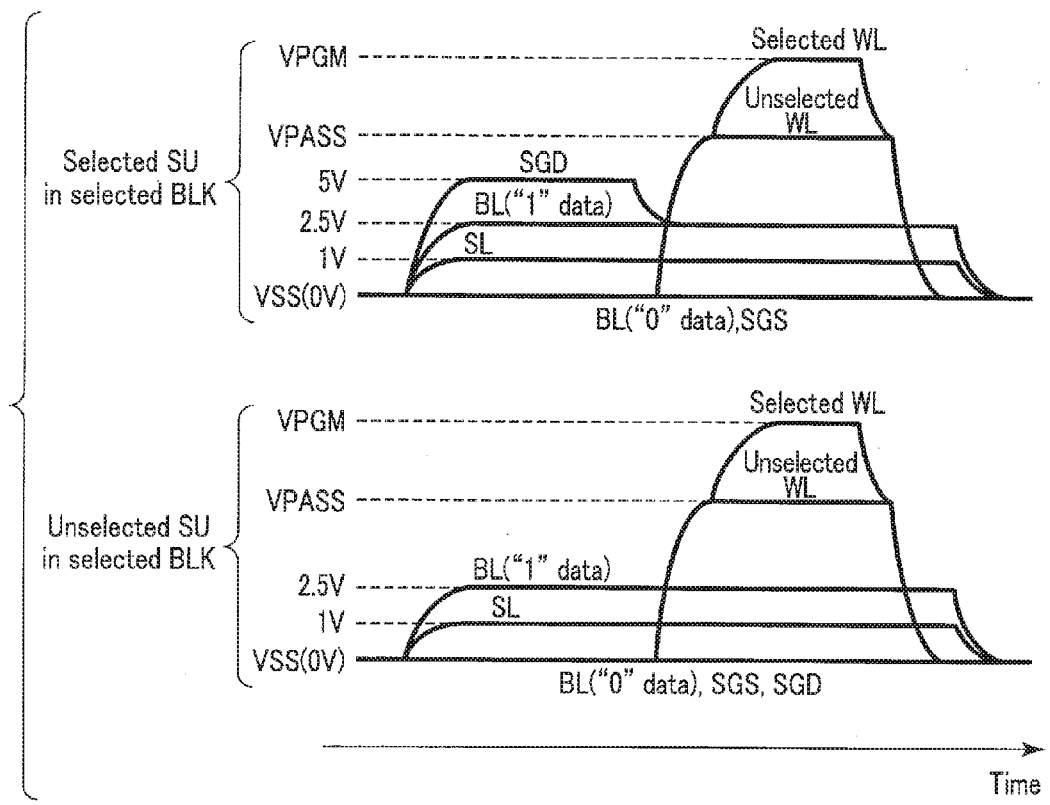
F I G. 11

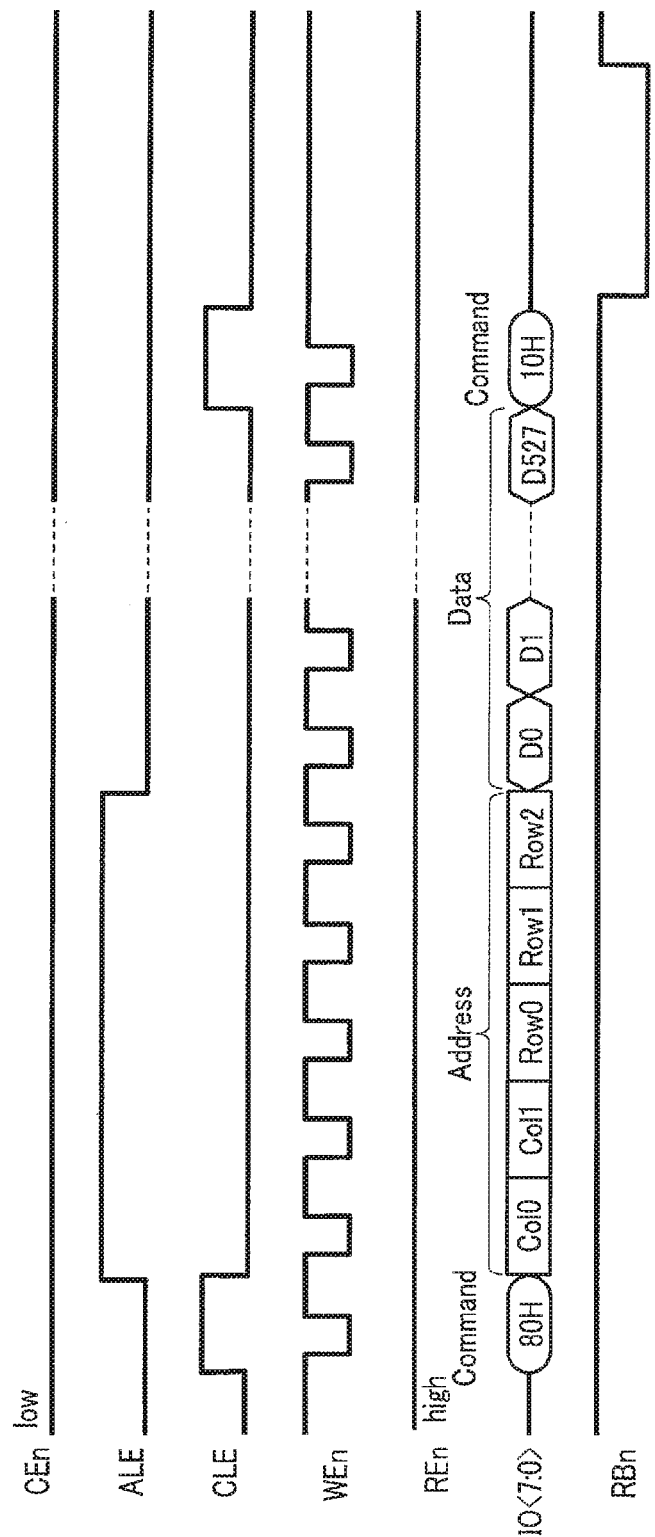
F I G. 19

FIG. 31

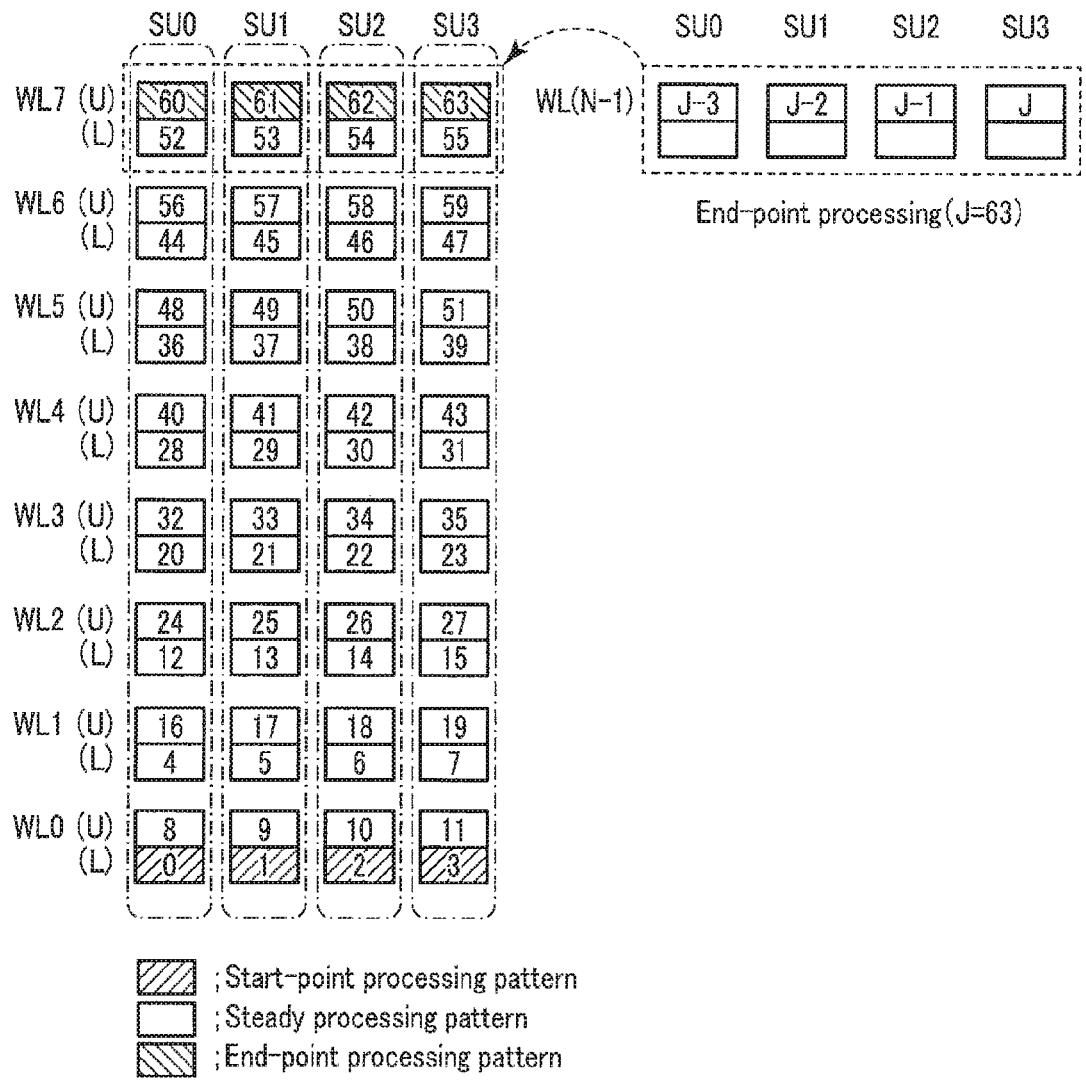
F I G. 32

FIG. 33

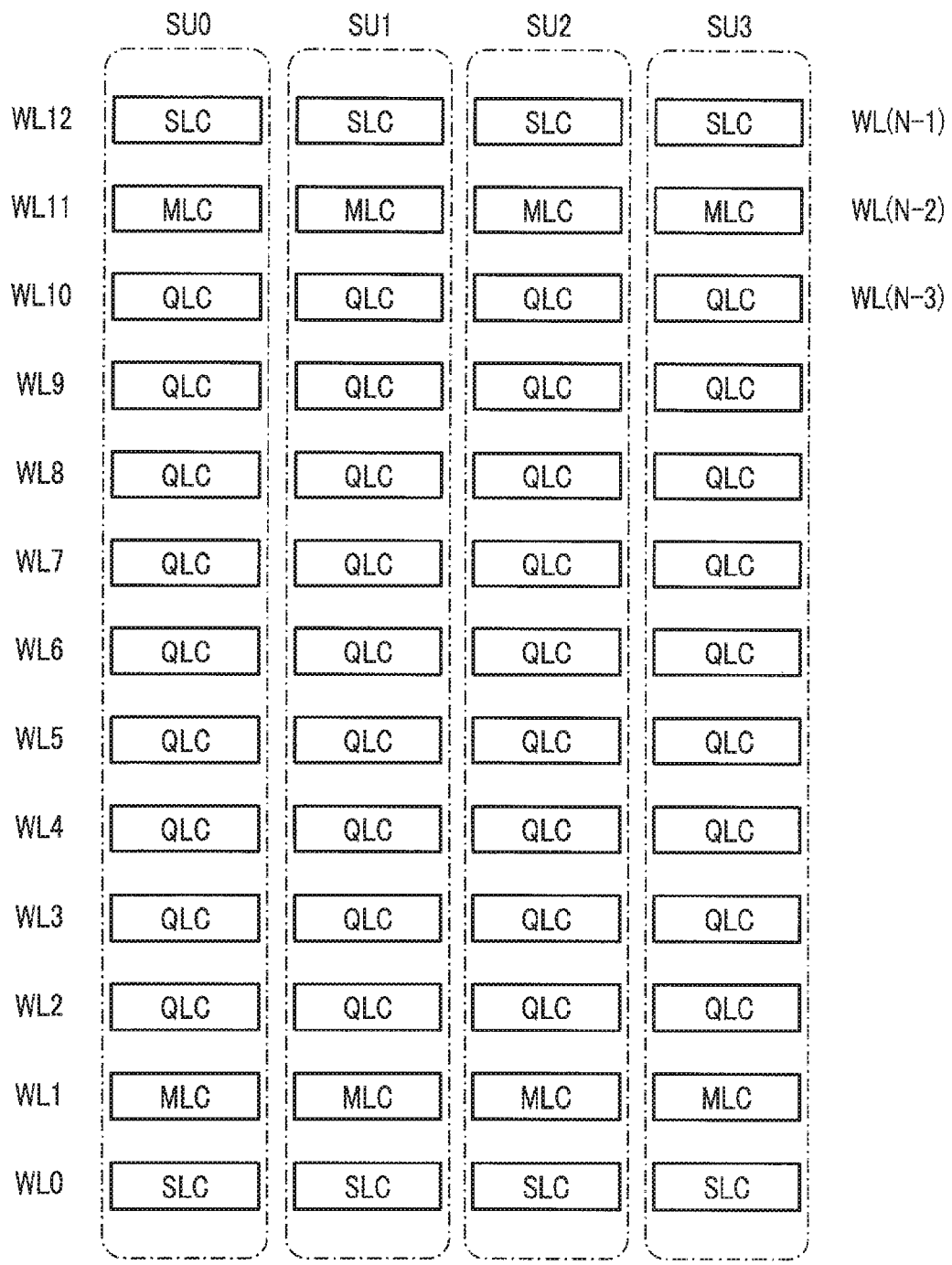
F I G. 38

SEMICONDUCTOR MEMORY DEVICE AND MEMORY SYSTEM

CROSS-REFERENCE TO RELATED APPLICATIONS

This application is based upon and claims the benefit of priority from Japanese Patent Application. No. 2016-050113, filed Mar. 14, 2016, the entire contents of which are incorporated herein by reference.

FIELD

Embodiments described herein relate generally to a semiconductor device and a memory system.

BACKGROUND

NAND flash memory is known as a semiconductor memory device.

BRIEF DESCRIPTION OF THE DRAWINGS

FIG. 2 is a block diagram of a. semiconductor memory device according to the first embodiment;

FIG. 5 is a threshold distribution diagram for memory cell transistors in the semiconductor memory device according to the first embodiment;

FIGS. 6 to 8 are a timing chart for various signals in a write operation in the memory system according to the first embodiment;

FIG. 10 is a flowchart illustrating a write operation in. the semiconductor memory device according to the first embodiment;

FIG. 11 is a timing chart illustrating voltages of interconnects in a write operation in the semiconductor memory device according to the first embodiment;

FIG. 19 is a timing chart for various signals in a write operation in a memory system according to a sixth embodiment;

FIG. 31 is a diagram illustrating the writing order in a semiconductor memory device according to a third example in the ninth embodiment;

FIG. 32 is a diagram illustrating the writing order in a semiconductor memory device according to a first example in a 10th embodiment;

FIG. 33 is a diagram illustrating the writing order in a semiconductor memory device according to a second example in the 10th embodiment;

FIG. 38 is a block diagram depicting a configuration of full sequence units FSU in one block in a semiconductor memory device according to a first modification;

DETAILED DESCRIPTION

In general, according to one embodiment, a semiconductor memory device includes: a first memory unit including first to fourth memory cells stacked above a semiconductor substrate in order, a second memory unit including fifth to eighth memory cells stacked above the semiconductor substrate in order, a first word line coupled to gates of the first and fifth memory cells, a second word line coupled to gates of the second and sixth memory cells, a third word line coupled to gates of the third and seventh memory cells, and a fourth word line coupled to gates of the fourth and eighth memory cells. In a write operation, writes to the fourth memory cell, the first memory cell, the eighth memory cell, and the fifth memory cell are executed in order.

1. First Embodiment

A semiconductor memory device and a memory system according to a first embodiment will be described. As a semiconductor memory device, a three-dimensional stacked NAND flash memory with memory cell transistors stacked on a semiconductor substrate will be described by way of example.

1.1 Configuration 1.1.1 General Configuration of the Memory System

First, a general configuration of a memory system according to the present embodiment will be described using FIG. 1.

Figure 1:
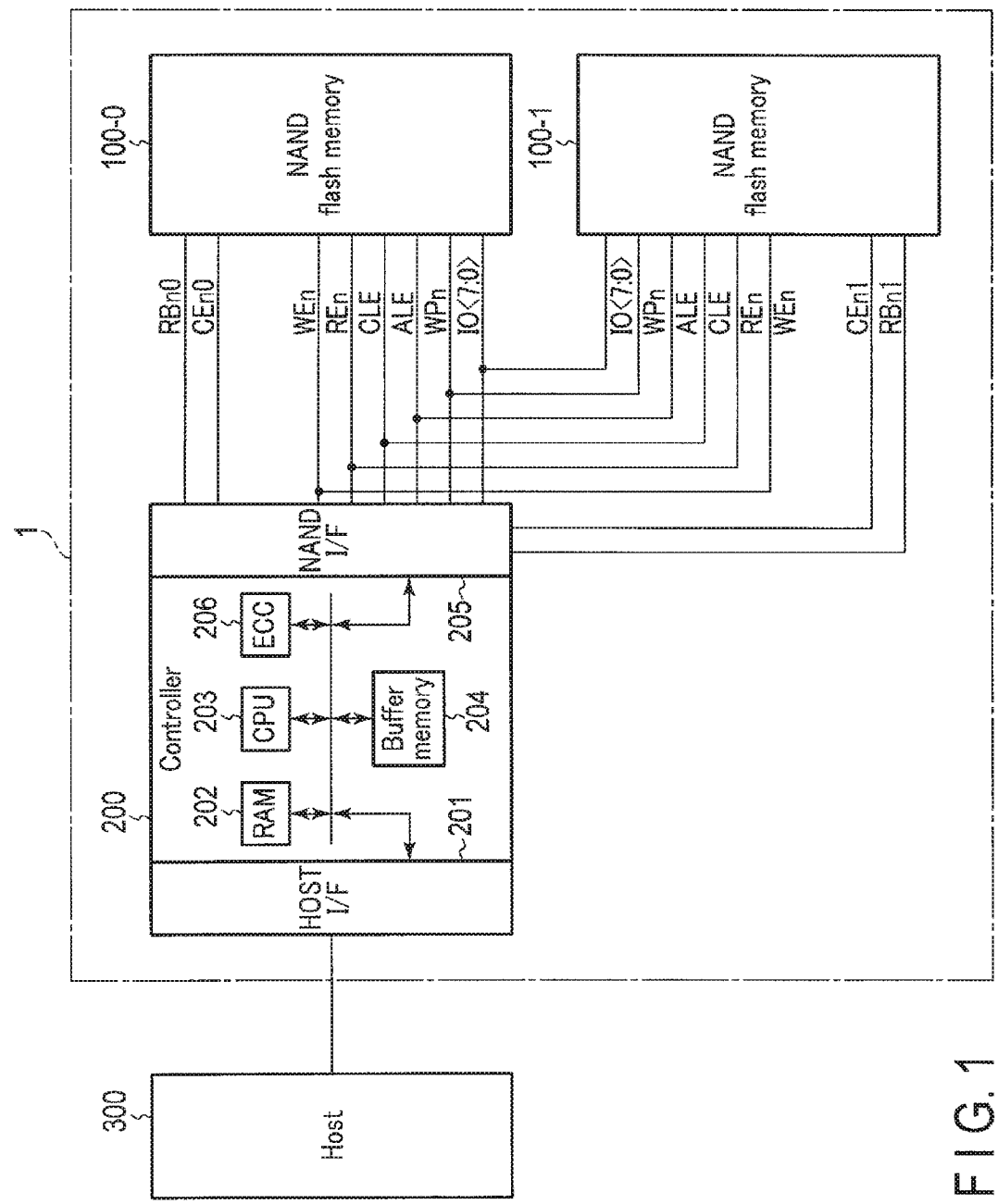
FIG. 1 is a block diagram of a memory system according to a first embodiment.

As depicted in FIG. 1, a memory system 1 comprises, for example, a plurality of NAND flash memories 100 and one controller 200 and is coupled to host device 300 via a controller bus. In the figures and the following description, the NAND flash memory (100_0 and 100_1) is based on two examples. One or three or more NAND flash memories may be coupled to the controller 200.

Each of the NAND flash memories 100 comprises a plurality of memory cell transistors and can store data in a nonvolatile manner. The NAND flash memory 100 is coupled to the controller 200 via a NAND bus and operates based on instructions from the controller 200. That is, each of the NAND flash memories 100 transmits and receives, for example, 8-bit I/O signals IO<7:0> to and from the controller 200. Each I/O signals IO<7:0> is, for example, a commands, address signals, or data. The NAND flash memory 100 receives control signals from the controller 200 and transmits status signals.

The control signals include chip enable signals CEn0 and CEn1, a write enable signal WEn, a read enable signal REn, a command latch enable signal CLE, an address latch enable signal ALE, and a write protect signal WPn. The controller 200 transmits the signals WEn, REn, CLE, ALE, and WPn to the NAND flash memories 100_0 and 100_1. The controller 200 transmits the chip enable signal CEn0 to the NAND flash memory 100_0 and transmits the chip enable signal CEn1 to the NAND flash memory 100_1.

The chip enable signal CEn (CEn0 and CEn1) is a signal that allows the target NAND flash memory 100 to be set to an enable state and is asserted at an "L" level. The write enable signal WEn is a signal that indicates loading of the I/O signal IO<7:0> into the NAND flash memory 100 and is asserted at the "L" level. Therefore, each time WEn is toggled, the I/O signal IO<7:0> is loaded into the NAND flash memory 100. The read enable signal REn is a signal that allows indication of output of the I/O signal IO<7:0> to the NAND flash memory 100 and is asserted at the "L" level. The command latch enable signal CLE is a signal indicating that the I/O signal IO<7:0> is a command and is asserted at an "H" level. The address latch enable signal ALE is a signal indicating that the I/O signal IO0<7:0> is an address signal and is asserted at the "H" level. The write protect signal WPn is a signal that orders the NAND flash memory 100 not to load the I/O signal IO<7:0> and is asserted at the "L" level.

The status signal is indicative of various states of the NAND flash memory 100 and includes a ready/busy signal RBn (RBn0 and RBn1). The ready/busy signal RBn is a signal indicating whether or not the NAND flash memory 100 is in a busy state (whether or not the NAND flash memory 100 is not enabled or is enabled to receive commands from the controller 200). When in the busy state, the ready/busy signal RBn is at the "L" level. The ready/busy signal RBn0 is output from the NAND flash memory 100_0, and the ready/busy signal RBn1 is output from the NAND flash memory 100_1. By receiving a state code signal, the controller 200 can determine the state of each NAND flash memory 100.

The controller 200 orders the NAND flash memory 100 to perform read, write, erase, and the like based on an instruction from the host device 300.

The controller 200 comprises a host interface circuit 201, a memory (RAM) 202, a processor (CPU) 203, a buffer memory 204, a NAND interface circuit 205, and an ECC (Error Correcting Code) circuit 206.

The host interface circuit 201 is coupled to the host device 300, for example, via a controller bus such as an SD card bus or a PCIe bus to control communication between the controller 200 and the host device 300.

The NAND interface circuit 205 is coupled to each NAND flash memory 100 via a NAND bus to control communication between the controller 200 and the NAND flash memory 100.

The CPU 203 controls operation of the controller 200 as a whole.

The RAM 202 is, for example, a DRAM (Dynamic Random Access Memory) and is used as a work area for the CPU 230.

The buffer memory 204 temporarily holds data to be transmitted to the NAND flash memory 100 and data transmitted from the NAND flash memory 100.

The ECC circuit 206 detects and corrects an error in data using an error correcting code.

1.1.2 General Configuration of the Semiconductor Memory Device

Now, a general configuration of the semiconductor memory device will be described using FIG. 2. As depicted in FIG. 2, the NAND flash memory 100 generally comprises a core section 110 and a peripheral circuit section 120.

The core section 110 comprises a memory cell array 111, a row decoder 112, and a sense amplifier 113.

The memory cell array 111 comprises a plurality of blocks BLK (BLK0, BLK1, . . . ) each of which is a set of a plurality of nonvolatile memory cell transistors. Each of the blocks BLK comprises a plurality of string units SU (SU0, SU1, . . . ) each of which is a set of memory cell transistors associated with word lines and bit lines. Each of the string units SU comprises a plurality of NAND strings 114 in each of which the memory cell transistors are coupled together in series. Any number of NAND strings 114 may be provided in the string unit SU. The memory cell array 111 will be described below in detail.

The row decoder 112 decodes, for example, in a write or read operation, decodes a block address or a page address to select a word line corresponding to a target page. The row decoder 112 then applies appropriate voltages to a selected word line and unselected word lines.

The sense amplifier 113 comprises a plurality of sense amplifier units (not depicted in the drawings). The sense amplifier units are provided in association with the bit lines. In the read operation, the sense amplifier unit senses data read onto the corresponding bit line from the corresponding memory cell transistor. In the write operation, the sense amplifier unit transfers write data to the corresponding memory cell transistor. Each of the sense amplifier units further includes a plurality of latch circuits (not depicted in the drawings) in order to hold data.

The peripheral circuit section 120 comprises a sequencer 121, a voltage generator 122, and a driver 123.

The sequencer 121 controls operation of the NAND flash memory 100 as a whole.

The voltage generator 122 increases or reduces a power supply voltage VDD to generate voltages needed for data write, read, and erase and supplies the voltages to the driver 123.

The driver 123 supplies the voltages generated by the voltage generator 122 to the row decoder 112, the sense amplifier 113, and a source line, a well, and the like which are not depicted in the drawings.

1.1.3 Circuit Configuration of the Memory Cell Array

Figure 3:
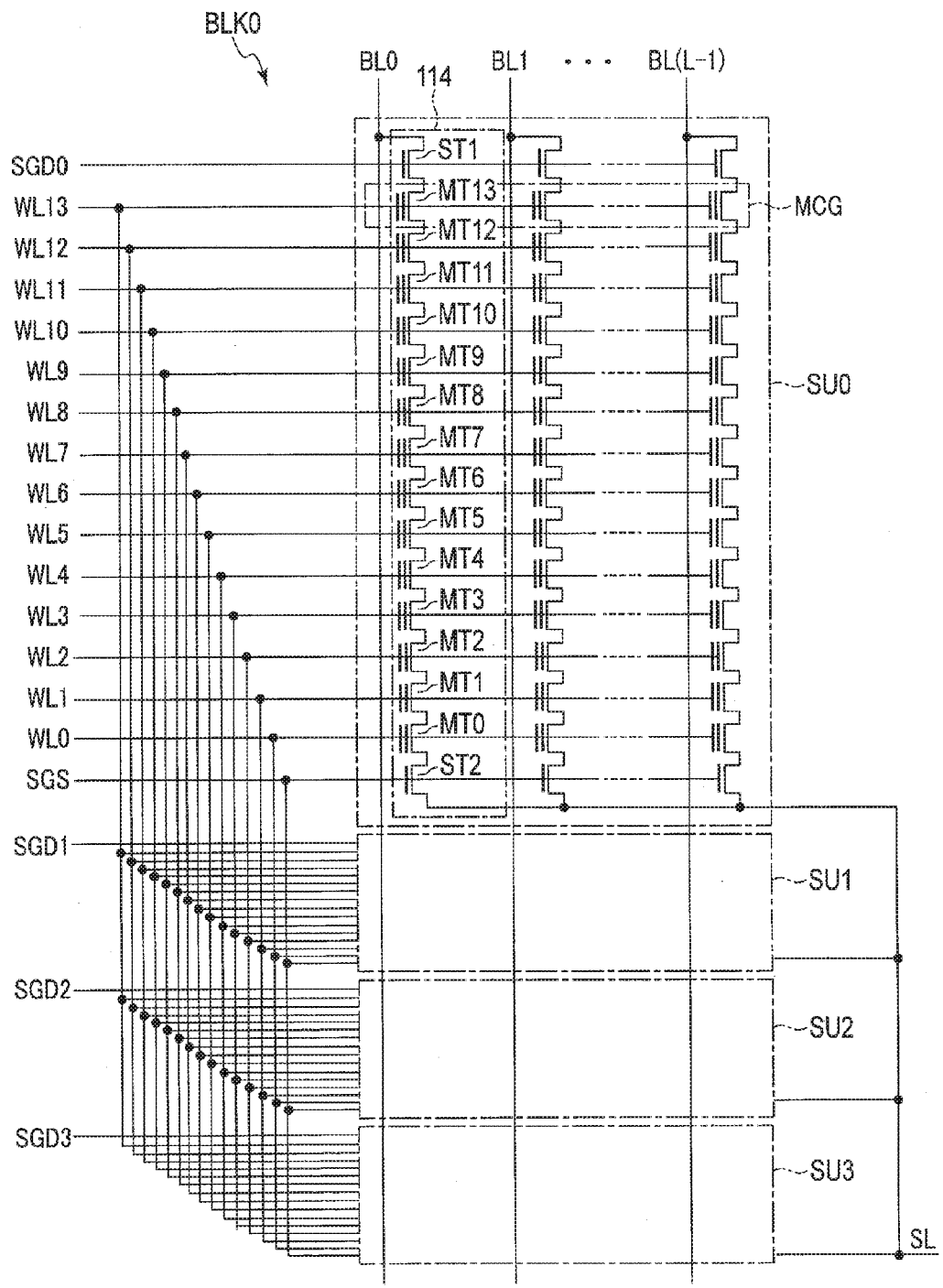
FIG. 3 is a circuit diagram of a memory cell array in. the semiconductor memory device according to the first embodiment.

Now, a circuit configuration of the memory cell array 111 will be described using FIG. 3. FIG. 3 depicts a circuit configuration of the block BLK0, but the other blocks have similar configurations.

As depicted in FIG. 3, the block BLK has, for example, four string units SU0 to SU3. Each of the string units SU includes a plurality of NAND strings 114.

Each of the NAND strings 114 includes, for example, 14 memory cell transistors MT (MT0 to MT13) and select transistor ST1 and ST2. Each of the memory cell transistors MT comprises a control gate and a charge storage layer to hold data in a nonvolatile manner. The 14 memory cell transistors MT (MT0 to MT13) are coupled together in series between a source of the select transistor ST1 and a drain of the select transistor ST2. The memory cell transistors MT may be of a MONOS type in which an insulating film is used as the charge storage layer or an FG type in which a conductive film is used as the charge storage layer.

Moreover, the number of memory cell transistors MT in the NAND string 114 is not limited to 14.

Gates of the select transistors ST1 in the string units SU0 to SU3 are coupled to select gate lines SGD0 to SGD3, respectively. In contrast, gates of the select transistors ST2 in the string units SU0 to SU3 are coupled, for example, to a common select gate line SGS. Of course, the gates of the select transistors ST2 in the string units SU0 to SU3 may be coupled to different select gate lines SGS0 to SGS3. The control gates of the memory cell transistors MT0 to MT13 in the same block BLK are coupled to word lines WL0 to WL13, respectively.

Drains of the select transistors ST1 in the NAND strings 114 in the string unit SU are coupled to different bit lines BL (BL0 to BL(L–1); (L–1) is a natural number of 2 or more). Each of the bit lines BL couples together the NAND strings 114 each of which is included in each of the string units SU in the plurality of blocks BLK. Sources of the select transistors ST2 are coupled to the source line SL.

In other words, the string units SU is an aggregate of the NAND strings 114 coupled to the different bit lines BL and also coupled to the same select gate line SGD. The block BLK is an aggregate of a plurality of string units SU using the common word lines WL. The memory cell array 111 is an aggregate of a plurality of blocks BLK using the common bit lines BL.

Data write and read operations are performed on memory cell transistors coupled to one of the word lines in one of the string units SU together. A group of memory cell transistors MT selected together in data write and read operations is hereinafter referred to as a "memory cell group MCG". A set of 1 bit of data written to or read from one memory cell group MCG is hereinafter referred to as a "page".

In the present embodiment, one or more bits of data are written together to one memory cell transistor MT according to the number of bits that can be held by the memory cell transistor MT (this is hereinafter referred to as a "full sequence"). That is, one or more pages of data are written together to one memory cell group MCG. A set of pages written to one memory cell group MCG together in a full sequence is hereinafter referred to as a "full sequence unit FSU".

Data erase can be performed in units of blocks BLK or in units smaller than blocks BLK. An erase method is described in, for example, U.S. patent application Ser. No. 13/235,389 entitled "NONVOLATILE SEMICONDUCTOR MEMORY DEVICE" filed on Sep. 18, 2011. An erase method is also described in, for example, U.S. patent application Ser. No. 12/694,690 entitled "NON-VOLATILE SEMICONDUCTOR STORAGE DEVICE" filed on Jan. 27, 2010. An erase method is also described in, for example, U.S. patent application Ser. No. 13/483,610 entitled "NON-VOLATILE SEMICONDUCTOR MEMORY DEVICE AND DATA ERASE METHOD THEREOF" filed on May 30, 2012. These patent applications are incorporated herein in entireties thereof by reference.

Figure 4:
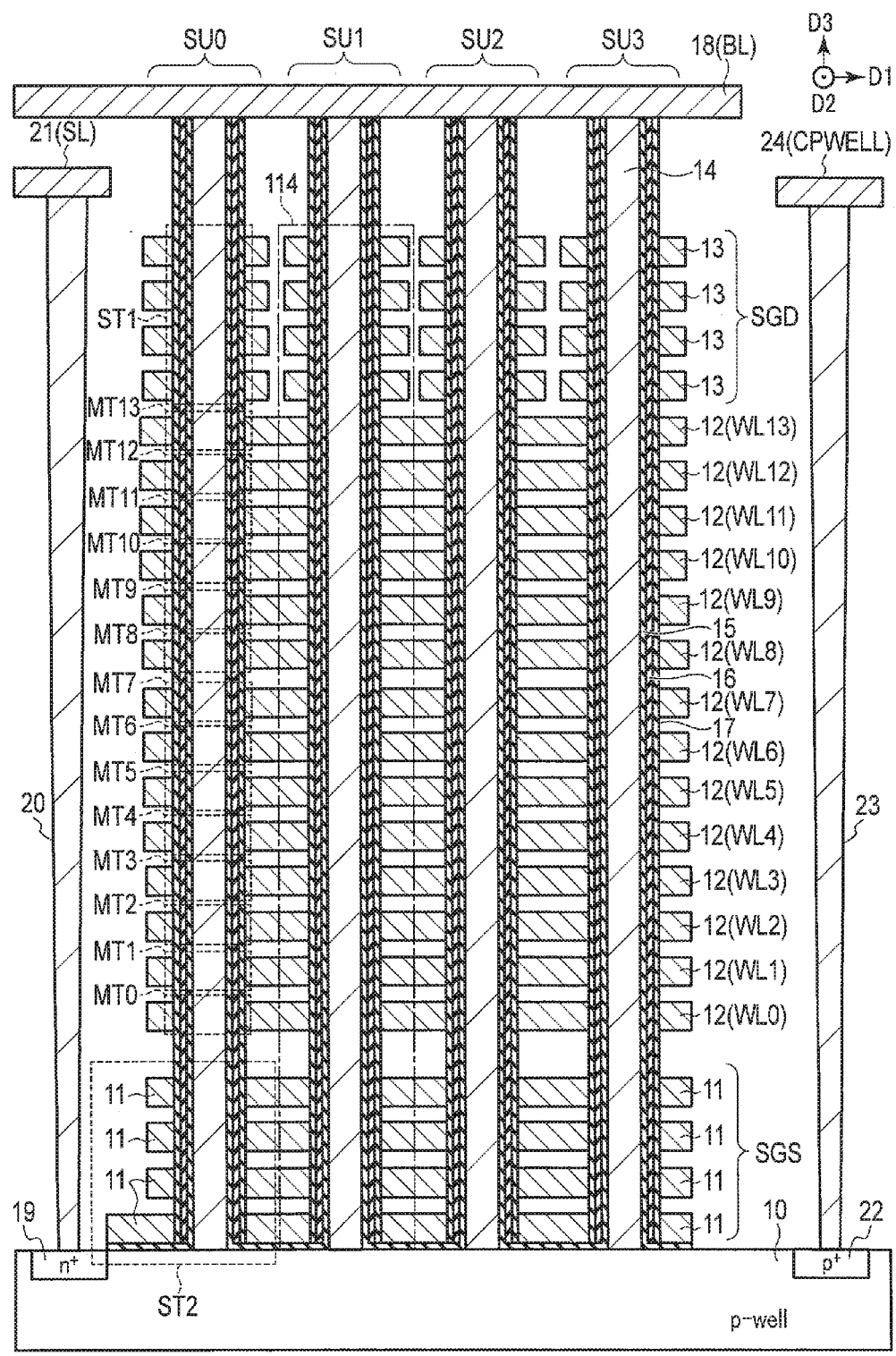
FIG. 4 is a cross-sectional view of a memory cell array in. the semiconductor memory device according to the first embodiment.

FIG. 4 is a cross-sectional view of a partial area of the block BLK. As depicted in FIG. 4, a plurality of NAND strings 114 is formed on a p-type well area 10. That is, on the well area 10, the following layers are sequentially stacked: for example, four interconnect layers 11 functioning as the select gate lines SGS, 14 interconnect layers 12 functioning as the word lines WL0 to WL13, and for example, four interconnect layers 13 functioning as the select gate lines SGD. Insulating films not depicted in the drawings are each formed between the stacked interconnect layers.

Pillar-like conductors 14 are formed which penetrate the interconnect layers 13, 12, and 11 and reach the well area 10. On a side surface of each conductor 14, a charge storage layer (insulating film or conductive film) 16 and a block insulating film 17 are sequentially formed. These layers form the memory cell transistors MT and the select transistors ST1 and ST2. Each of the conductors 14 functions as a current path for the NAND string 114 and serves as an area where a channel of each transistor is formed. Upper ends of the conductors 14 are coupled to a metal interconnect layer 18 functioning as the bit line BL.

In a surface area of the well area 10, an n+ type impurity diffusion layer 19 is formed. A contact plug 20 is formed on the diffusion layer 19 and coupled to a metal interconnect layer 21. In the surface area of the well area 10, a p+ type impurity diffusion layer 22 is formed. A contact plug 23 is formed on the diffusion layer 22 and coupled to a metal interconnect layer 24 functioning as a well interconnect CPWELL. The well interconnect CPWELL is an interconnect which allows a potential to be applied to the conductor 14 via the well area 10.

A plurality of the above-described configurations is arranged in a second direction D2 parallel to the semiconductor substrate. A set of a plurality of NAND strings 114 arranged in the second direction D2 forms the string unit SU.

The memory cell array 111 may be configured in a different manner. That is, the configuration of the memory cell array 111 is described, for example, in U.S. patent application Ser. No. 12/407,403 entitled "THREE DIMENSIONAL STACKED NONVOLATILE SEMICONDUCTOR MEMORY" filed on Mar. 19, 2009. The configuration of the memory cell array 111 is also described, for example, in U.S. patent application Ser. No. 12/406,524 entitled "THREE DIMENSIONAL STACKED NONVOLATILE SEMICONDUCTOR MEMORY" filed on Mar. 18, 2009, U.S. patent application Ser. No. 12/679,991 entitled "NONVOLATILE SEMICONDUCTOR STORAGE DEVICE AND METHOD OF MANUFACTURING THE SAME" filed on Mar. 25, 2010, and U.S. patent application Ser. No. 12/532,030 entitled "SEMICONDUCTOR MEMORY AND METHOD FOR MANUFACTURING THE SAME" filed on Mar. 23, 2009. These patent applications are incorporated herein in entireties thereof by reference.

1.2 Threshold Distribution for the Memory Cell Transistors

Now, a distribution of threshold voltages for the memory cell transistor MT according to the present embodiment will be described using FIG. 5. In the present embodiment, a case will be described where the memory cell transistor MT can hold eight values. However, data that can be held by the memory cell transistor MT is not limited to eight values. In the present embodiment, the memory cell transistor MT may be able to hold data of two or more values (data of one or more bits).

As depicted in FIG. 5, a threshold voltage for each memory cell transistor MT takes a value included in one of, for example, eight discrete distributions. The eight distributions are hereinafter referred to as an "Er" level, an "A" level, a "B" level, a "C" level, a "D" level, an "E" level, an "F" level, and a "G" level in order of increasing threshold voltage.

The "Er" level corresponds to, for example, a data erase state. Threshold voltages included in the "Er" level are smaller than a voltage VfyA and have positive or negative values.

The "A" to "G" levels correspond to a state where charge has been injected into the charge storage layer to write data to the memory cell transistor MT. The threshold voltages included in each distribution have, for example, positive values. The threshold voltages included in the "A" level are equal to or higher than the voltage VfyA and are lower than a voltage VfyB (VfyB>VfyA). The threshold voltages included in the "B" level are equal to or higher than the voltage VfyB and are lower than a voltage VfyC (VfyC>VfyB). The threshold voltages included in the "C" level are equal to or higher than the voltage VfyC and are lower than a voltage VfyD (VfyD>VfyC). The threshold voltages included in the "D" level are equal to or higher than the voltage VfyD and are lower than a voltage VfyE (VfyE>VfyD). The threshold voltages included in the "E" level are equal to or higher than the voltage VfyE and are lower than a voltage VfyF (VfyF>VfyE). The threshold voltages included in the "F" level are equal to or higher than the voltage VfyF and are lower than a voltage VfyG (VfyG>VfyF). The threshold voltages included in the "G" level are equal to or higher than the voltage VfyG and are lower than voltages VREAD and VPASS (VREAD>VfyG). VREAD and VPASS are voltages applied to the unselected word lines WL during a data read operation and a data write operation, respectively.

As described above, each memory cell transistor MT has one of the eight threshold distributions and can thus take eight states. These states are allocated to "000" to "111" in binary notation to allow each memory cell transistor MT to hold 3 bits of data. The 3 bits of data may be referred to as an upper bit, a middle bit, and a lower bit.

FIG. 5 has been described taking as an example a case where the eight levels are discretely distributed. However, this is an ideal state, for example, immediately after data write. Therefore, in actuality, adjacent levels may overlap. For example, after data write, an upper end of the "Er" level and a lower end of the "A" level may overlap due to disturbance or the like. In such a case, data is corrected using, for example, the ECC technique.

1.3 Write Operation

Now, a data write method in the memory system according to the present embodiment will be described. In the present embodiment, 3 bits of data are written to one memory cell transistor at a time. That is, data in the full sequence unit FSU corresponding to 3 pages is written to one memory cell group MCG. A page included in the full sequence unit and corresponding to the upper bit is hereinafter referred to as an upper page. A page included in the full sequence unit and corresponding to the middle bit is hereinafter referred to as a middle page. A page included in the full sequence unit and corresponding to the lower bit is hereinafter referred to as a lower page.

The number of pages included in one full sequence unit FSU is not particularly limited because the number depends on the number of bits of data that can be held by the corresponding memory cell transistor MT. For example, when the memory cell transistor MT can hold 2 bits of data, the data in the full sequence unit FSU corresponds to 2 pages (an upper page and a lower page). When the memory cell transistor MT can hold 1 bit of data, the data in the full sequence unit FSU corresponds to 1 page of data. When the memory cell transistor MT can hold 4 bit of data, the data in the full sequence unit FSU corresponds to 4 pages of data.

Moreover, the number of pages included in the full sequence unit FSU may vary according to the corresponding word line WL.

1.3.1 Operations of the Controller

Figure 7:
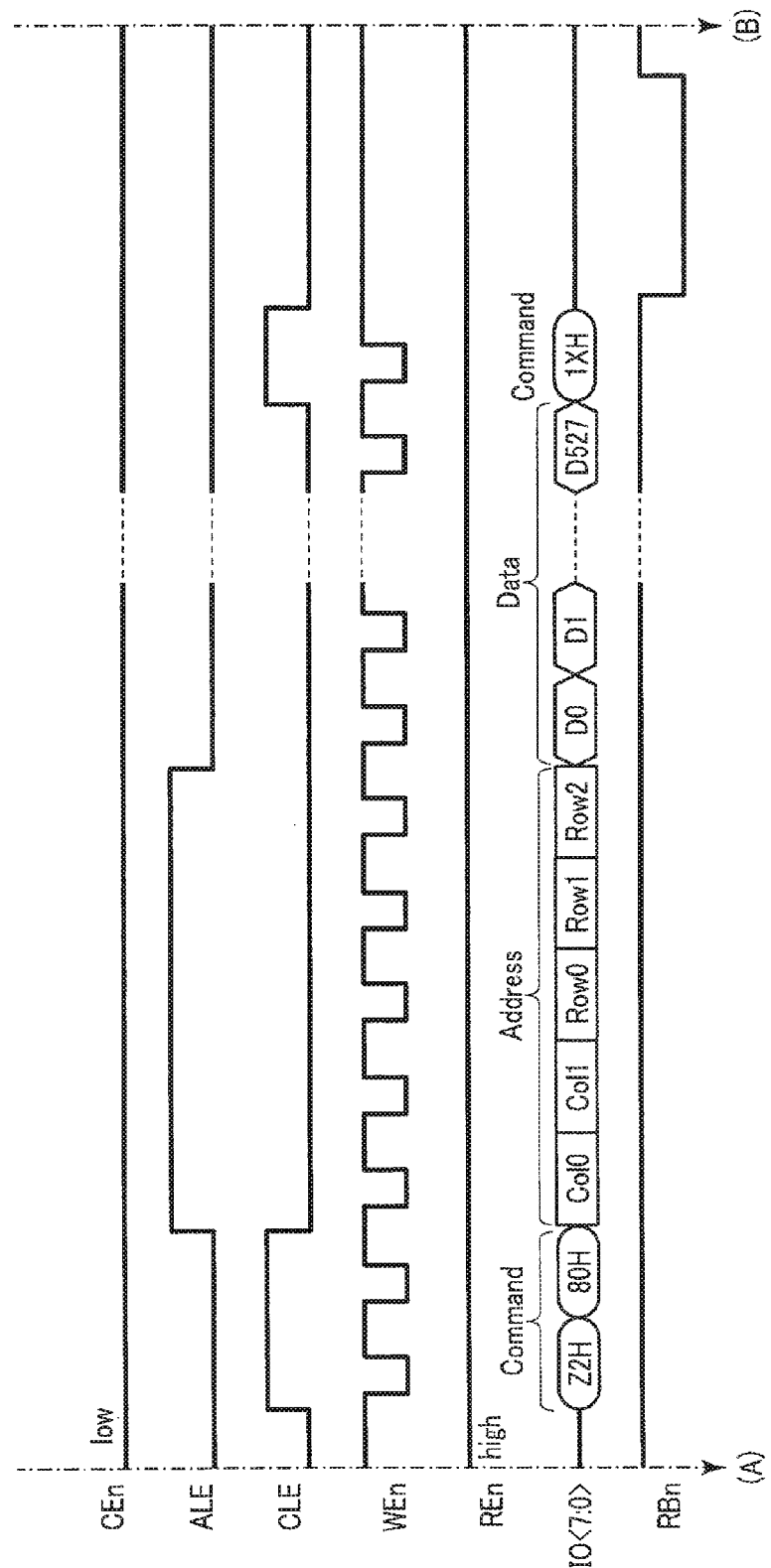

First, operations of the controller 200 will be described using FIGS. 6 to 8. An example in FIGS. 6 to 8 illustrates a case where the controller 200 transmits 3 bits of data to the NAND flash memory 100 and then writes the data in the full sequence.

As depicted in FIG. 6, first, the controller 200 sets the chip enable signal CEn for the write target NAND flash memory 100 to the "L" level.

Then, the controller 200 outputs a prefix command "Z1H" and a command "80H" to the NAND flash memory 100, and asserts the command latch enable signal CLE ("H" level). The prefix command "Z1H" provides notification that the data in the lower page is to be transmitted. The command "80H" provides notification that a write operation is to be performed.

Then, the controller 200 outputs address signals "Col0", "Col1", "Row0", "Row1", and "Row2" and asserts the address latch enable signal ALE ("H" level). For example, "Col0" and "Col1" include column addresses, and "Row0", "Row1", and "Row2" include row addresses. In the example in FIG. 6, the address signals are transmitted in five cycles. However, the present embodiment is not limited to this. Any number of cycles may be used so long as the number is needed to transmit the address signals.

Then, the controller 200 outputs data "D0" to "D527". In the example in FIG. 6, the data is transmitted in 528 cycles. However, the present embodiment is not limited to this.

Then, the controller 200 outputs a command "1XH" and asserts the command latch enable signal CLE. The command "1XH" is a data transfer command indicative of a link between the lower page and the middle page and the upper page of one memory cell group MCG. Upon receiving the command "1XH", the NAND flash memory 100 stores the data "D0" to "D527" in the loaded lower page in a latch circuit corresponding to the lower page. In the meantime, the NAND flash memory 100 sets the ready/busy signal RBn to the "L" level (indicative of the busy state).

Then, as depicted in FIG. 7, the controller 200 transmits the data in the middle page as is the case with the lower page. First, the controller 200 outputs a prefix command "Z2H" to the NAND flash memory 100 and asserts the command latch enable signal CLE ("H" level). The prefix command "Z2H" provides notification that the data in the middle page is to be transmitted. After the output of the prefix command "Z2H", the same operation as that for the lower page is performed. The controller 200 outputs the command "80H", the address signals, and the data in the middle page in order and then outputs the command "1XH". Upon receiving the command "1XH", the NAND flash memory 100 stores the data in the loaded middle page in a latch circuit corresponding to the middle page. In the meantime, the NAND flash memory 100 sets the ready/busy signal RBn to the "L" level.

As depicted in FIG. 8, the controller 200 then transmits the data in the upper page. First, the controller 200 outputs a prefix command "Z3H" to the NAND flash memory 100 and asserts the command latch enable signal CLE ("H" level). The prefix command "Z3H" provides notification that the data in the upper page is to be transmitted. Then, the controller 200 outputs the command "80H", the address signals, and the data in the upper page in order and then outputs a command "10H". The command "10H" indicates execution of write. Upon receiving the command "10H", the NAND flash memory 100 stores the data in the loaded upper page in a latch circuit corresponding to the upper page, and then, writes the data in the lower page, the middle page, and the upper page at a time.

The order in which the controller 200 outputs the data to the NAND flash memory 100 can be optionally set. For example, the controller 200 may output the data in the pages in an order of the upper page, the middle page, and the lower page.

The row address may include a block address and a page address. Moreover, the page address may include, for example, information on the word lines WL, the odd- and even-numbered bit lines (E/O), the string unit addresses, or the lower page/middle page/upper page (L/M/U).

A configuration of the page address is described in, for example, U.S. patent application Ser. No. 13/784,753 entitled "NONVOLATILE SEMICONDUCTOR MEMORY DEVICE AND CONTROL METHOD THEREOF" filed on Mar. 4, 2013. The patent application is incorporated herein in the entirety thereof by reference.

1.3.2 Writing Order in the Block BLK

Figure 9:
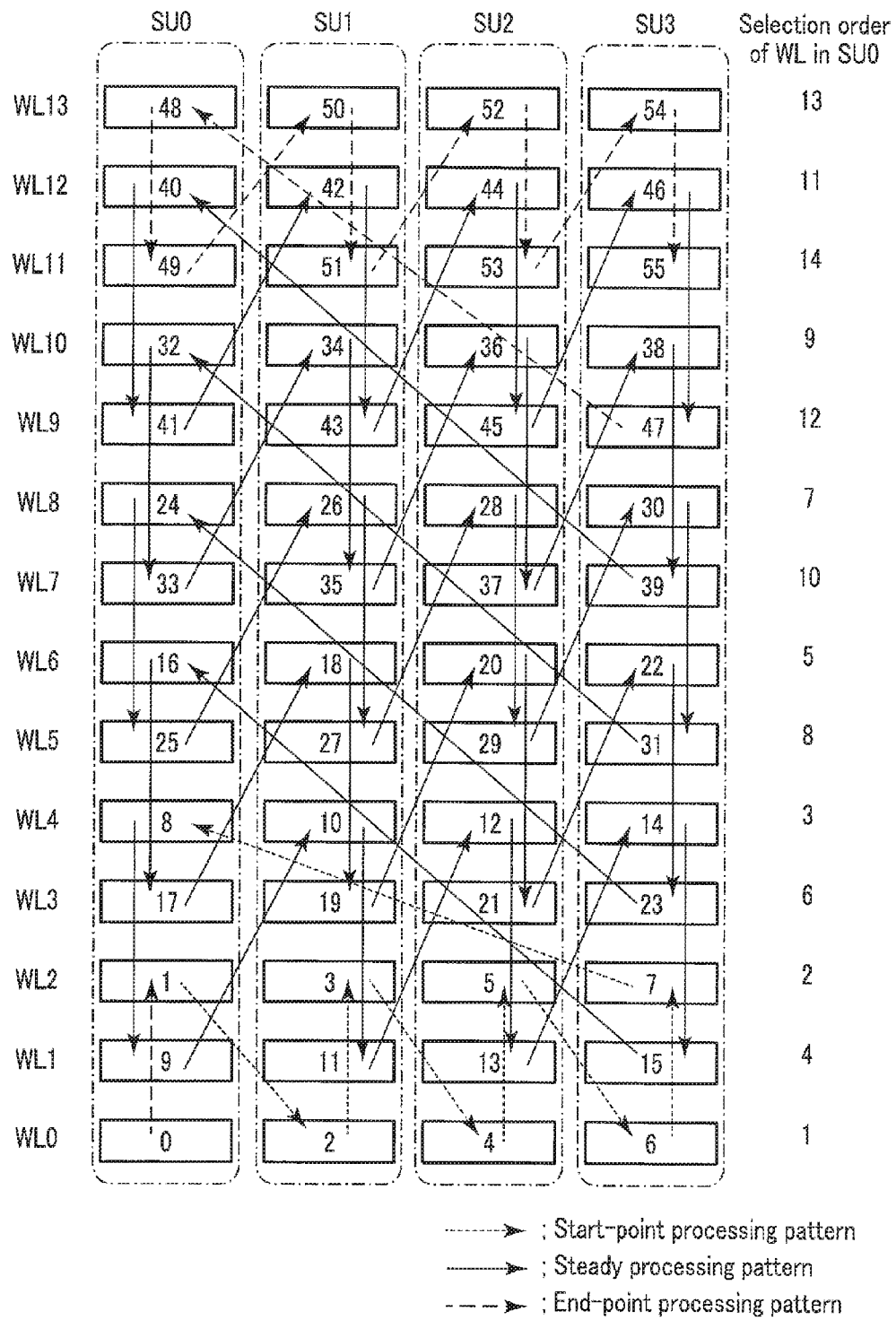
FIG. 9 is a diagram illustrating the writing order in. the semiconductor memory device according to the first embodiment.

Now, the writing order in the block BLK will be described using FIG. 9. FIG. 9 schematically depicts a cross-sectional configuration of the string units SU in a certain block BLK. Each rectangle in each of the string units SU represents one full sequence unit FSU corresponding to one word line WL. That is, one rectangle corresponds to one write operation in the full sequence. Numbers in the rectangles in FIG. 9 are indicative of an order in which the data in the full sequence units FSU are written, that is, an order in which one of the memory cell groups MCG is selected. In the example in FIG. 9, 14 word lines WL and four string units SU are provided, and a total of 56 memory cell groups MCG are present. That is, the writing order involves the zeroth to the 55th.

For example, a case where the select gate line SGD0 is selected to allow the target string unit SU0 to be selected and where the word line WL0 is selected is hereinafter described as "the word line WL0 in the string unit SU0 is selected". The total number of the word lines WL is denoted as N (N is a natural number of 1 or more). The word lines WL may be referred to as the word lines WL0 to WL(N−1) in order from the lowermost layer. In order to allow the writing order in the present embodiment to be applied, the total number N of the word lines WL is five or more.

In the present embodiment, the writing order involves selection of two or more different word lines WL instead of consecutive selection of the same word line WL and writing of the data in the full sequence unit FSU. The writing order involves three write patterns referred to as a start-point processing pattern, a steady processing pattern, and an end-point processing pattern.

Each write pattern will be specifically described below.

(a) Start-Point Processing Pattern

First, the start-point processing pattern will be described. The start-point processing pattern is a write pattern including selection of the lowermost word line WL0. In the example in FIG. 9, the zeroth to seventh writes correspond to the start-point processing pattern. In the start-point processing pattern, first, in association with the zeroth write, the word line WL0 in the string unit SU0 is selected, and the data in the full sequence unit FSU is written. Then, in association with the first write, the word line WL2 in the string unit SU0 is selected, and the data in the full sequence unit FSU is written. Similarly, in association with the second to seventh writes, the word line WL0 and the word line WL2, which is the second word line WL above the word line WL0, are alternately selected in the string units SU1 to SU3, and in each case, the data in the full sequence unit FSU is written through the selected word lines WL.

(b) Steady Processing Pattern

Now, the steady processing pattern will be described. The steady processing pattern is a main write pattern repeated according to the total number of the word lines WL from the end of the start-point processing pattern until the uppermost word line WL(N−1) (in the present embodiment, WL13) or the word line WL(N−2), which is the first word line WL below the uppermost layer (in the present embodiment, WL12), is selected, with the data in the full sequence unit FSU written through the selected word line WL. In the example in FIG. 9, the eighth to 47th writes correspond to the steady processing pattern. In the steady processing pattern, in each string unit SU, a certain word line WL and the third word line WL below the certain word line WL are alternately selected.

First, in association with the eighth and ninth writes, the word line WL4 and the word line WL1, which is the third word line WL below the word line WL4, are sequentially selected in the string unit SU0. Similarly, in association with the 10th and 11th writes, the word line WL4 and the word line WL1 are sequentially selected in the string unit SU1. Moreover, in association with the 12th to 15th writes, the word line WL4 and the word line WL1 are sequentially selected in the string units SU2 and SU3.

Then, in association with the 16th and 17th writes, the word line WL6 and the word line WL3, which is the third word line WL below the word line WL6, are sequentially selected in the string unit SU0. Similarly, in the string units SU1 to SU3, the word line WL6 and the word line WL3 are sequentially selected in association with the 18th to 23rd writes.

Similar patterns are repeated to execute the 24th to 47th writes. More specifically, in association with the 24th to 31st writes, the word line WL8 and the word line WL5 are sequentially selected in the string units SU0 to SU3. Similarly, in association with the 32nd to 39th writes, the word line WL10 and the word line WL7 are sequentially selected in the string units SU0 to SU3. Similarly, in association with the 40th to 47th writes, the word line WL12 and the word line WL9 are sequentially selected in the string units SU0 to SU3.

(c) End-Point Processing Pattern

Now, the end-point processing pattern will be described. The end-point processing pattern is a write pattern executed when the word line WL(N−2), which is the first word line WL below the uppermost layer, is selected in accordance with the steady processing pattern. When N is an odd number of 5 or more, the uppermost word line WL(N−1) is selected in accordance with the steady processing pattern. In such a case, the end-point processing pattern is not applied, and no data is written to the memory cell group MCG corresponding to the word line WL(N−2), which is the first word line WL below the uppermost layer (the memory cell group MCG is treated as a dummy). When N is an even number of 5 or more, the word line WL(N−2) is selected in accordance with the steady processing pattern. In such a case, the end-point processing pattern is applied, and the uppermost word line WL(N−1) and the word line WL(N−3), which is the second word line WL below the word line WL(N−1), are sequentially selected in each string unit SU.

In the example in FIG. 9, the 48th to 55th writes correspond to the end-point processing pattern. In the end-point processing pattern, the uppermost word line WL13 and the word line WL11, which is the second word line WL below the word line WL13, are sequentially selected in the string units SU0 to SU3.

More specifically, in association with the 48th and 49th writes, the uppermost word line WL13 and the word line WL11, which is the second word line WL below the word line WL13, in the string unit SU0 are sequentially selected. In association with the 50th and 51st writes, the uppermost word line WL13 and the word line WL11, which is the second word line WL below the word line WL13, in the string unit SU1 are sequentially selected. Moreover, in association with the 52nd to 55th writes, the word line WL13 and the word line WL11 are sequentially selected in the string units SU2 and SU3. As a result, selection is completed for all the memory cell groups MCG.

Through the above-described three write patterns, the order of selection of the word lines WL in the string unit SU0 is focused on. The word lines WL are selected in an order of the word lines WL0, WL2, WL4, WL1, WL6, WL3, WL8, WL5, WL10, WL7, WL12, WL9, WL13, and WL11. When a word line WL located above the selected word line WL is selected, the second word line WL above from the selected word line WL is selected. More specifically, when, with the word line WL0 selected, a word line WL located above the word line WL0 is selected, the word line WL2, which is the second word line WL above the word line WL0, is selected. Similarly, when a word line WL located above the selected word line WL2 is selected, the word line WL4, which is the second word line WL above the word line WL2, is selected. That is, when only the cases where a word line WL located above the selected word line WL is selected are considered, the word line WL are selected in an order of WL2, WL4, WL6, WL8, WL10, and WL12.

1.3.3 Operations of the NAND Flash Memory

Now, operations of the NAND flash memory 100 will be described using FIG. 10. In the present embodiment, a case will be described where the NAND flash memory 100 writes data in the writing order described for FIG. 9.

A write operation generally includes a program operation and a verify operation. The program operation refers to an operation of injecting electrons into the charge storage layer to increase the threshold voltage (or inhibiting the injection to maintain the threshold voltage). An operation of raising the threshold voltage is hereinafter referred to as a ""0" program", and the target bit line for the "0" program is represented as BL("0"). On the other hand, an operation of maintaining the threshold voltage is hereinafter referred to as a ""1" program", and the target bit line for the "1" program is represented as BL("1"). The verify operation is an operation performed after the program operation to read data to determine whether or not the threshold voltage of the memory cell transistor MT has not reached a target level. For the memory cell transistors MT having reached the target level, subsequent write is inhibited.

As depicted in FIG. 10, first, upon receiving a write instruction from the controller 200 (step S10), the sequencer 121 selects the block BLK, the string unit SU, and the word line WL for write in accordance with the writing order described for FIG. 9 (step S11). More specifically, the sequencer 121 internally holds a table for the writing order, information on the block BLK, the string unit SU, and the word line WL through which the last write has been executed, or information on the order of the last write. Based on these pieces of information, the sequencer 121 selects the block BLK, the string unit SU, and the word line WL for the next write.

Then, the sequencer 121 saves the received data to the latch circuit in the sense amplifier unit (step S12).

The sequencer 121 then performs the program operation in the full sequence (step S13).

The sequencer 121 then performs the verify operation. When the verification is passed at all verify levels (step S14_Yes), the write operation is ended.

When the verification is not passed at all verify levels (step S14_No), the sequencer 121 checks whether or not the number of program operations performed has reached a preset value (step S15).

When the number of program operations performed has reached the preset value (step S15_No), the sequencer 121 returns to step S13 to perform the program operation in the full sequence again.

When the number of program operations performed has reached the preset value (step S15_Yes), the sequencer 121 no longer performs the program operation. This case is treated, for example, as program error.

1.3.4 Voltages of Interconnects during the Program Operation

Now, the voltages of interconnects during the program operation will be described using FIG. 11.

FIG. 11 illustrates variations in the potentials of the interconnects during the program operation. As depicted in FIG. 11, first, the sense amplifier 113 transfers program data to the bit lines BL. A ground potential VSS (for example, 0 V) is applied to the bit lines BL("0") targeted for the "0" program, as the "L" level. For example, 2.5 V is applied to the bit lines BL("1") targeted for the "1" program as the "H" level.

The row decoder 112 selects one of the blocks BLK and further selects one of the string units SU. For example, 5 V is applied to the select gate line SGD in the selected string unit SU to set the select transistor ST1 to an on state. On the other hand, the voltage VSS is applied to the select gate line SGS to set the select transistor ST2 to an off state.

The row decoder 112 further applies the voltage VSS to the to the select gate lines SGD and SDS in the unselected string units SU in the selected block BLK and in the unselected string units SU in the unselected block BLK to set the select transistors ST1 and ST2 to the off state.

The source line SL is applied with, for example, 1 V (a potential higher than the potential of the select gate line SGS).

Subsequently, the row decoder 112 sets the potential of the select gate line SGD in the selected string unit SU in the selected block BLK to, for example, 2.5 V. This potential sets the select transistor ST1 corresponding to the bit line BL("0") to the on state, while cutting off the select transistor ST1 corresponding to the bit line BL("1").

The row decoder 112 selects one of the word lines WL and applies the voltage VPGM to the selected word line, while applying the voltage VPASS to the other unselected word lines WL in the selected block BLK. The voltage VPGM is a high voltage that allows electrons to be injected into the charge storage layer based on a tunnel phenomenon. A relation between the voltage VPGM and the voltage VPASS is VPGM>VPASS.

In the NAND string 114 corresponding to the bit line BL("0"), the select transistor ST1 is set to the on state. Thus, a channel voltage Vch of the memory cell transistor MT coupled to the selected word line WL is approximately 0 V. That is, the difference in potential between the control gate and the channel is increased to allow electrons to be injected into the charge storage layer to increase the threshold voltage for the memory cell transistor MT.

In the NAND string corresponding to the bit line BL("1"), the select transistor ST1 is set to a cutoff state. Thus, the channel of the memory cell transistor MT coupled to the selected word line WL is made electrically floating, and capacitive coupling with the word line WL and the like increases the channel potential Vch nearly to the voltage VPASS. That is, the difference in potential between the control gate and the channel decreases to prevent charge from being injected into the charge storage layer, maintaining the threshold voltage for the memory cell transistor MT (the threshold does not vary sufficiently to cause the threshold distribution level to transition to a higher distribution level).

1.4 Effects Related to the Present Embodiment

The configuration according to the present embodiment allows enhancement of reliability of the memory system and the semiconductor memory device. This effect will be described below.

As described in FIG. 3, in the three-dimensional stacked NAND flash memory, a plurality of string units SU shares the word lines WL. The plurality of word lines WL is stacked over the semiconductor substrate via the insulating layer. For example, in the write operation, when the high voltage VPGM is applied to the selected word line WL, short-circuiting occurs between the adjacent word lines to cause a leakage current (this is simply referred to as WL leakage). In this case, data corresponding to the two word lines WL between which short-circuiting has occurred may be corrupted (lost).

Figure 12:
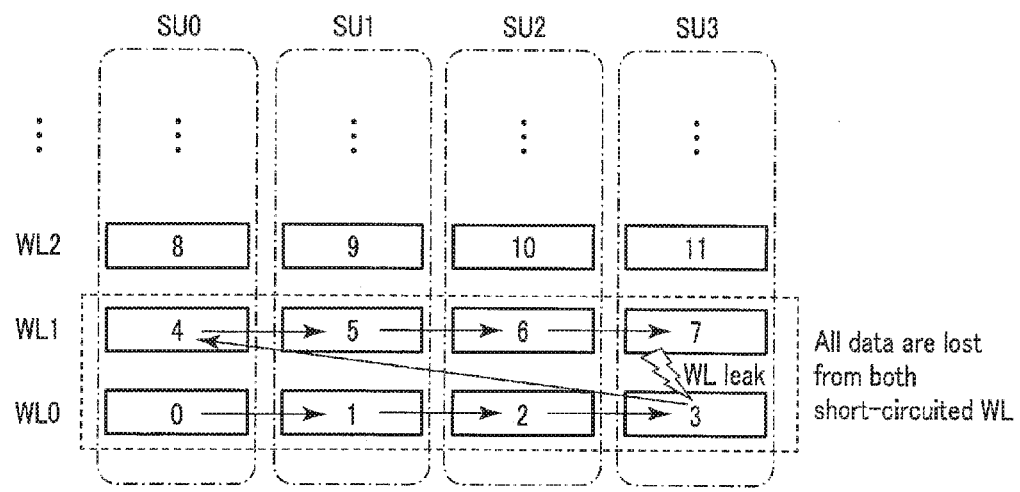
FIG. 12 is a diagram illustrating an example of the writing order and data loss resulting from WL leakage.

FIG. 12 schematically illustrates this. An example in FIG. 12 illustrates a case, in the write operation, the same word line WL is consecutively selected in four string units SU. More specifically, in association with the zeroth to third writes, the word line WL0 is sequentially selected in the string units SU0 to SU3, and in each of the string units, the data in the full sequence unit FSU is written.

Then, the word line WL1 is sequentially selected in the string units SU0 to SU3 in association with the fourth to seventh writes, and in each of the string units, the data in the full sequence unit FSU is written. A similar process is repeated for the word line WL2 and subsequent word lines WL.

As depicted in FIG. 12, WL leakage is assumed to occur between the word lines WL0 and WL1 after the word line WL0 in the string unit SU0 is selected in association with the zeroth write and before the word line WL1 in the string unit SU3 is selected in association with the seventh write. Then, the data in up to eight consecutive full sequence units FSU written to memory cell groups MCG corresponding to the word lines WL0 and WL1 are all lost. For example, when the memory cell transistor MT corresponds to 3 bits of data, the full sequence unit FSU contains data in 3 pages including the upper page, the middle page, and the lower page. Thus, 24 consecutive pages of data in the eight full sequence units FSU are lost.

More specifically, in a read operation, a read voltage VCGRV is applied to the selected word line WL, and a voltage VREAD is applied to the unselected word lines WL. The voltage VCGRV is a voltage corresponding to a read level (the threshold voltage level of the target memory cell transistor MT). The voltage VREAD is a voltage which sets the memory cell transistor to the on state regardless of the threshold voltage level of the memory cell transistor MT. The voltage VCGRV and the voltage VREAD are in a relation in which VCGRV<VREAD. When WL leakage occurs, the voltage VREAD is also applied to the selected word line WL. Thus, the memory cell transistor MT is set to the on state regardless of data and fails to read the data correctly. As a result, when four string units SU share the word lines WL, the WL leakage precludes the data in up to eight full sequence units FSU from being read correctly.

Therefore, the controller 200 needs to hold data corresponding to the eight full sequence units FSU for backup to provide for possible WL leakage.

In contrast, when, in the write operation, a memory cell group MCG (memory cell transistors MT) to which the data in the full sequence units FSU is written is selected, the configuration according to the present embodiment selects memory cell groups MCG corresponding to word lines WL located more than the second word line WL above or below each other instead of consecutively selecting the memory cell groups MCG in different string units SU corresponding to the same word line WL. More specifically, for example, as depicted in FIG. 9, the word lines WL0 and WL2, each of which is the second word line WL above or below the other, are selected. Alternatively, the word lines WL4 and WL1, each of which is the third word line WL above or below the other, are selected.

Figure 13:
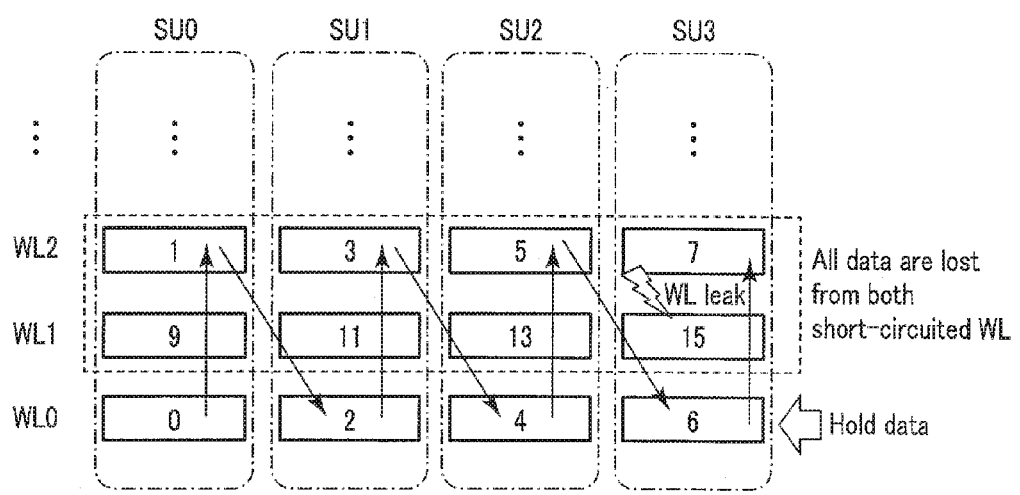
FIG. 13 is a diagram illustrating an example of the writing order and data loss resulting from WL leakage in the semiconductor memory device according to the first embodiment.

FIG. 13 is a diagram depicting an example of the writing order in the present embodiment and data loss resulting from WL leakage. An example in FIG. 13 is an excerpt from FIG. 9 which relates to the word lines WL0 to WL2. For example, in FIG. 13, WL leakage is assumed to occur between the word lines WL1 and WL2 during the seventh write. Then, the data in the memory cell groups MCG corresponding to the word lines WL1 and WL2 are prevented from being read, causing loss of the first, third, fifth, and seventh written data from the full sequence units FSU. However, no data is written to the memory cell group MCG corresponding to the word line WL1, and thus, the lost data corresponds to the data in up to four full sequence units FSU. Consequently, the lost data can be reduced. Therefore, reliability of the memory system and the semiconductor memory device can be enhanced.

Moreover, even when WL leakage occurs between the word lines WL1 and WL2, the adverse effect of the WL leakage is prevented from spreading to the word line WL0. This allows the zeroth, second, fourth, and sixth written data from the full sequence units FSU to be maintained without any change. Therefore, data in two consecutive full sequence units FSU can be restrained from being lost. For example, when the write data are such data as indicate values which are consecutive between the full sequence units FSU or when the same data is written to the two full sequence units FSU, the data in the two consecutive full sequence units FSU are prevented from being lost. Consequently, data prevented from being read may be restored using data remaining before or after the lost data. Therefore, reliability of the memory system and the semiconductor memory device can be enhanced.

Moreover, for example, when the write data are management information data such as a log file indicative of the state of an unfinished task in host device, the amount of data is often equal to 1 page or less. For the management information data, the data in the latest page is important. If a certain defect occurs in the latest data, the data in the preceding page is important. For such data, in the configuration according to the present embodiment, 1 bit of data is written to the memory cell transistor MT. That is, 1 page of data is written to one memory cell group MCG. Consequently, even if WL leakage occurs when the data in the latest page is written, since the data in the preceding page is maintained without being affected by the WL leakage, a possible adverse effect on the host device is reduced. Therefore, reliability of the memory system and the semiconductor memory device can be enhanced.

Figure 14:
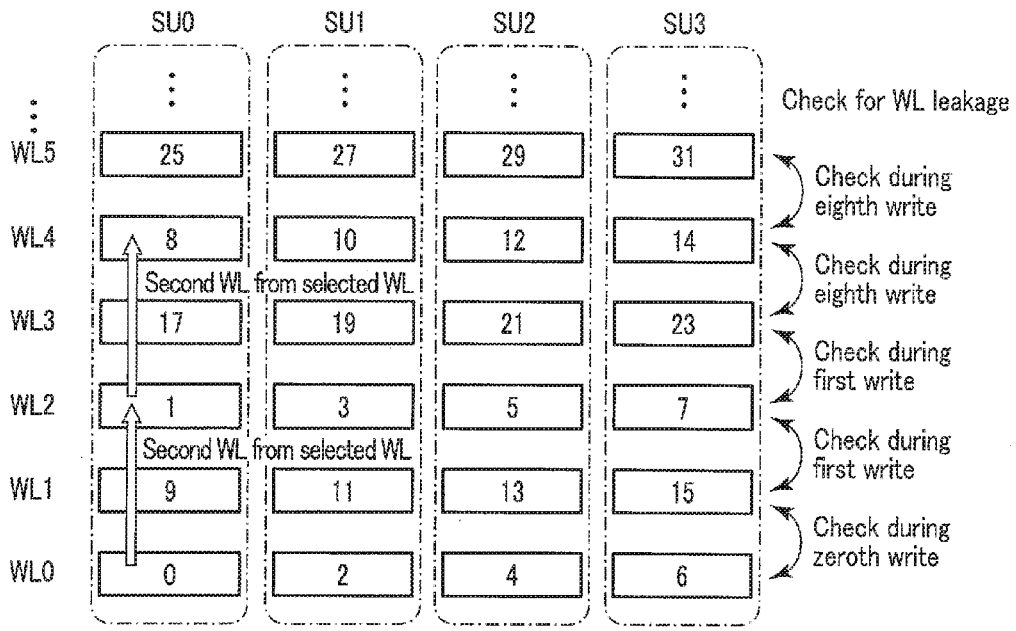
FIG. 14 is a diagram illustrating an example of the writing order and a status of check. for WL leakage in the semiconductor memory device according to the first embodiment.

Moreover, in the configuration according to the present embodiment, when, in the write operation, a word line WL located above the selected word line WL is selected, the second word line WL above the selected word line is selected. This enables a reduction in the adverse effect of WL leakage. This effect will be described using FIG. 14. FIG. 14 is a diagram illustrating a relation between the writing order and a status of check for WL leakage. An example in FIG. 14 is an excerpt from FIG. 9 which relates to the word lines WL0 to WL5.

WL leakage is likely to occur when the high voltage VPGM is first applied to the word line WL, that is, when write is performed on the string unit SU0. Therefore, as depicted in FIG. 14, when, for example, the word line WL0 in the string unit SU0 is selected and the zeroth write ends normally, WL leakage is unlikely to occur between the word lines WL0 and WL1. Similarly, when the word line WL2 in the string unit SU0, which is the second word line WL above the word line WL0, is selected and the first write ends normally, WL leakage is unlikely to occur among the word lines WL1 to WL3. Therefore, WL leakage is unlikely to occur among the word lines WL0 to WL3 based on the results of the zeroth write and the first write. The word line WL1 has not been selected yet, but the results for the zeroth page and the first page indicate that WL leakage is unlikely to occur.

Then, when the word line WL4 in the string unit SU0 is selected and the eighth write ends normally, WL leakage is unlikely to occur among the word lines WL3 to WL5. Therefore, WL leakage is unlikely to occur among the word lines WL0 to WL5. Therefore, when a word line WL located above the selected word line WL is selected, the possibility of WL leakage between the word lines WL can be seamlessly checked by selecting the second word line WL above the selected word line WL.

2. Second Embodiment

Now, a semiconductor memory device and a memory system according to a second embodiment will be described. The second embodiment is different from the first embodiment in that the controller 200 designates the string unit SU and the word line WL in the NAND flash memory 100. Only differences from the first embodiment will be described.

2.1 Operations of the Controller

Figure 15:
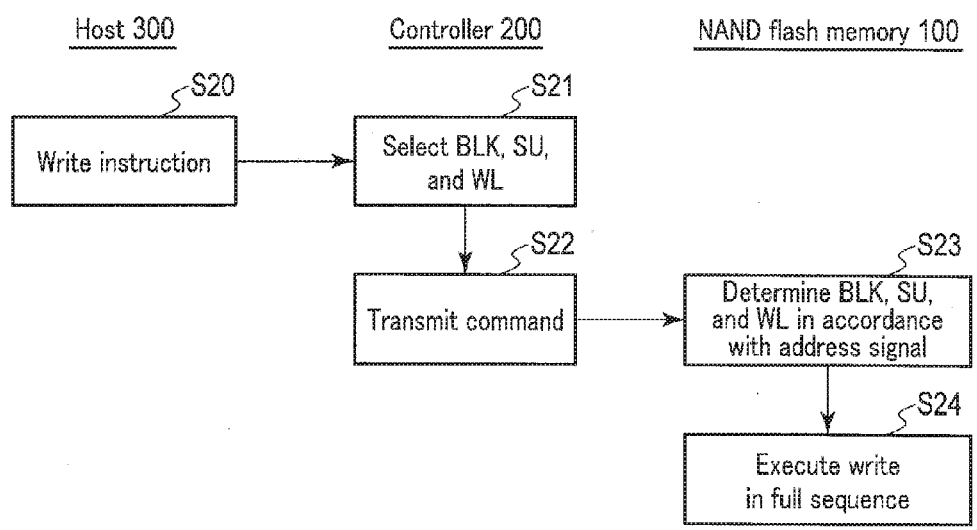
FIG. 15 is a flowchart illustrating operations of a controller and a semiconductor memory device in a memory system according to a second embodiment.

Operations of the controller 200 will be described using FIG. 15. FIG. 15 is a flowchart illustrating operations of the host device 300, the controller 200, and the NAND flash memory 100.

As depicted in FIG. 15, first, the host device 300 transmits a write instruction to the controller 200 (step S20).

Upon receiving the write instruction, the controller 200 selects the block BLK, the string unit SU, and the word line WL through which data is written in accordance with the writing order described in FIG. 9 (step S21). More specifically, for example, the CPU 203 in the controller 200 selects the block BLK, the string unit SU, and the word line WL through which the next write is executed based on a table for the writing order held in the RAM 242 and a block address, a string unit address, and a word line address used for the last write and held in the buffer memory 204, or information on the order of the last write.

Then, the controller 200 transmits a write command, an address signal including a selected block address, a selected string unit address, and a selected word line address, and write data to the NAND flash memory 100.

The NAND flash memory 100 determines the block BLK, the string unit SU, and the word line WL for write in accordance with the address data received from the controller 200 (step S23).

Then, the NAND flash memory 100 executes the program in the full sequence (step S24).

2.2 Effects Related to the Present Embodiment

The configuration according to the present embodiment produces effects similar to the effects of the first embodiment.

Moreover, in the configuration according to the present embodiment, the controller 200 controls the writing order in a plurality of the NAND flash memories 100. This, for example, eliminates the need for each NAND flash memory 100 to hold the table for the writing order, enabling an increase in an effective area in which data can be held.

Furthermore, each NAND flash memory 100 may write data in accordance with the address data transmitted from the controller 200. This eliminates the need to select the string unit SU and the word line WL (that is, to select the memory cell group) with the writing order taken into account, preventing a possible delay involved in the selection. Therefore, the memory system and the semiconductor memory device are allowed to have improved processing capabilities.

3. Third Embodiment

Now, a semiconductor memory device and a memory system according to a third embodiment will be described. The third embodiment is different from the first and second embodiments in the writing order. Only differences from the first and second embodiments will be described.

3.1 Writing Order in the Block BLK

Figure 16:
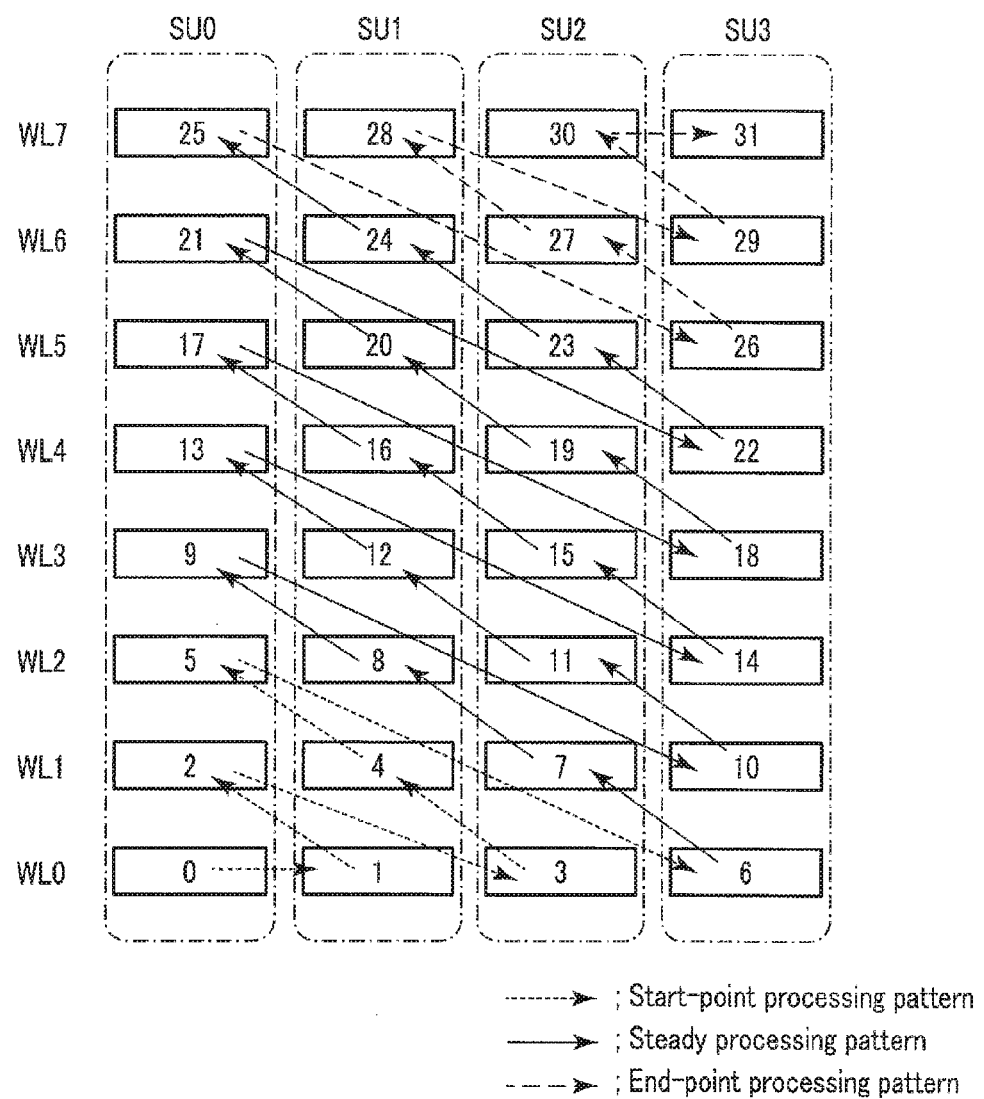
FIG. 16 is a diagram illustrating the writing order in a semiconductor memory device according to a third embodiment.

The writing order in the write operation will be described using FIG. 16. An example in FIG. 16 illustrates a case where the total number N of the word lines WL is eight and where 32 memory cell groups MCG are present.

In the present embodiment, when the writing order is selected, the string units SU are selected in an order of SU3, SU2, SU1, and SU0. At this time, a basic pattern is such that the first word line WL above the last selected word line WL is selected. That is, in the example in FIG. 16, an obliquely upper left full sequence unit FSU in the sheet of the drawings is selected. Three write patterns will be specifically described below.

(a) Start-Point Processing Pattern

The start-point processing pattern in the present embodiment involves selection of the lowermost word line WL0 and corresponds to the zeroth to fifth writes.

As depicted in FIG. 16, first, in association with the zeroth write, the word line WL0 in the string unit SU0 is selected. In the present embodiment, the string unit SU0 is a terminal column when the first word line WL above the selected word line WL is selected. After the word line WL in the string unit SU0 is selected, one of the string units SU in the memory cell groups MCG with no data written thereof is selected which corresponds to the lowermost word line WL and which has a small number. Therefore, in association with the first write, the same word line WL0 in the string unit SU1 is selected.

Then, in association with the second write, the word line WL1 in the string unit SU0, which is smaller in number by one than the string unit SU1, is selected.

Then, in association with the third write, the word line WL0 in the string unit SU2 is selected. In association with the fourth and fifth writes, the word line WL1 in the string unit SU1 and the word line WL2 in the string unit SU0 are sequentially selected.

(b) Steady Processing Pattern

The steady processing pattern is a main write pattern repeated according to the total number N of the word lines WL from the end of the start-point processing pattern until the uppermost word line WL(N−1) in the string unit SU0 (in the example in FIG. 16, the word line WL7 corresponding to the 25th write) is selected.

In association with the sixth write, the word line WL0 in the string unit SU3 is selected. In association with the seventh to ninth writes, the word line WL1 in the string unit SU2, the word line WL2 in the string unit SU1, and the word line WL3 in the string unit SU0 are sequentially selected.

The same pattern is subsequently repeated after the word line WL1 in the string unit SU3 is selected in association with the 10th write and before the uppermost word line WL7 in the string unit SU0 is selected in association with the 25th write.

(c) End-Point Processing Pattern

In the end-point processing pattern in the present embodiment, first, the word line WL5 in the string unit SU3, which is the second word line WL below the uppermost word line WL, is selected in association with the 26th write. In association with the 27th and 28th writes, the word line WL6 in the string unit SU2 and the word line WL7 in the string unit SU1 are sequentially selected.

Then, in association with the 29th write, the word line WL6 in the string unit SU3 is selected. In association with the 30th and 31st writes, the word line WL6 in the string unit SU2 and the word line WL7 in the string unit SU1 are sequentially selected.

When the above-described three write patterns are applied, if a certain word line WL in the string unit SU0 is selected, then for the first word line WL below the certain word line WL, the data in the full sequence units FSU have been written to the memory cell groups MCG in the string units SU0 and SU1.

3.2 Effects Related to the Present Embodiment

The writing order in the present embodiment can be applied to the first and second embodiments.

Moreover, in the configuration according to the present embodiment, if, in the write operation, a certain word line WL in the string unit SU0 is selected, then for the first word line WL below the certain word line WL, the data in the full sequence units FSU have been written to the string units SU0 and SU1. This allows the maximum number of full sequence units FSU from which data is lost to be limited to three. This will be specifically described below.

WL leakage is likely to occur when the word line WL in the string unit SU0 is selected and data is written through the selected word line WL. For example, WL leakage is assumed to occur between the word lines WL2 and WL3 during the ninth write when the word line WL3 in the string unit SU0 is selected. In this case, data is precluded from being read from the full sequence units FSU corresponding to the word lines WL2 and WL3. However, the written data are the data in two full sequence units FSU corresponding to the fifth and eighth writes during which the word line WL2 is selected in the string units SU0 and SU1. Therefore, data may be lost from up to three full sequence units FSU even including a full sequence unit FSU corresponding to the ninth write during which data is being written. Therefore, the amount of data lost as a result of WL leakage can be reduced, allowing enhancement of reliability of the memory system and the semiconductor memory device.

4. Fourth Embodiment

Now, a semiconductor memory device and a memory system according to a fourth embodiment will be described. The fourth embodiment is different from the first to third embodiments in the writing order. Only differences from the first to third embodiments will be described.

4.1 Writing Order in the Block BLK

The writing order in the write operation will be described using FIG. 17. An example in FIG. 17 illustrates a case where the total number N of the word lines WL is eight and where 32 memory cell groups MCG are present.

In the present embodiment, if the writing order is selected, a basic pattern is such that the first word line WL above the selected word line WL is selected only in the string unit SU0, whereas the same first word line WL below the selected word line WL is selected in the string units SU1 to SU3. Three write patterns will be specifically described below.

(a) Start-Point Processing Pattern

Figure 17:
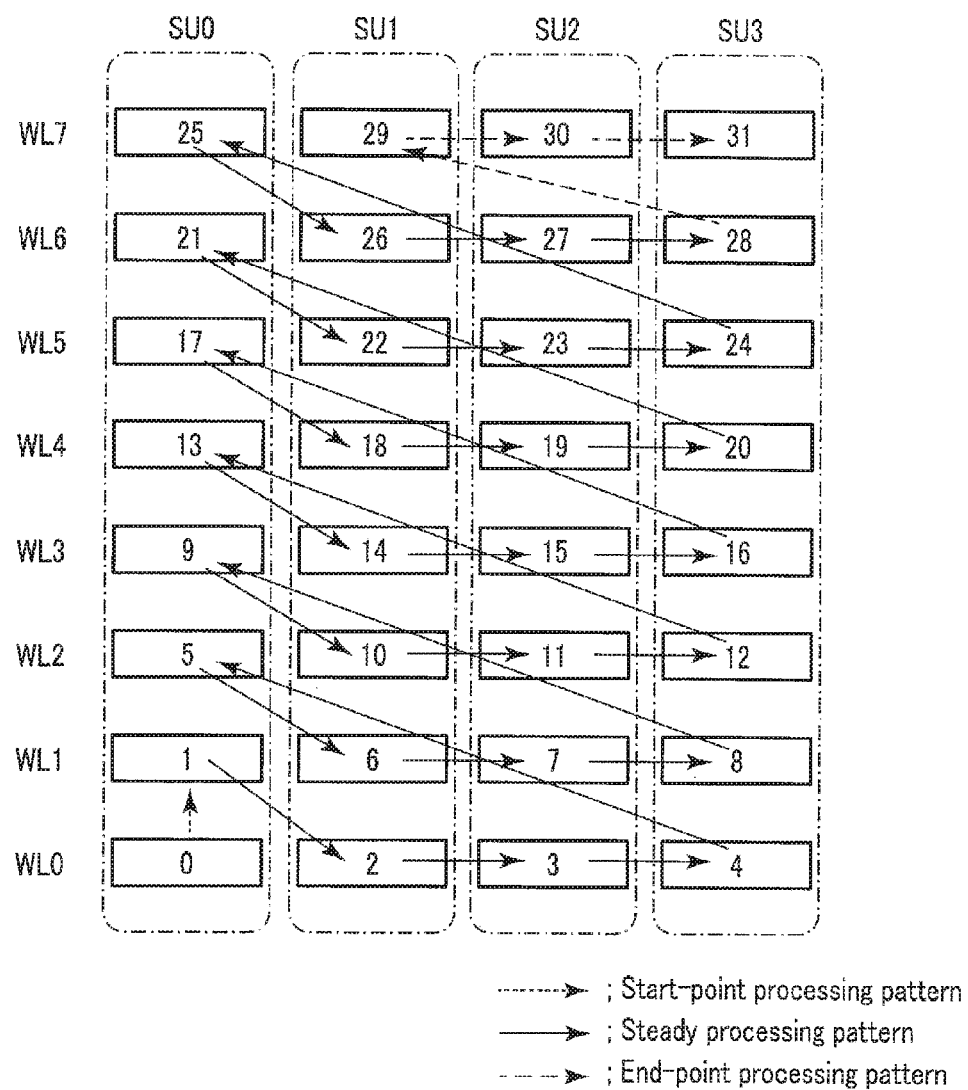
FIG. 17 is a diagram illustrating the writing order in a semiconductor memory device according to a fourth embodiment.

As depicted in FIG. 17, in the start-point processing pattern in the present embodiment, the lowermost word line WL0 in the string unit SU0 is selected in association with the zeroth write. The zeroth write is exceptionally treated because the string units SU1 to SU3 have no word line WL below the selected word line WL0.

(b) Steady Processing Pattern

The steady processing pattern is a main write pattern repeated according to the total number N of the word lines WL until the word line WL(N−2), which is the first word line WL below the uppermost word line in the string unit SU3 (in the example in FIG. 17, the word line WL6 corresponding to the 28th write) is selected.

In association with the first write, the word line WL1 in the string unit SU0 is selected. In association with the second to fourth writes, the word line WL0 is sequentially selected in the string units SU1 to SU3.

A similar pattern is subsequently repeated to execute the fifth to 28th writes.

(c) End-Point Processing Pattern

In the end-point processing pattern, in association with the 29th to 31st writes, the uppermost word line WL7 is sequentially selected in the string units SU1 to SU3.

Consequently, if a certain word line WL in the string unit SU0 is selected, then for the first word line WL below the certain word line WL, the data in the full sequence unit FSU has been written to the memory cell group MCG in the string unit SU0.

4.2 Effects Related to the Present Embodiment

The writing order in the present embodiment can be applied to the first and second embodiments.

Moreover, in the configuration according to the present embodiment, if, in the write operation, a certain word line WL in the string unit SU0 is selected, then for the first word line WL below the certain word line WL, the data in the full sequence units FSU have been written to the memory cell group MCG in the string unit SU0. This allows the maximum number of full sequence units FSU from which data is lost to be limited to two. This will be specifically described below.

For example, WL leakage is assumed to occur between the word lines WL2 and WL3 during the ninth write when the word line WL3 in the string unit SU0 is selected. In this case, data is precluded from being read from the full sequence units FSU corresponding to the word lines WL2 and WL3. However, the written data are the data in one full sequence unit FSU corresponding to the fifth write during which the word line WL2 in the string unit SU0 is selected. Therefore, data may be lost from up to two full sequence units FSU even including a full sequence unit FSU corresponding to the ninth write during which data is being written. Therefore, the amount of data lost as a result of WL leakage can be reduced, allowing enhancement of reliability of the memory system and the semiconductor memory device.

5. Fifth Embodiment

Now, a semiconductor memory device and a memory system according to a fifth embodiment will be described. Unlike in the fourth embodiment, in the fifth embodiment, a case will be described where, when the word line WL in the string unit SU0 is selected, the second word line WL above the selected word line WL is selected. Only differences from the fourth embodiment will be described.

5.1 Writing Order in the Block BLK

Figure 18:
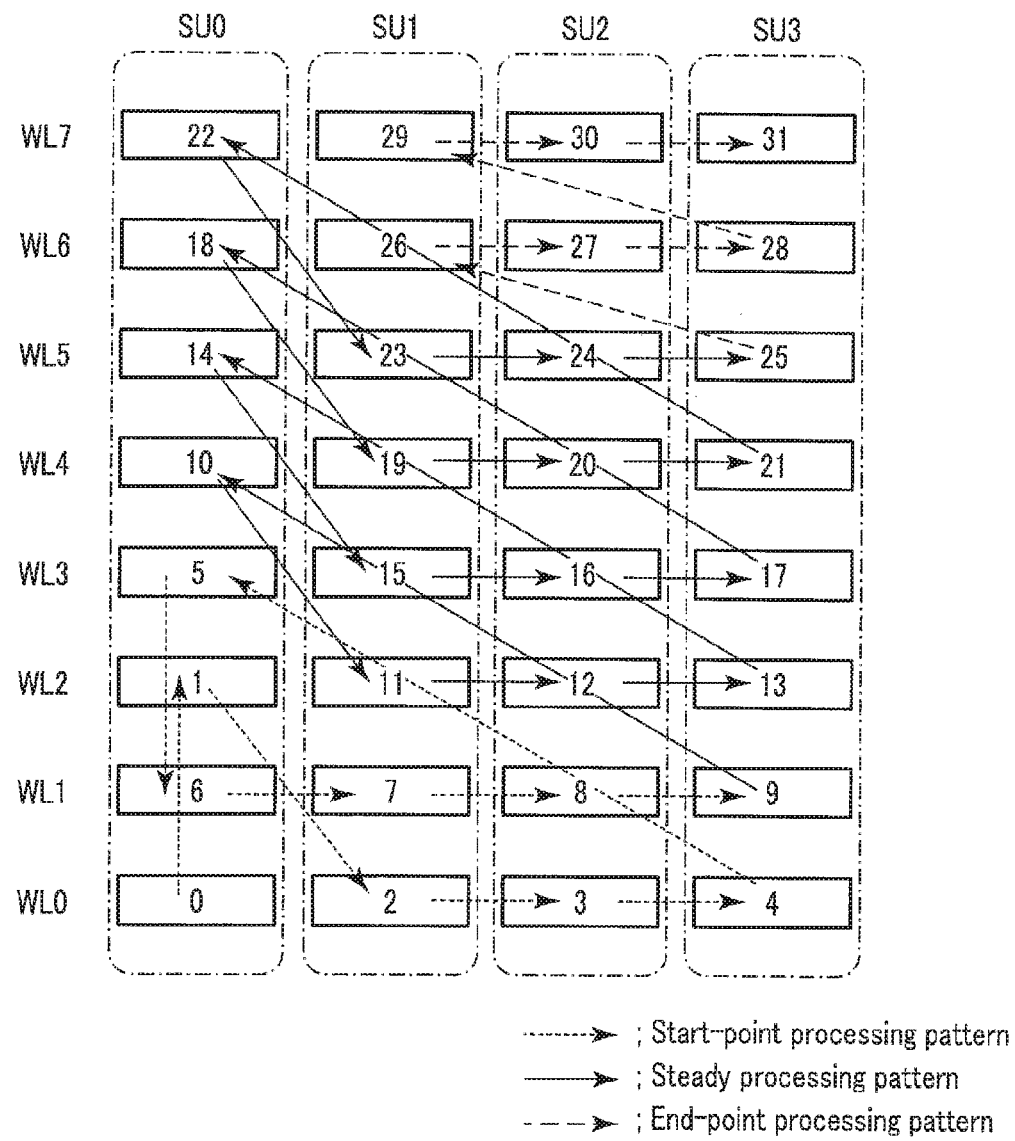
FIG. 18 is a diagram illustrating the writing order in a semiconductor memory device according to a fifth embodiment.

The writing order in the write operation will be described using FIG. 18. An example in FIG. 18 illustrates a case where the total number N of the word lines WL is eight and where 32 memory cell groups MCG are present.

In the present embodiment, if the writing order is selected, a basic pattern is such that the second word line WL above the selected word line WL is selected only in the string unit SU0, whereas the same second word line WL below the selected word line WL is selected in the string units SU1 to SU3. Three write patterns will be specifically described below.

(a) Start-Point Processing Pattern

The start-point processing pattern in the present embodiment corresponds to the zeroth to ninth writes including selection of the lowermost word line WL0.

As depicted in FIG. 18, first, in association with the zeroth write, the word line WL0 in the string unit SU0 is selected.

Then, in association with the first write, the word line WL2 in the string unit SU0, which is the second word line WL above the word line WL0, is selected. In association with the second to fourth writes, the word line WL0 is sequentially selected in the string units SU1 to SU3.

Then, in association with the fifth and sixth writes, the word line WL3 in the string unit SU0 and the word line WL1, which is the second word line WL below the word line WL3, are sequentially selected. In association with the seventh to ninth writes, the word line WL1 is sequentially selected in the string units SU1 to SU3.

(b) Steady Processing Pattern

The steady processing pattern is a main write pattern repeated according to the total number N of the word lines WL until the word line WL(N−3), which is the second word line WL below the uppermost word line WL, in the string unit SU3 (in the example in FIG. 18, the word line WL5 corresponding to the 25th write) is selected.

In association with the 10th write, the word line WL4 in the string unit SU0 is selected. In association with the 11th to 13th writes, the word line WL2 is sequentially selected in the string units SU1 to SU3.

A similar pattern is subsequently repeated to execute the 14th to 25th writes.

(c) End-Point Processing Pattern

In the end-point processing pattern, first, in association with the 26th to 28th writes, the word line WL6 is sequentially selected in the string units SU1 to SU3. Then, in association with the 29th to 31st writes, the uppermost word line WL7 is selected in the string units SU1 to SU3.

Consequently, if a certain word line WL in the string unit SU0 is selected, then for the first word line WL below the certain word line WL, the data in the full sequence unit FSU has been written to the memory cell group MCG in the string unit SU0.

5.2 Effects Related to the Present Embodiment

The writing order in the present embodiment can be applied to the first and second embodiments.

The configuration in the present embodiment can produce effects similar to the effects of the fourth embodiment.

6. Sixth Embodiment

Now, a semiconductor memory device and a memory system according to a sixth embodiment will be described. In the sixth embodiment, a case will be described where the memory cell transistors MT correspond to data of four values (2 bits) and where one bit is written to each memory cell transistor MT, that is, 1 page of data is written to each memory cell group MCG (such write is hereinafter referred to as "page by page"). In the sixth embodiment, the writing order described in the third embodiment is applied to page-by-page write. Only differences from the first to fifth embodiments will be described below.

6.1 Operations of the Controller

First, operations of the controller 200 will be described using FIG. 19. An example in FIG. 19 illustrates a case where the controller 200 transmits the data in the lower page, the middle page, or the upper page to the NAND flash memory 100 and then executes data write. That is, the controller 200 transmits 1 page of data to allow the NAND flash memory 100 to write the data. With differences from FIGS. 6 to 8 for the first embodiment, only the I/O signal IO0<7:0> will be described.

As depicted in FIG. 19, the controller 200 first outputs the command "80H" to the NAND flash memory 100. The controller 200 then outputs address signals "Col0", "Col1", "Row0", "Row1", and "Row2" and data "D0" to "D527". A cycle of address signals and data are not limited to this.

The controller 200 then outputs the command "10H". Upon receiving the command "10H", the NAND flash memory 100 writes the loaded data into the lower page, the middle page, or the upper page.

6.2 Writing Order in the Block BLK

Now, three examples of the writing order in the present embodiment will be described according to the configuration of pages in the memory cell group MCG in the string unit SU.

6.2.1 First Example

Figure 20:
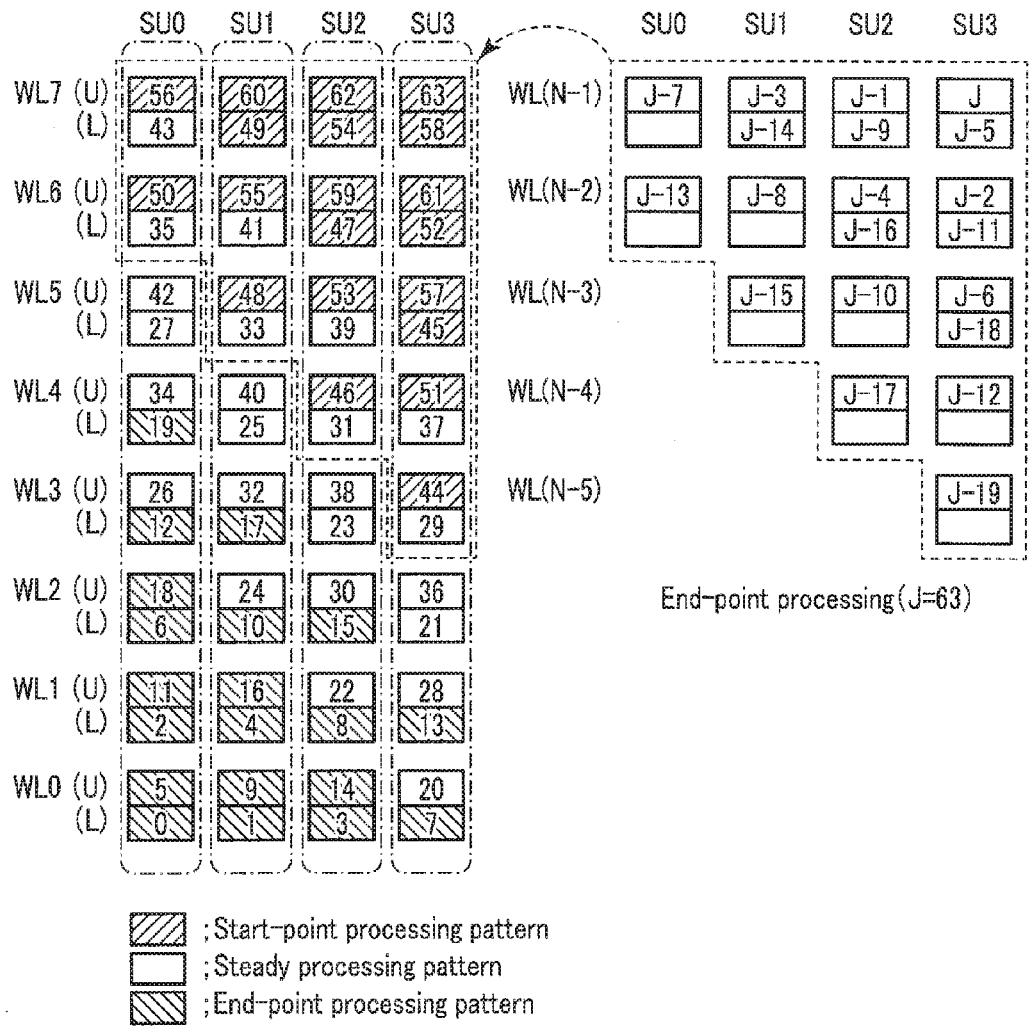
FIG. 20 is a diagram illustrating the writing order in a semiconductor memory device according to a first example in the sixth embodiment.

In a first example, a case will be described where memory cell groups MCG corresponding to all the word lines WL correspond to page-by-page write of 2 pages. FIG. 20 schematically illustrates the writing order according to the present example. Each rectangle in each string unit SU represents 1 page corresponding to one word line WL. That is, one rectangle corresponds to 1 page-by-page write operation. Numbers in the rectangles in FIG. 20 indicate the order of page-by-page data write. A lower page (reference character "L" in FIG. 20) and an upper page (reference character "U" in FIG. 20) represented as rectangles in contact with each other correspond to one memory cell group MCG. The number of string units contained in one block BLK is denoted by K (K is a natural number of 1 or more) and the final number of the writing order is denoted by J (J is a natural number of 1 or more). In the example in FIG. 20, the memory cell transistor MT corresponds to write of 2 bits, the total number N of the word lines WL is eight, and the number K of the string units is 4. In this case, the total number (J+1) of pages is 2×K×N=2×4×8=64, and the final number J of the writing order is 63. That is, the example in FIG. 20 illustrates a case where a total of 64 pages are present including the lower pages and the upper pages.

In the present embodiment, a basic pattern is such that the string units SU are selected in an order of SU3, SU2, SU1, and SU0 and that the first word line WL above the last selected word line WL is selected, with the data in the lower (upper) page written through the newly selected word line WL, as is the case with the third embodiment. In this case, in one string unit SU, first, the second word line WL below the selected word line WL is selected, and the data in the upper page is written through the newly selected word line WL. Subsequently, the second word line WL above the selected word line WL is selected, and the data in the lower page is written through the newly selected word line WL. The present example involves three write patterns as is the case with the third embodiment.

(a) Start-Point Processing Pattern

The start-end processing pattern in the present example includes selection of the lowermost word line WL0 and corresponds to the zeroth to 19th writes.

As depicted in a left table in FIG. 20, first, in association with the zeroth write, the word line WL0 in the string unit SU0 is selected, and the data in the lower page is written. In association with the first write, the word line WL0 in the string unit SU1 is selected, and the data in the lower page is written. In association with the second write, the word line WL1 in the string unit SU0 is selected, and the data in the lower page is written.

Then, in association with the third and fourth writes, the word line WL0 in the string unit SU2 is selected, with the data in the lower page written, and then, the word line WL1 in the string unit SU1 is selected, with the data in the lower page written. In association with the fifth and sixth writes, the word line WL0 in the string unit SU0 is selected, with the data in the upper page written, and then, the word line WL2, which is the second word line WL above the word line WL0, is selected, with the data in the lower page written2.

Then, in association with the seventh and eighth writes, the word line WL0 in the string unit SU3 is selected, with the data in the lower page written, and then, the word line WL1 in the string unit SU2 is selected, with the data in the lower page written. In association with the ninth and 10th writes, the word line WL0 in the string unit SU1 is selected, with the data in the upper page written, and then, the word line WL2, which is the second word line WL above the word line WL0, is selected, with the data in the lower page written. Similarly, in association with the 11th and 12th writes, the word line WL1 in the string unit SU0 is selected, with the data in the upper page written, and then, the word line WL3, which is the second word line WL above the word line WL1, is selected, with the data in the lower page written.

Then, in association with the 13th write, the word line WL1 in the string unit SU3 is selected, and the data in the lower page is written. In association with the 14th and 15th writes, the word line WL0 in the string unit SU2 is selected, with the data in the upper page written, and then, the word line WL2, which is the second word line WL above the word line WL0, is selected, with the data in the lower page written. In association with the 16th and 17th writes, the word line WL1 in the string unit SU1 is selected, with the data in the upper page written, and then, the word line WL3, which is the second word line WL above the word line WL1, is selected, with the data in the lower page written. Similarly, in association with the 18th and 19th writes, the word line WL2 in the string unit SU0 is selected, with the data in the upper page written, and then, the word line WL4, which is the second word line WL above the word line WL2, is selected, with the data in the lower page written.

(b) Steady Processing Pattern

The steady processing pattern is a main write pattern repeated according to the total number N of the word lines WL from the end of the start-point processing pattern until the uppermost word line WL(N−1) in the string unit SU0 (in the example in FIG. 20, the word line WL7) is selected, with the data in the lower page. In the present example, the 20th to 43rd writes correspond to the steady processing pattern.

First, in association with the 20th and 21st writes, in the string unit SU3, the word line WL0 is selected, with the data in the upper page written, and then, the word line WL2, which is the second word line WL above the word line WL0, is selected, with the data in the lower page written. In association with the 22nd and 23rd writes, in the string unit SU2, the word line WL1 is selected, with the data in the upper page written, and then, the word line WL3, which is the second word line WL above the word line WL1, is selected, with the data in the lower page written.

Similarly, in association with the 24th and 25th writes, in the string unit SU1, the word line WL2 is selected, with the data in the upper page written, and then, the word line WL4, which is the second word line WL above the word line WL2, is selected, with the data in the lower page written. Moreover, in association with the 26th and 27th writes, in the string unit SU0, the word line WL3 is selected, with the data in the upper page written, and then, the word line WL5, which is the second word line WL above the word line WL3, is selected, with the data in the lower page written.

That is, when the upper page is focused on, in the string units SU3, SU2, SU1, and SU0 in this order, the word line WL is sequentially selected in an order of WL0, WL1, WL2, and WL3, with the data in the upper page written through the selected word line WL. When the lower page is focused on, in the string units SU3, SU2, SU1, and SU0 in this order, the word line WL is sequentially selected in an order of WL2, WL3, WL4, and WL5, with the data in the lower page written through the selected word line WL.

A similar pattern is subsequently repeated to execute the 28th to 43rd writes.

When the writing order of the data in the lower page is denoted by z_low and the writing order of the data in the upper page is denoted by z_up, general expressions for z_low and z_up in the steady processing pattern are as follows:

$$z\_low = 2Kx + 2(K-1)y - (K^2 - K + 1) \quad \text{Lower page;}$$

$$z\_up = 2Kx + 2(K-1)y - (K^2 - 5K + 2) \quad \text{Upper page;}$$

where
K: the number of string units contained in one block BLK (in the present example, K=4),
x: the number of the selected word line WL, and
y: the number of the selected string unit SU.

(c) End-Point Processing Pattern

Now, the end-point processing pattern in the present example will be described. In the present example, the 44th to 63rd writes correspond to the end-point processing pattern. However, since the end-point processing pattern includes the uppermost word line WL, the corresponding writing order varies according to the total number N (N is a natural number of 1 or more) of the word lines WL. Thus, a writing order as viewed from the end of the order is important. A right table in FIG. 20 represents the writing order corresponding to the end-point processing pattern using the final number J of the writing order. The 44th to 63rd writes corresponding to the end-point processing pattern will be described as the (J−19)th to Jth writes based on the right table in FIG. 20.

First, in association with the (J−19)th and (J−18)th writes, in the string unit SU3, the word line WL(N−5) is selected, with the data in the upper page written, and then, the word line WL(N−3) is selected, with the data in the lower page written. In association with the (J−17)th and (J−16)th writes, in the string unit SU2, the word line WL(N−4) is selected, with the data in the upper page written, and then, the word line WL(N−2) is selected, with the data in the lower page written. Moreover, in association with the (J−15)th and (J−14)th writes, in the string unit SU1, the word line WL(N−3) is selected, with the data in the upper page written, and then, the word line WL(N−1) is selected, with the data in the lower page written. Furthermore, in association with the (J−13)th write, the word line WL(N−2) in the string unit SU0 is selected, with the data in the upper page written.

Then, in association with the (J−12)th and (J−11)th writes, in the string unit SU3, the word line WL(N−4) is selected, with the data in the upper page written, and then, the word line WL(N−2) is selected, with the data in the lower page written. In association with the (J−10)th and (J−9)th writes, in the string unit SU2, the word line WL(N−3) is selected, with the data in the upper page written, and then, the word line WL(N−1) is selected, with the data in the lower page written. Moreover, in association with the (J−8)th and (J−7)th writes, the word line WL(N−2) in the string unit SU1 is selected, with the data in the upper page written, and then, the word line WL(N−1) in the string unit SU0 is selected, with the data in the upper page written.

Then, in association with the (J−6)th and (J−5)th writes, in the string unit SU3, the word line WL(N−3) is selected, with the data in the upper page written, and then, the word line WL(N−1) is selected, with the data in the lower page written. In association with the (J−4)th and (J−3)th writes, the word line WL(N−2) in the string unit SU2 is selected, with the data in the upper page written, and then, the word line WL(N−1) in the string unit SU1 is selected, with the data in the upper page written.

Then, in association with the (J−2)th and (J−1)th writes, the word line WL(N−2) in the string unit SU3 is selected, with the data in the upper page written, and then, the word line WL(N−1) in the string unit SU1 is selected, with the data in the upper page written. Finally, in association with the Jth write, the word line WL(N−1) in the string unit SU3 is selected, with the data in the upper page written.

6.2.2 Second Example

Figure 21:
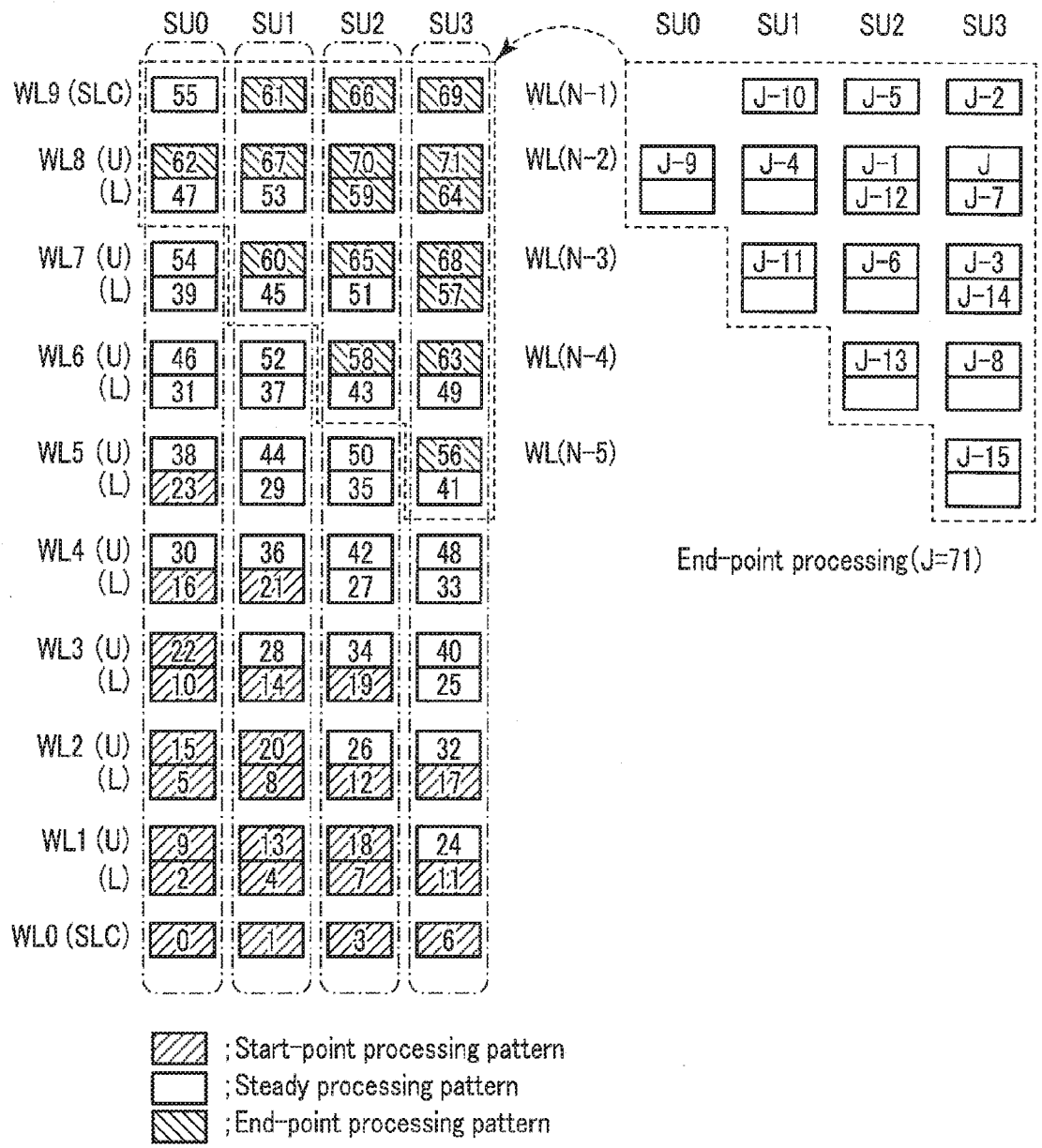
FIG. 21 is a diagram illustrating the writing order in the semiconductor memory device according to a second example in the sixth embodiment.

In a second example in the present embodiment, a case will be described where the memory cell groups MCG corresponding to the uppermost word line WL(N−1) and the lowermost word line WL0 correspond to page-by-page write of 1 page and where the memory cell groups MCG corresponding to the other word lines WL correspond to page-by-page write of 2 pages. FIG. 21 schematically illustrates the writing order according to the present example. An example in FIG. 21, the total number N of the word lines WL is 10. In this case, the total number of pages (J+1) is 8N−8=72, and the final number J of the writing order is 71. That is, the example in FIG. 21 illustrates that a total of 72 pages are present including pages in memory cell groups MCG corresponding to write of 1 page (reference character "SLC" in FIG. 21) and lower pages (L) and upper pages (U) in memory cell groups MCG corresponding to write of 2 pages. Only differences from the first example in the present embodiment will be described below.

(a) Start-Point Processing Pattern

In the present example, the zeroth to 23rd writes correspond to the start-point processing pattern.

As depicted in a left table in FIG. 21, first, in association with the zeroth write, the word line WL0 in the string unit SU0 is selected, and the data in the page is written. Similarly, in association with the first write, the word line WL0 in the string unit SU1 is selected, and the data in the page is written WL0. In association with the second write, the word line WL1 in the string unit SU0 is selected, and the data in the lower page is written.

Then, in association with the third write, the word line WL0 in the string unit SU2 is selected, and the data in the page is written. In association with the fourth write, the word line WL1 in the string unit SU1 is selected, and the data in the lower page is written. Similarly, in association with the fifth write, the word line WL2 in the string unit SU0 is selected, and the data in the lower page is written.

Then, in association with the sixth write, the word line WL0 in the string unit SU3 is selected, and the data in the page is written. In association with the seventh write, the word line WL1 in the string unit SU2 is selected, and the data in the lower page is written.

Similarly, in association with the eighth write, the word line WL2 in the string unit SU1 is selected, and the data in the lower page is written. In association with the ninth and 10th writes, in the string unit SU0, the word line WL1 is selected, with the data in the upper page written, and then, the word line WL3 is selected, with the data in the lower page written.

Then, in association with the 11th write, the word line WL1 in the string unit SU3 is selected, and the data in the lower page is written. Similarly, in association with the 12th write, the word line WL2 in the string unit SU2 is selected, and the data in the lower page is written. In association with the 13th and 14th writes, in the string unit SU1, the word line WL1 is selected, with the data in the upper page written, and then, the word line WL3 is selected, with the data in the lower page written. Similarly, in association with the 15th and 16th writes, in the string unit SU0, the word line WL2 is selected, with the data in the upper page written, and then, the word line WL4 is selected, with the data in the lower page written.

Then, in association with the 17th write, the word line WL2 in the string unit SU3 is selected, and the data in the lower page is written. In association with the 18th and 19th writes, in the string unit SU2, the word line WL1 is selected, with the data in the upper page written, and then, the word line WL3 is selected, with the data in the lower page written. Similarly, in association with the 20th and 21st writes, in the string unit SU1, the word line WL2 is selected, with the data in the upper page written, and then, the word line WL4 is selected, with the data in the lower page written. Moreover, in association with the 22nd and 23rd writes, in the string unit SU0, the word line WL3 is selected, with the data in the upper page written, and then, the word line WL5 is selected, with the data in the lower page written.

(b) Steady Processing Pattern

The steady processing pattern is a main write pattern repeated according to the total number N of the word lines WL from the end of the start-point processing pattern until the uppermost word line WL(N−1) in the string unit SU0 (in the present example, the word line WL9) is selected, with the data in the page written. A basic pattern for the writing order is the same as the basic pattern in the first example in the present embodiment. In the present example, the 24th to 55th writes correspond to the steady processing pattern.

First, in association with the 24th and 25th writes, in the string unit SU3, the word line WL1 is selected, with the data in the upper page written, and then, the word line WL3 is selected, with the data in the lower page written WL3. Similarly, in association with the 26th and 27th writes, in the string unit SU2, the word line WL2 is selected, with the data in the upper page written, and then, the word line WL4 is selected, with the data in the lower page written. Moreover, in association with the 28th and 29th writes, in the string unit SU1, the word line WL3 is selected, with the data in the upper page written, and then, the word line WL5 is selected, with the data in the lower page written. Furthermore, in association with the 30th and 31th writes, in the string unit SU0, the word line WL4 is selected, with the data in the upper page written, and then, the word line WL6 is selected, with the data in the lower page written.

A similar pattern is subsequently repeated to execute the 32nd to 55th writes. However, since the memory cell group MCG corresponding to the word line WL(N−1) corresponds to write of 1 page, the data is written as the data in the page instead of the data in the lower page.

General expressions for z_low and z_up in the steady processing pattern in the present example are as follows:

$$z\_low = 2Kx + 2(K-1)y - (K^2+1) \quad \text{Lower page;}$$

$$z\_up = 2Kx + 2(K-1)y - (K^2 - 4K + 2) \quad \text{Upper page;}$$

When the memory cell group MCG corresponds to write of 1 page, the general expression for the lower page can be applied.

(c) End-Point Processing Pattern

Now, the end-point processing pattern in the present example will be described. In the present example, the 56th to 71st writes corresponding to the end-point processing pattern will be described as the (J−15)th to Jth writes.

As illustrated in a right table in FIG. 21, first, the (J−15)th to (J−4)th writes are executed as in the case of the order of the (J−19)th to (J−8)th writes in the first example in the present embodiment. However, in the first example in the present embodiment, the memory cell group MCG corresponding to the word line WL(N−1) corresponds to write of 2 pages, whereas, in the present example, the memory cell group MCG corresponding to the word line WL(N−1) corresponds to write of 1 page. In such a case, in the present example, the data in the page is written to the corresponding memory cell group MCG during write of the data in the lower page in the first example in the present embodiment. More specifically, for example, in the first example in the present embodiment, in association with the (J−14)th write, the word line WL(N−1) in the string unit SU1 is selected, with the data in the lower page written, whereas, in the present example, in association with the (J−10)th write, the word line WL(N−1) in the string unit SU1 is selected, with the data in the page written.

Then, in association with the (J−3)th write, in the string unit SU3, the word line WL(N−3) is selected, with the data in the upper page written, and then, the word line WL(N−1) is selected, with the data in the page written. In association with the (J−1)th write, the word line WL(N−2) in the string unit SU2 is selected, with the data in the upper page written.

Finally, in association with the Jth write, the word line WL(N−2) in the string unit SU3 is selected, with the data in the upper page written.

6.2.3 Third Example

Figure 22:
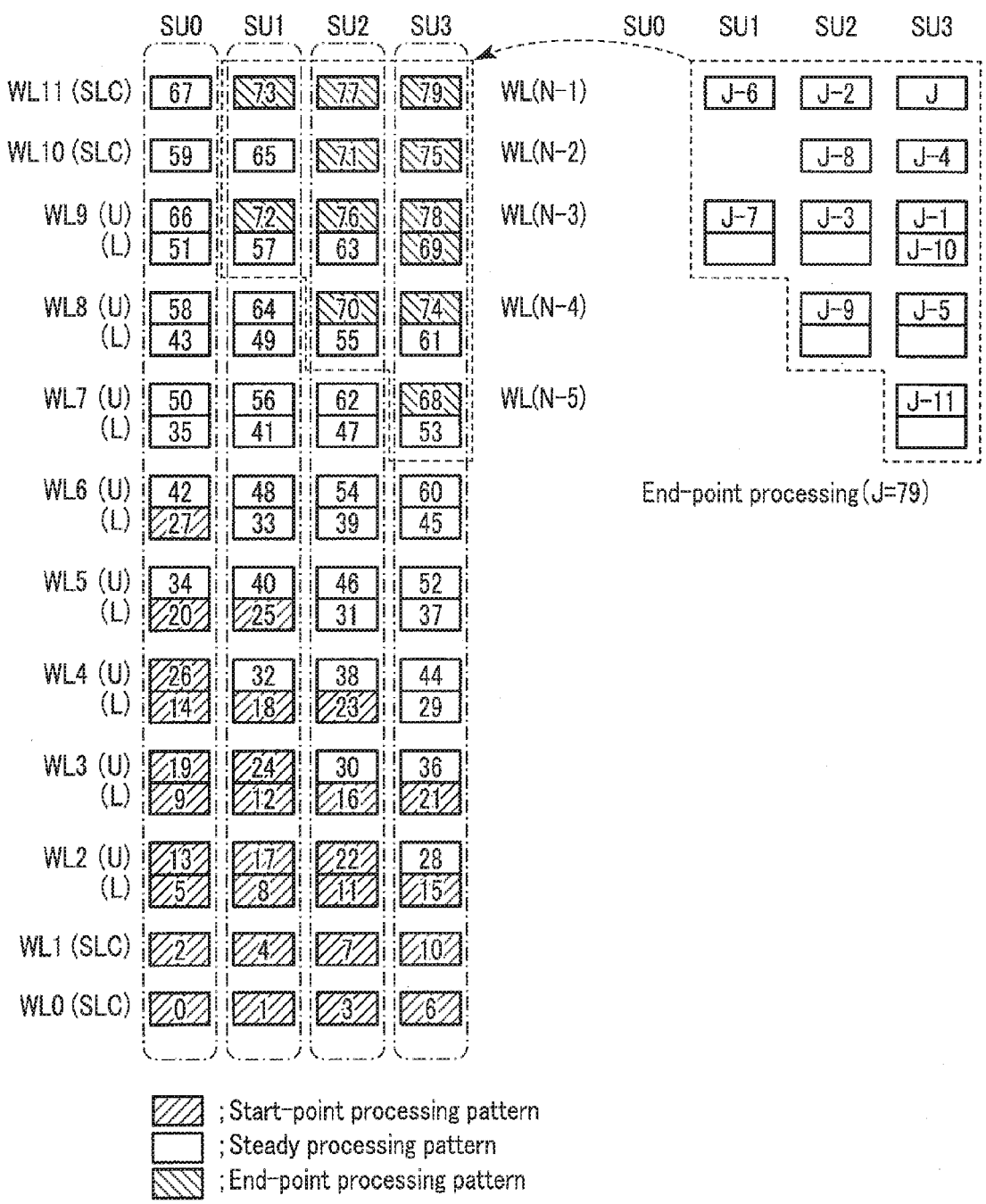
FIG. 22 is a diagram illustrating the writing order in the semiconductor memory device according to a third example in the sixth embodiment.

In a third example, a case will be described where the memory cell groups MCG corresponding to the word lines WL0, WL1, WL(N−2), and WL(N−1) correspond to page-by-page write of 1 page and where the memory cell groups MCG corresponding to the other word lines WL correspond to page-by-page write of 2 pages. FIG. 22 schematically illustrates the writing order according to the present example. In an example in FIG. 22, the total number N of the word lines WL is 12. In this case, the total number (J+1) is 8N−16=80, and the final number J of the writing order is 79. That is, the example in FIG. 22 illustrates that a total of 80 pages are present including pages (SLC) in the memory cell groups MCG corresponding to write of 1 page and lower pages (L) and upper pages (U) in the memory cell groups MCG corresponding to write of 2 pages. Only differences from the first example and the second example in the present embodiment will be described.

(a) Start-Point Processing Pattern

The start-point processing pattern in the present example includes selection of the lowermost word line WL0 and corresponds to the zeroth to 27th writes.

As illustrated in a left table in FIG. 22, first, the zeroth to eighth writes are executed as is the case with the second example. In association with the ninth write, the word line WL3 in the string unit SU0 is selected, and the data in the lower page is written.

Then, in association with the 10th write, the word line WL1 in the string unit SU3 is selected, and the data in the page is written. In association with the 11th write, the word line WL2 in the string unit SU2 is selected, and the data in the lower page is written. Similarly, in association with the 12th write, the word line WL3 in the string unit SU1 is selected, and the data in the page is written WL3. In association with the 13th and 14th writes, in the string unit SU0, the word line WL2 is selected, with the data in the upper page written, and then, the word line WL4 is selected, with the data in the lower page written.

Then, in association with the 15th write, the word line WL2 in the string unit SU3 is selected, and the data in the lower page is written. Similarly, in association with the 16th write, the word line WL3 in the string unit SU2 is selected, and the data in the lower page is written. In association with the 17th and 18th writes, in the string unit SU1, the word line WL2 is selected, with the data in the upper page written, and then, the word line WL4 is selected, with the data in the lower page written. Similarly, in association with the 19th and 20th writes, in the string unit SU0, the word line WL3 is selected, with the data in the upper page written, and then, the word line WL5 is selected, with the data in the lower page written.

Then, in association with the 21th write, the word line WL3 in the string unit SU3 is selected, and the data in the lower page is written. In association with the 22th and 23th writes, in the string unit SU2, the word line WL2 is selected, with the data in the upper page written, and then, the word line WL4 is selected, with the data in the lower page written. Similarly, in association with the 24th and 25th writes, in the string unit SU1, the word line WL3 is selected, with the data in the upper page written, and then, the word line WL5 is selected, with the data in the lower page written. Moreover, in association with the 26th and 27th writes, in the string unit SU0, the word line WL4 is selected, with the data in the upper page written, and then, the word line WL6 is selected, with the data in the lower page written.

(b) Steady Processing Pattern

The steady processing pattern is a main write pattern repeated according to the total number N of the word lines WL from the end of the start-point processing pattern until the uppermost word line WL(N−1) in the string unit SU0 (in the present example, the word line WL11) is selected, with the data in the page written. A basic pattern for the writing order is the same as the basic pattern in the first example in the present embodiment. In the present example, the 28th to 67th writes correspond to the steady processing pattern.

First, in association with the 28th and 29th writes, in the string unit SU3, the word line WL2 is selected, with the data in the upper page written, and then, the word line WL4 is selected, with the data in the lower page written. Similarly, in association with the 30th and 31st writes, in the string unit SU2, the word line WL3 is selected, with the data in the upper page written, and then, the word line WL5 is selected, with the data in the lower page written. Moreover, in association with the 32nd and 33rd writes, in the string unit SU1, the word line WL4 is selected, with the data in the upper page written, and then, the word line WL6 is selected, with the data in the lower page written. Furthermore, in association with the 34th and 35th writes, in the string unit SU0, the word line WL5 is selected, with the data in the upper page written, and then, the word line WL7 is selected, with the data in the lower page written.

A similar pattern is subsequently repeated to execute the 36th to 67th writes. However, since the memory cell groups MCG corresponding to the word lines WL(N−1) and WL(N−2) correspond to write of 1 page, the data is written as the data in the page instead of the data in the lower page.

General expressions for z_low and z_up in the steady processing pattern in the present example are as follows:

$$z\_low = 2Kx + 2(K-1)y - (K^2 + K + 1) \quad \text{Lower page;}$$

$$z\_up = 2Kx + 2(K-1)y - (K^2 - 3K + 2) \quad \text{Upper page;}$$

When the memory cell group MCG corresponds to write of 1 page, the general expression for the lower page can be applied.

(c) End-Point Processing Pattern

Now, the end-point processing pattern in the present example will be described. In the present example, the 68th to 79th writes corresponding to the end-point processing pattern will be described as the (J−11)th to Jth writes.

As illustrated in a right table in FIG. 22, first, the (J−11)th to (J−6)th writes are executed as in the case of the order of the (J−19)th to (J−14)th writes in the first example in the present embodiment. However, in the first example in the present embodiment, the memory cell groups MCG corresponding to the word lines WL(N−1) and WL(N−2) correspond to write of 2 pages, whereas, in the present example, the memory cell groups MCG corresponding to the word lines WL(N−1) and WL(N−2) correspond to write of 1 page. In such a case, in the present example, the data in the page is written to the corresponding memory cell group MCG during write of the data in the lower page in the first example in the present embodiment.

Then, in association with the (J−5)th and (J−4)th writes, in the string unit SU3, the word line WL(N−4) is selected, with the data in the upper page written, and then, the word line WL(N−2) is selected, with the data in the page written. In association with the (J−3)th and (J−2)th writes, in the string unit SU2, the word line WL(N−3) is selected, with the data in the upper page written, and then, the word line WL(N−1) is selected, with the data in the page written.

In association with the (J−1)th and Jth writes, in the string unit SU3, the word line WL(N−3) is selected, with the data in the upper page written, and then, the word line WL(N−1) is selected, with the data in the page written.

6.4 Effects Related to the Present Embodiment

The configuration according to the present embodiment can produce effects similar to the effects of the third embodiment when 2 bits (2 pages) of data are written to the memory cell transistors MT (memory cell group MCG) on a page-by-page basis.

7. Seventh Embodiment

Now, a semiconductor memory device and a memory system according to a seventh embodiment will be described. In the seventh embodiment, the memory cell transistor MT corresponds to data of 2 bits, and the writing order described in the fourth embodiment is applied when 2 pages of data are written to the memory cell group MCG on a page-by-page basis. Only differences from the first to sixth embodiments will be described.

7.1 Writing Order in the Block BLK

For the writing order in the present embodiment, three examples will be described according to the configuration of pages in the memory cell group MCG in the string unit SU.

7.2.1 First Example

Figure 23:
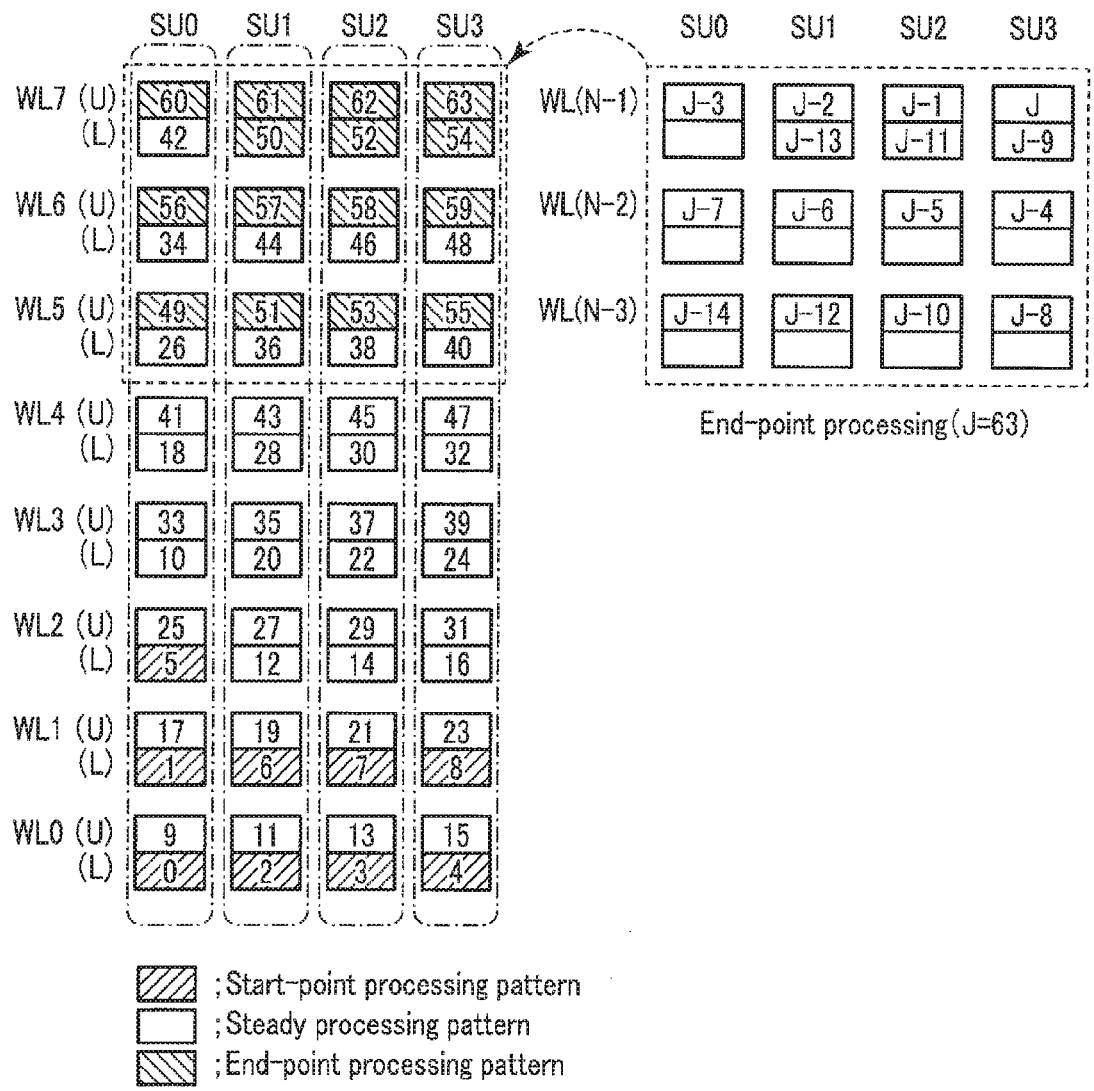
FIG. 23 is a diagram illustrating the writing order in a semiconductor memory device according to a first example in a seventh embodiment.

In a first example, the memory cell groups MCG corresponding to all the word lines WL correspond to page-by-page write of 2 pages as is the case with the first example in the sixth embodiment. FIG. 23 schematically illustrates the writing order according to the first example. In an example in FIG. 23, the total number N of the word lines WL is eight, the total number (J+1) of pages is 64, and the final number J of the writing order is 63. That is, the example in FIG. 23 illustrates a case where 64 pages are present including lower pages (L) and upper pages (U).

In the present embodiment, a basic pattern is such that, when the data in the lower page is written, the first word line WL above the selected word line WL is selected only in the string unit SU0, whereas the same first word line WL below the selected word line WL is selected in the string units SU1 to SU3, as is the case with the fourth embodiment. When the data in the upper page is written, the same word line WL is selected in the string units SU0 to SU3. The present example involves three write patterns as is the case with the fourth embodiment.

(a) Start-Point Processing Pattern

The start-point processing pattern in the present example includes selection of the lowermost word line WL0 and corresponds to the zeroth to eighth writes in which only the data in the lower page is written.

As depicted in a left table in FIG. 23, first, in association with the zeroth write, the word line WL0 in the string unit SU0 is selected, and the data in the lower page is written. In association with the first write, the word line WL1, which is the first word line WL above the selected word line WL in the same string unit SU0 is selected, and the data in the lower page is written.

Subsequently, in association with the second to fourth writes, the word line WL0 is selected in the string units SU1 to SU3, and in each of the string units, the data in the lower page written.

Then, in association with the fifth write, the word line WL2 in the string unit SU0 is selected, and the data in the lower page is written. Subsequently, in association with the sixth to eighth writes, the word line WL1 is selected in the string units SU1 to SU3, and in each of the string units, the data in the lower page is written WL1.

(b) Steady Processing Pattern

The steady processing pattern is a main write pattern repeated according to the total number N of the word lines WL from the end of the start-point processing pattern until the word line WL(N−2) (in the present example, the word line WL6), which is the first word line WL below the uppermost word line WL(N−1) in the string unit SU3, is selected, with the data in the lower page written. In the present example, the ninth to 48th writes correspond to the steady processing pattern.

First, in association with the ninth and 10th writes, in the string unit SU0, the word line WL0 is selected, with the data in the upper page written, and then, the word line WL3, which is the second word line WL above the word line WL0, is selected, with the data in the lower page written. Subsequently, in association with the 11th and 16th writes, in each of the string units SU0 to SU3, the word line WL0 is selected, with the data in the upper page written, and then, the word line WL2, which is the second word line WL above the word line WL0, is selected, with the data in the lower page written. That is, when the data in the lower page is written, the first word line WL above the selected word line WL is selected only in the string unit SU0. When the data in the upper page is written, the same word line WL is selected in the string units SU0 to SU3.

A similar pattern is subsequently repeated to execute the 17th to 48th writes.

When the writing order of the data in the lower pages in the string unit SU0 is denoted by "z_low(y=0)", the writing order of the data in the lower pages in the string units SU1 to SU3 is denoted by "z_low(y>1)", and the writing order of the data in the upper pages is denoted by z_up, general expressions for "z_low(y=0)", "z_low(y>1)", and z_up in the steady processing pattern are as follows when K=4 (the number of string units per block BLK is four).

"z_low(y=0)"=8x−14            Lower page;

"Z_low(y>1)"=8x+2y−6           Lower page;

z_up=8x+2y+9                   Upper page;

As described above, the general expression for the lower page varies between the string unit SU0 and the string units SU1 to SU3.

(c) End-Point Processing Pattern

Now, the end-point processing pattern in the present example will be described. In the present example, the 49th to 63th writes corresponding to the end-point processing pattern will be described as the (J−14)th to Jth writes.

As depicted in a right table in FIG. 23, first, in association with the (J−14)th write, the word line WL(N−3) in the string unit SU0 is selected, and the data in the upper page is written. In association with the (J−13)th and (J−12)th writes, in the string unit SU1, the word line WL(N−1) is selected, with the data in the lower page written, and then, the word line WL(N−3) is selected, with the data in the upper page written. Similarly, in association with the (J−11)th and (J−8)th writes, in each of the string units SU2 and SU3, the word line WL(N−1) is selected, with the data in the lower page written, and then, the word line WL(N−3) is selected, with the data in the upper page written.

Then, in association with the (J−7)th to (J−4)th writes, in each of the string units SU0 to SU3, the word line WL(N−2) is selected, and in each of the string units, the data in the upper page is written.

Then, in association with the (J−3)th to Jth writes, the word line WL(N−1) is selected in the string units SU0 to SU3, and in each of the string units, the data in the upper page is written.

7.1.2 Second Example

Figure 24:
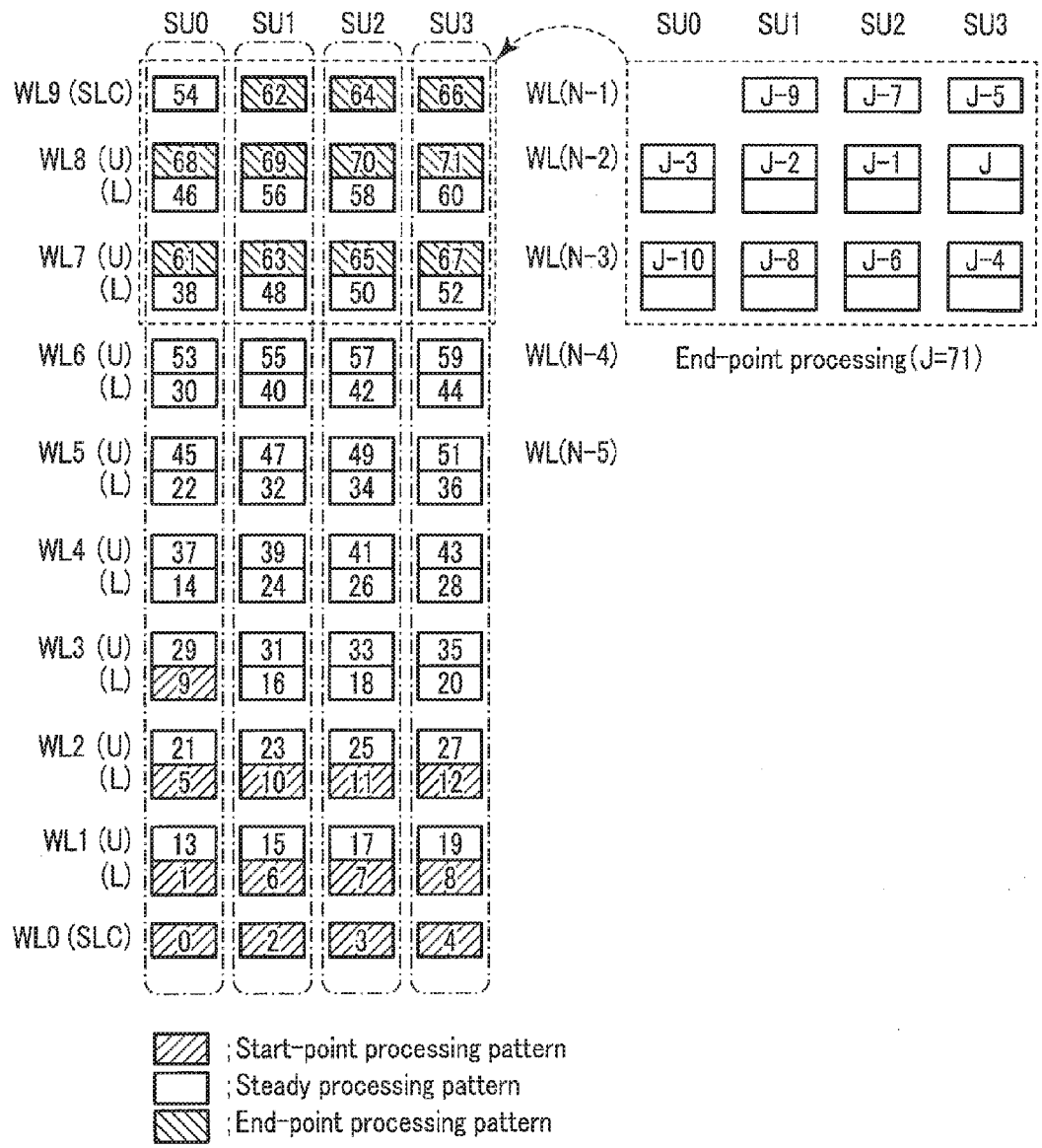
FIG. 24 is a diagram illustrating the writing order in the semiconductor memory device according to a second example in the seventh embodiment.

In a second example, a case will be described where the memory cell groups MCG corresponding to the uppermost word line WL(N−1) and the lowermost word line WL0 correspond to page-by-page write of 1 page and where the memory cell groups MCG corresponding to the other word lines WL correspond to page-by-page write of 2 pages, as is the case with the second example in the sixth embodiment. FIG. 24 schematically illustrates the writing order according to the present example. In an example in FIG. 24, the total number N of the word lines WL is 10, the total number (J+1) of pages is 72, and the final number J of the writing order is 71. That is, the example in FIG. 24 illustrates that a total of 72 pages are present including pages (SLC) in the memory cell groups MCG corresponding to write of 1 page and lower pages (L) and upper pages (U) in the memory cell groups MCG corresponding to write of 2 pages. Only differences from the first example in the present embodiment will be described below.

(a) Start-Point Processing Pattern

The start-point processing pattern in the present example includes selection of the lowermost word line WL0 and corresponds to the zeroth to 12th writes.

As depicted in a left table in FIG. 24, first, the zeroth to eighth writes are executed as is the case with the first example in the present embodiment.

Then, in association with the ninth write, the word line WL3 in the string unit SU0 is selected, and the data in the lower page is written. In association with the 10th to 12th writes, the word line WL2 is selected in the string units SU1 to SU3, and in each of the string units, the data in the lower page is written.

(b) Steady Processing Pattern

The steady processing pattern is a main write pattern repeated according to the total number N of the word lines WL from the end of the start-point processing pattern until the word line WL(N−2) (in the present example, the word line WL8) in the string unit SU3 is selected, with the data in the lower page written. A basic pattern for the writing order is the same as the basic pattern in the first example in the present embodiment. In the present example, the 13th to 60th writes correspond to the steady processing pattern.

First, in association with the 13th and 14th writes, in the string unit SU0, the word line WL1 is selected, with the data in the upper page written, and then, the word line WL4, which is the third word line WL above the word line WL1, is selected, with the data in the lower page written. Subsequently, in association with the 15th to 20th writes, in each of the string units SU1 to SU3, the word line WL1 is selected, with the data in the upper page written, and then, the word line WL3, which is the second word line WL above the word line WL1, is selected, with the data in the lower page written.

A similar pattern is subsequently repeated to execute the 17th to 48th writes. However, since the memory cell group MCG corresponding to the word line WL(N−1) corresponds to write of 1 page, the data is written as the data in the page instead of the data in the lower page.

General expressions for the steady processing pattern are as follows when the number K of string units per block BLK is four.

"z_low(y=0)"=8x−18        Lower page;

"Z_low(y>1)"=8x+2y−10     Lower page;

z_up=8x+2y++5             Upper page;

As described above, the general expression for the lower page varies between the string unit SU0 and the string units SU1 to SU3.

(c) End-Point Processing Pattern

Now, the end-point processing pattern in the present example will be described. In the present example, the 61st to 71st writes corresponding to the end-point processing pattern will be described as the (J−10)th to Jth writes.

As illustrated in a right table in FIG. 24, the (J−10)th to Jth writes are executed as in the case of the order of the (J−14)th to (J−4)th writes in the first example in the present embodiment. However, in the first example in the present embodiment, the memory cell group MCG corresponding to the word line WL(N−1) corresponds to write of 2 pages, whereas, in the present example, the memory cell group MCG corresponding to the word line WL(N−1) corresponds to write of 1 page. In such a case, in the present example, the data in the page is written to the corresponding memory cell group MCG during write of the data in the lower page in the first example in the present embodiment.

7.1.3 Third Example

Figure 25:
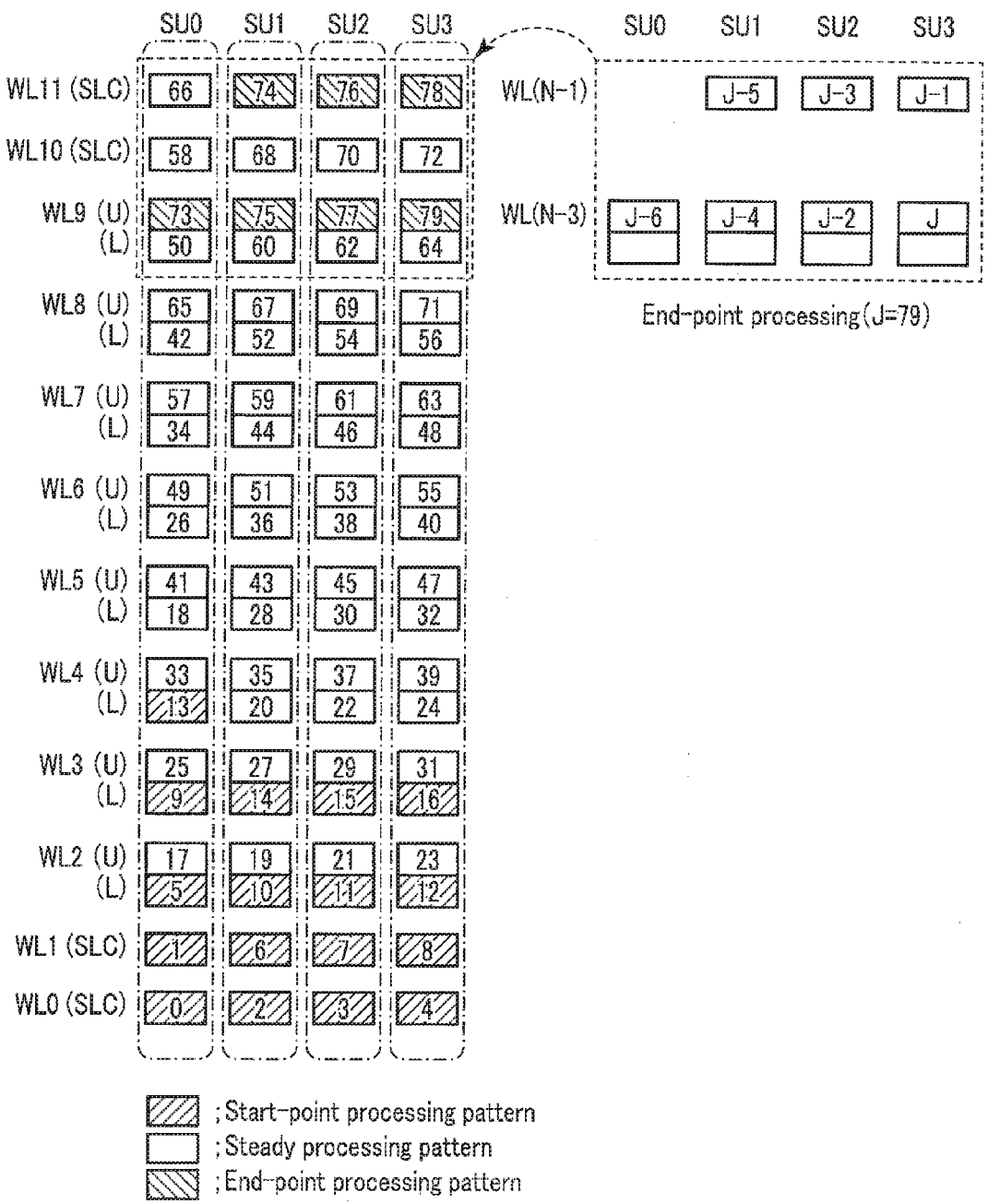
FIG. 25 is a diagram illustrating the writing order in the semiconductor memory device according to a third example in the seventh embodiment.

In a third example, a case will be described where the memory cell groups MCG corresponding to the word lines WL0, WL1, WL(N−2), and WL(N−1) correspond to page-by-page write of 1 page and where the memory cell groups MCG corresponding to the other word lines WL correspond to page-by-page write of 2 pages, as is the case with the third example in the sixth embodiment. FIG. 25 schematically illustrates the writing order according to the present example. In an example in FIG. 25, the total number N of the word lines WL is 12, the total number (J+1) of pages is 80, and the final number J of the writing order is 79. That is, the example in FIG. 25 illustrates that a total of 80 pages are present including pages (SLC) in the memory cell groups MCG corresponding to write of 1 page and lower pages (L) and upper pages (U) in the memory cell groups MCG corresponding to write of 2 pages. Only differences from the first example and the second example in the present embodiment will be described.

(a) Start-Point Processing Pattern

The start-point processing pattern in the present example includes selection of the lowermost word line WL0 and corresponds to the zeroth to 16th writes.

As depicted in a left table in FIG. 25, first, the zeroth to 12th writes are executed as is the case with the second example in the present embodiment.

Then, in association with the 13th write, the word line WL4 in the string unit SU0 is selected, and the data in the lower page is written. In association with the 14th to 16th writes, the word line WL3 is selected in the string units SU1 to SU3, and in each of the string units, the data in the lower page is written.

(b) Steady Processing Pattern

The steady processing pattern is a main write pattern repeated according to the total number N of the word lines WL from the end of the start-point processing pattern until the word line WL(N−2) (in the present example, the word line WL10), which is the first word line WL below the uppermost word line WL in the string unit SU3, is selected, with the data in the page written. A basic pattern for the writing order is the same as the basic pattern in the first example and the second example in the present embodiment. In the present example, the 17th to 72nd writes correspond to the steady processing pattern.

First, in association with the 17th and 18th writes, in the string unit SU0, the word line WL2 is selected, with the data in the upper page written, and then, the word line WL5, which is the third word line WL above the word line WL2, is selected, with the data in the lower page written. Subsequently, in association with the 19th to 24th writes, in each of the string units SU1 to SU3, the word line WL2 is selected, with the data in the upper page written, and then, the word line WL4, which is the second word line WL above the word line WL2, is selected, with the data in the lower page written.

A similar pattern is subsequently repeated to execute the 25th to 72nd writes. However, since the memory cell groups MCG corresponding to the word lines WL(N−1) and WL(N−2) correspond to write of 1 page, the data is written as the data in the page instead of the data in the lower page.

General expressions for the steady processing pattern are as follows when the number K of string units per block BLK is four.

"z_low(y=0)"=8x−22　　　　　　　　　　Lower page;

"Z_low(y>1)"=8x+2y−14　　　　　　　　Lower page;

z_up=8x+2y+1　　　　　　　　　　　　Upper page;

As is the case with the first example and the second example in the present embodiment, the general expression for the lower page varies between the string unit SU0 and the string units SU1 to SU3.

(c) End-Point Processing Pattern

Now, the end-point processing pattern in the present example will be described. In the present example, the 73rd to 79th writes corresponding to the end-point processing pattern will be described as the (J−6)th to Jth writes.

As illustrated in a right table in FIG. 25, the (J−6)th to Jth writes are executed as in the case of the order of the (J−14)th to (J−8)th writes in the first example in the present embodiment. However, in the first example in the present embodiment, the memory cell group MCG corresponding to the word line WL(N−1) corresponds to write of 2 pages, whereas, in the present example, the memory cell group MCG corresponding to the word line WL(N−1) corresponds to write of 1 page. In such a case, in the present example, the data in the page is written to the corresponding memory cell group MCG during write of the data in the lower page in the first example in the present embodiment.

7.2 Effects Related to the Present Embodiment

The configuration according to the present embodiment can produce effects similar to the effects of the fourth embodiment when 2 bits (2 pages) of data are written to the memory cell transistors MT (memory cell group MCG) on a page-by-page basis.

8. Eighth Embodiment

Now, a semiconductor memory device and a memory system according to an eighth embodiment will be described. In the eighth embodiment, the memory cell transistor MT corresponds to data of 3 bits, and the writing order described in the third embodiment is applied when 3 pages of data are written to the memory cell group MCG on a page-by-page basis. Only differences from the first to seventh embodiments will be described.

8.1 Writing Order in the Block BLK

For the writing order in the present embodiment, three examples will be described according to the configuration of pages in the memory cell group MCG in the string unit SU.

8.1.1 First Example

Figure 26:
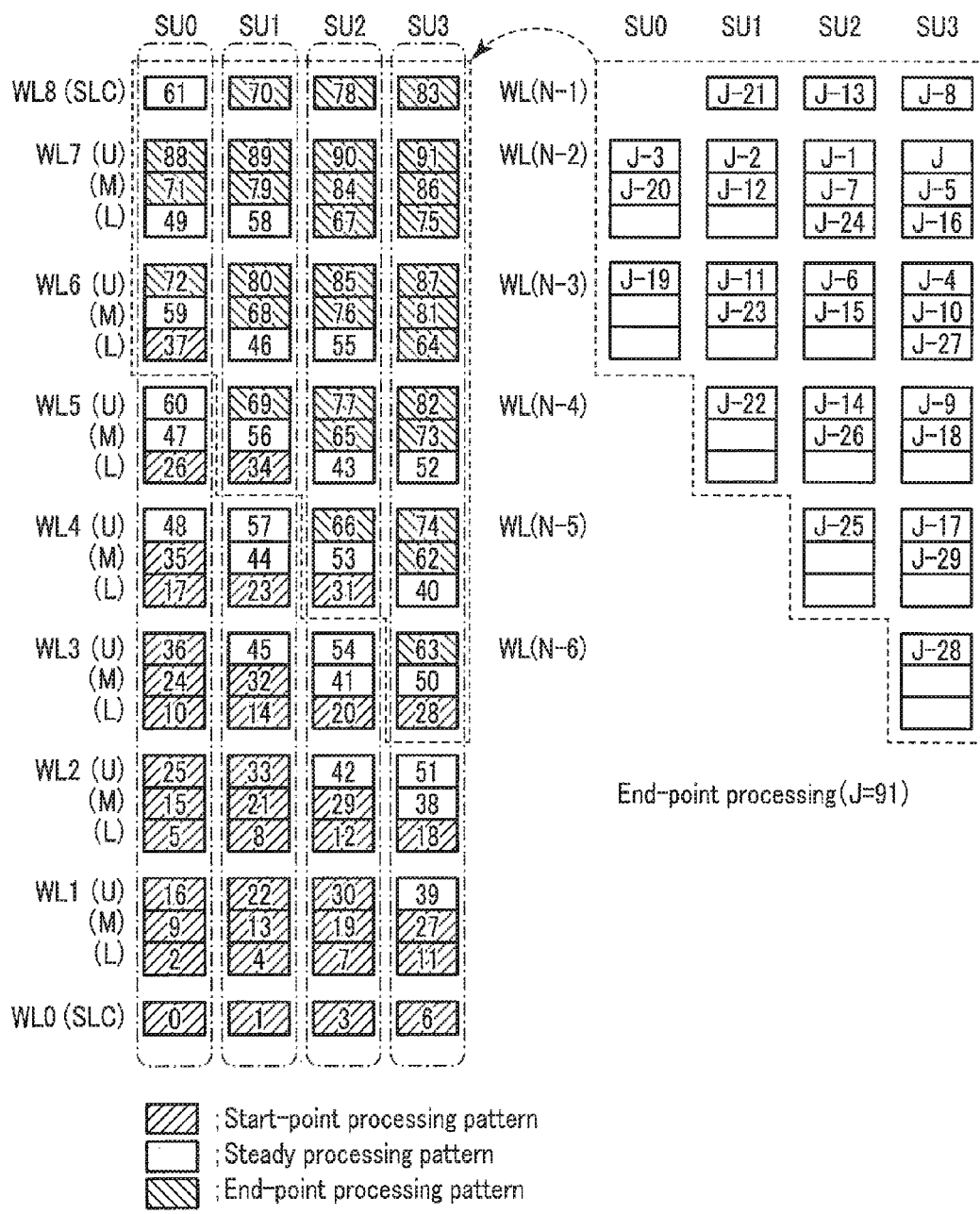
FIG. 26 is a diagram illustrating the writing order in a semiconductor memory device according to a first example in an eighth embodiment.

In a first example, a case will be described where the memory cell groups MCG corresponding to the uppermost word line WL(N−1) and the lowermost word line WL0 correspond to page-by-page write of 1 page and where the memory cell groups MCG corresponding to the other word lines WL correspond to page-by-page write of 3 pages. FIG. 26 schematically illustrates the writing order according to the present example. Each rectangle in each of the string units SU represents one page corresponding to one word line WL. One memory cell group MCG corresponds to a lower page (reference character "L" in FIG. 26), a middle page (reference character "M" in FIG. 26), and an upper page (reference character "U" in FIG. 26) which correspond to rectangles in contact with one another. The example in FIG. 26 illustrates a case where the total number N of the word lines WL is nine and where seven word lines WL correspond to write of 3 bits. In this case, the total number (J+1) of pages is 12N−16=92. The final number J of the writing order is 91. That is, the example in FIG. 26 illustrates that a total of 92 pages are present including pages (SLC) in the memory cell groups MCG corresponding to write of 1 page and lower pages (L), middle pages (M), and upper pages (U) in the memory cell groups MCG corresponding to write of 3 pages.

(a) Start-Point Processing Pattern

The start-point processing pattern in the present example includes selection of the lowermost word line WL0 and corresponds to the zeroth to 37th writes.

As depicted in a left table in FIG. 26, first, in association with the zeroth write, the word line WL0 in the string unit SU0 is selected, and the data in the page is written. In association with the first write, the word line WL0 in the string unit SU1 is selected, and the data in the page is written. In association with the second write, the word line WL1 in the string unit SU0 is selected, and the data in the lower page is written.

Then, in association with the third write, the word line WL0 in the string unit SU2 is selected, and the data in the page is written. In association with the fourth write, the word line WL1 in the string unit SU1 is selected, and the data in the lower page is written. In association with the fifth write, the word line WL2 in the string unit SU0 is selected, and the data in the lower page is written.

Then, in association with the sixth write, the word line WL0 in the string unit SU3 is selected, and the data in the page is written. In association with the seventh write, the word line WL1 in the string unit SU2 is selected, and the data in the lower page is written. In association with the eighth write, the word line WL2 in the string unit SU1 is selected, and the data in the lower page is written. In association with the ninth and 10th writes, in the string unit SU0, the word line WL1 is selected, with the data in the middle page written, and the word line WL3, which is the second word line WL above the word line WL1, with the data in the lower page is written.

Then, in association with the 11th write, the word line WL1 in the string unit SU3 is selected, and the data in the lower page is written. In association with the 12th write, the word line WL2 in the string unit SU2 is selected, and the data in the lower page is written. In association with the 13th and 14th writes, in the string unit SU1, the word line WL1 is selected, with the data in the middle page written, and then, the word line WL3, which is the second word line WL above the word line WL1, is selected, with the data in the lower page written. In association with the 15th to 17th writes, in the string unit SU0, the word line WL2, the word line WL1, and the word line WL4 are sequentially selected, and the data in the middle page, the data in the upper page, and the data in the lower page are written, the word line WL1, and the word line WL4, respectively.

Then, in association with the 18th write, the word line WL2 in the string unit SU3 is selected, and the data in the lower page is written. In association with the 19th and 20th writes, in the string unit SU2, the word line WL1 is selected, with the data in the middle page written, and then, the word line WL3, which is the second word line WL above the word line WL1, is selected, with the data in the lower page written. In association with the 21st to 23rd writes, in the string unit SU1, the word line WL2, the word line WL1, and the word line WL4 are sequentially selected, and the data in the middle page, the data in the upper page, and the data in the lower page are written, the word line WL1, and the word line WL4, respectively. Similarly, in association with the 24th to 26th writes, in the string unit SU0, the word line WL3, the word line WL2, and the word line WL5 are sequentially selected, and the data in the middle page, the data in the upper page, and the data in the lower page are written, the word line WL2, and the word line WL5, respectively.

In association with the 27th and 28th writes, in the string unit SU3, the word line WL1 is selected, with the data in the middle page written, and then, the word line WL3, which is the second word line WL above the word line WL1, is selected, with the data in the lower page written.

In association with the 29th to 31st writes, in the string unit SU2, the word line WL2, the word line WL1, and the word line WL4 are sequentially selected, and the data in the middle page, the data in the upper page, and the data in the lower page are written, the word line WL1, and the word line WL4, respectively. Similarly, in association with the 32nd to 34th writes, in the string unit SU1, the word line WL3, the word line WL2, and the word line WL5 are sequentially selected, and the data in the middle page, the data in the upper page, and the data in the lower page are written, the word line WL2, and the word line WL5, respectively. In association with the 35th to 37th writes, in the string unit SU0, the word line WL4, the word line WL3, and the word line WL6 are sequentially selected, and the data in the middle page, the data in the upper page, and the data in the lower page are written, the word line WL3, and the word line WL6, respectively.

(b) Steady Processing Pattern

The steady processing pattern is a main write pattern repeated according to the total number N of the word lines WL from the end of the start-point processing pattern until the uppermost word line WL(N−1) in the string unit SU0 (in the present example, the word line WL8) is selected, with the data in the page written. In the present example, the 38th to 61st writes correspond to the steady processing pattern.

Then, in association with the 38th to 40th writes, in the string unit SU3, the word line WL2, the word line WL1, and the word line WL4 are sequentially selected, and the data in the middle page, the data in the upper page, and the data in the lower page are written, the word line WL1, and the word line WL4, respectively. Similarly, in association with the 41st to 43rd writes, in the string unit SU2, the word line WL3, the word line WL2, and the word line WL5 are sequentially selected, and the data in the middle page, the data in the upper page, and the data in the lower page are written, the word line WL2, and the word line WL5, respectively. Moreover, in association with the 44th to 46th writes, in the string unit SU1, the word line WL4, the word line WL3, and the word line WL6 are sequentially selected, and the data in the middle page, the data in the upper page, and the data in the lower page are written, the word line WL3, and the word line WL6, respectively. Furthermore, in association with the 47th to 49th writes, in the string unit SU0, the word line WL5, the word line WL4, and the word line WL7 are sequentially selected, and the data in the middle page, the data in the upper page, and the data in the lower page are written, the word line WL4, and the word line WL7, respectively. That is, when write of the data in the middle page is focused on, in the string units SU3, SU2, SU1, and SU0 in this order, the word line WL is sequentially selected in an order of WL1, WL2, WL3, and WL4. When write of the data in the upper page is focused on, in the string units SU3, SU2, SU1, and SU0 in this order, the word line WL is sequentially selected in an order of WL2, WL3, WL4, and WL5. When write of the data in the lower page is focused on, in the string units SU3, SU2, SU1, and SU0 in this order, the word line WL is sequentially selected in an order of WL4, WL5, WL6, and WL7.

A similar pattern is subsequently repeated to execute the 50th to 61st writes. However, since the memory cell group MCG corresponding to the word line WL(N−1) corresponds to write of 1 page, the data is written as the data in the page instead of the data in the lower page.

When the writing order of the data in the lower pages is denoted by z_low, the writing order of the data in the middle pages is denoted by z_mid, and the writing order of the data in the upper pages is denoted by z_up, general expressions for z_low, z_mid, and z_up in the steady processing pattern are as follows.

$$z\_low = 3Kx + 3(K-1)y - (3/2)K^2 - (5/2)K - 1 \quad \text{Lower page;}$$

$$z\_mid = 3Kx + 3(K-1)y - (3/2)K^2 + (7/2)K - 3 \quad \text{Middle page;}$$

$$z\_up = 3Kx + 3(K-1)y - (3/2)K^2 + (13/2)K - 2 \quad \text{Upper page;}$$

When the memory cell group MCG corresponds to write of 1 page, the general expression for the lower page can be applied.

(c) End-Point Processing Pattern

Now, the end-point processing pattern in the present example will be described. In the present example, the 62nd to 91st writes corresponding to the end-point processing pattern will be described as the (J−29)th to Jth writes.

As depicted in a right table in FIG. 26, in association with the (J−29)th to (J−27)th writes, in the string unit SU3, the word line WL(N−5), the word line WL(N−6), and the word line WL(N−3) are sequentially selected, and the data in the middle page, the data in the upper page, and the data in the lower page are written, the word line WL(N−6), and the word line WL(N−3), respectively. Similarly, in association with the (J−26)th to (J−24)th writes, in the string unit SU2, the word line WL(N−4), the word line WL(N−5), and the word line WL(N−2) are sequentially selected, and the data in the middle page, the data in the upper page, and the data in the lower page are written, the word line WL(N−5), and the word line WL(N−2), respectively. In association with the (J−23)th to (J−21)th writes, in the string unit SU1, the word line WL(N−3), the word line WL(N−4), and the word line WL(N−1) are sequentially selected, and the data in the middle page, the data in the upper page, and the data in the page are written, the word line WL(N−4), and the word line WL(N−1), respectively. In association with the (J−20)th and (J−19)th writes, in the string unit SU0, the word line WL(N−2) is selected, with the data in the middle page written, and then, the word line WL(N−3) is selected, with the data in the upper page written.

In association with the (J−18)th to (J−16)th writes, in the string unit SU3, the word line WL(N−4), the word line WL(N−5), and the word line WL(N−2) are sequentially selected, and the data in the middle page, the data in the upper page, and the data in the lower page are written, the word line WL(N−5), and the word line WL(N−2), respectively. In association with the (J−15)th to (J−13)th writes, in the string unit SU2, the word line WL(N−3), the word line WL(N−4), and the word line WL(N−1) are sequentially selected, and the data in the middle page, the data in the upper page, and the data in the page are written, the word line WL(N−4), and the word line WL(N−1), respectively. In association with the (J−12)th and (J−11)th writes, in the string unit SU1, the word line WL(N−2) is selected, with the data in the middle page written, and then, the word line WL(N−3) is selected, with the data in the upper page written.

Then, in association with the (J−10)th to (J−8)th writes, in the string unit SU3, the word line WL(N−3), the word line WL(N−4), and the word line WL(N−1) are sequentially selected, and the data in the middle page, the data in the upper page, and the data in the page are written, the word line WL(N−4), and the word line WL(N−1), respectively. In association with the (J−7)th and (J−6)th writes, in the string unit SU2, the word line WL(N−2) is selected, with the data in the middle page written, and then, the word line WL(N−3) is selected, with the data in the upper page written.

In association with the (J−5)th and (J−4)th writes, in the string unit SU3, the word line WL(N−2) is selected, with the data in the middle page written, and then, the word line WL(N−3) is selected, with the data in the upper page written.

In association with the (J−3)th to Jth writes, the word line WL(N−2) is selected in the string units SU1 to SU3, and in each of the string units, the data in the upper page is written.

8.1.2 Second Example

Figure 27:
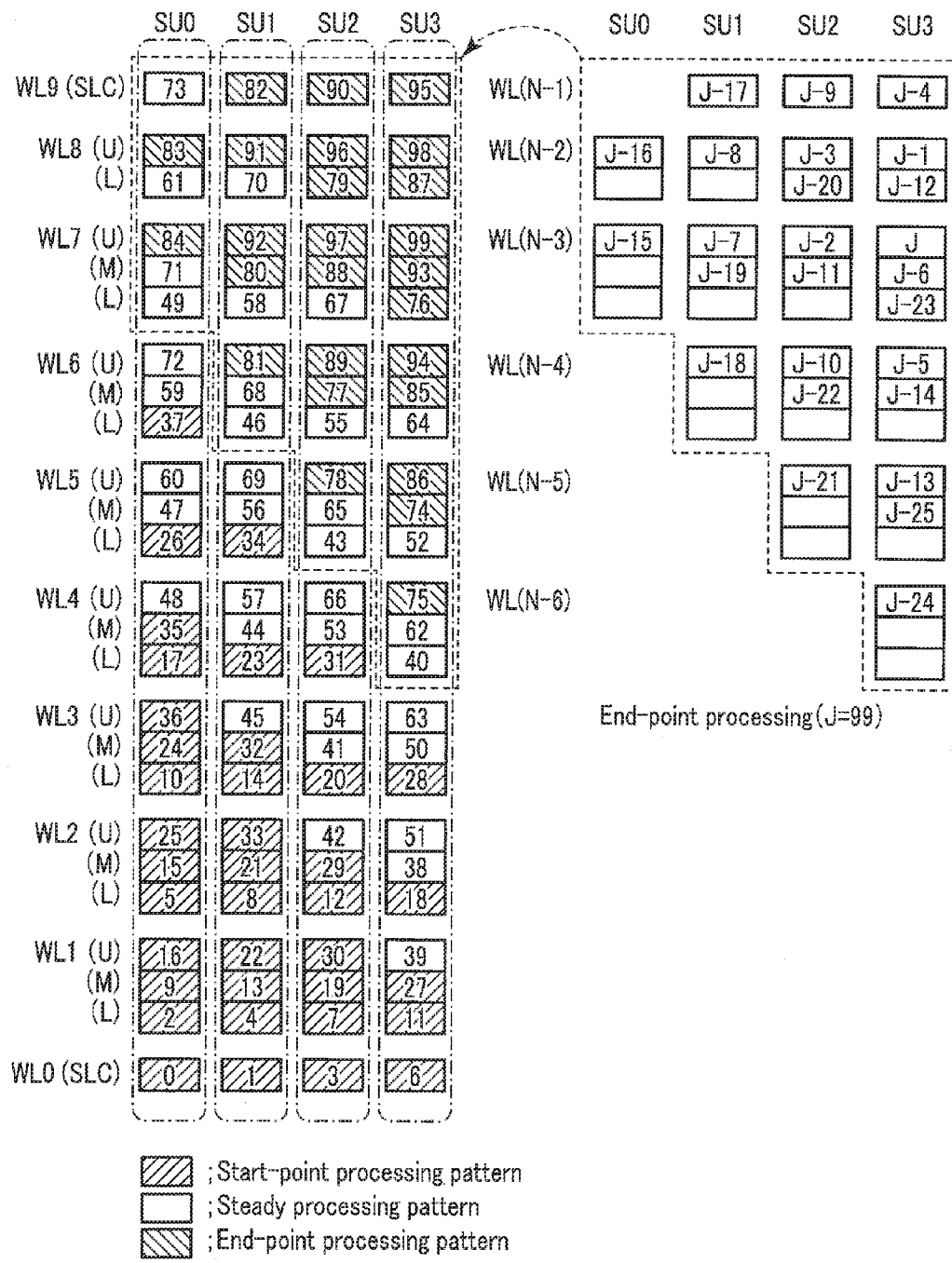
FIG. 27 is a diagram illustrating the writing order in a semiconductor memory device according to a second example in the eighth embodiment.

In a second example, a case will be described where the memory cell groups MCG corresponding to the uppermost word line WL(N−1) and the lowermost word line WL0 correspond to page-by-page write of 1 page, where the memory cell group MCG corresponding to the word line WL(N−2) corresponds to page-by-page write of 2 pages, and where the memory cell groups MCG corresponding to the other word lines WL correspond to page-by-page write of 3 pages. FIG. 27 schematically illustrates the writing order according to the present example. An example in FIG. 27 illustrates a case where the total number N of the word lines WL is 10 and where seven word lines WL correspond to write of 3 bits. In this case, the total number (J+1) of pages is 12N−20=100. The final number J of the writing order is 99. That is, the example in FIG. 27 illustrates that a total of 100 pages are present including pages (SLC) in the memory cell groups MCG corresponding to write of 1 page, lower pages (L) and upper pages (U) in the memory cell groups MCG corresponding to write of 2 pages, and lower pages (L), middle pages (M), and upper pages (U) in the memory cell groups MCG corresponding to write of 3 bits (pages).

(a) Start-Point Processing Pattern

The start-point processing pattern in the present example includes selection of the lowermost word line WL0 and corresponds to the zeroth to 37th writes. The start-point processing pattern is the same as the start-point processing pattern in the first example in the present embodiment.

(b) Steady Processing Pattern

The steady processing pattern is a main write pattern repeated according to the total number N of the word lines WL from the end of the start-point processing pattern until the uppermost word line WL(N−1) in the string unit SU0 (in the present example, the word line WL9) is selected, with the data in the page written. In the present example, the 38th to 73th writes correspond to the steady processing pattern.

First, the 38th to 49th writes are executed as is the case with the first example in the present embodiment.

A similar pattern is subsequently repeated to execute the 50th to 73rd writes. However, since the memory cell group MCG corresponding to the word line WL(N−1) corresponds to write of 1 page, the data is written as the data in the page instead of the data in the lower page.

General expressions for z_low, z_mid, and z_up for the steady processing pattern are the same as the general expressions in the first example in the present embodiment.

(c) End-Point Processing Pattern

Now, the end-point processing pattern in the present example will be described. In the present example, the 74th to 99th writes corresponding to the end-point processing pattern will be described as the (J−25)th to Jth writes.

As illustrated in a right table in FIG. 27, the (J−25)th to Jth writes are executed as in the case of the order of the (J−29)th to (J−4)th writes in the first example in the present embodiment. However, in the first example in the present embodiment, the memory cell group MCG corresponding to the word line WL(N−2) corresponds to write of 3 pages, whereas, in the present example, the memory cell group MCG corresponding to the word line WL(N−2) corresponds to write of 2 pages. In such a case, in the present example, the data in the upper page is written to the corresponding memory cell group MCG during write of the data in the middle page in the first example in the present embodiment.

8.1.3 Third Example

Figure 28:
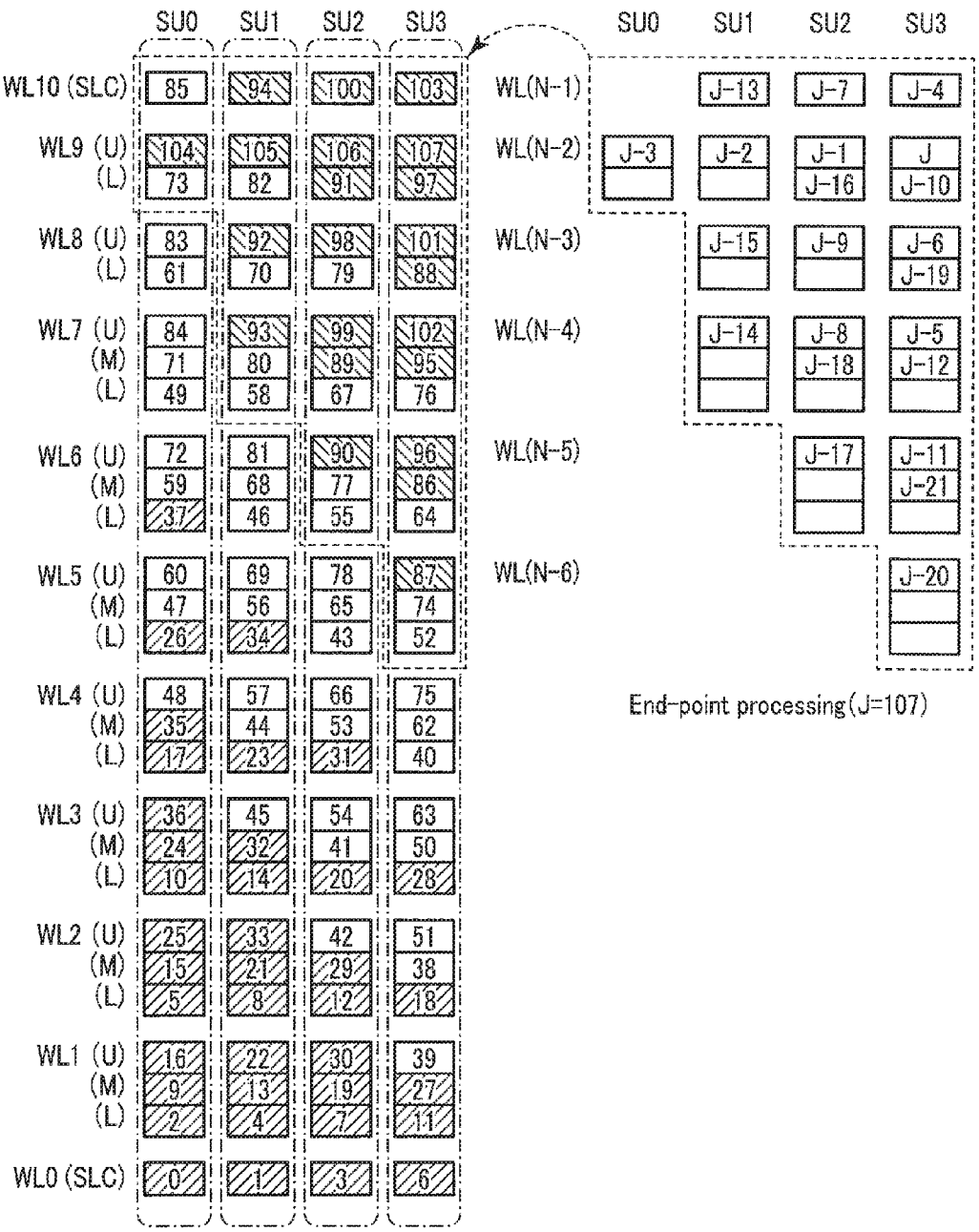
FIG. 28 is a diagram illustrating the writing order in a semiconductor memory device according to a third example in the eighth embodiment.

In a third example, a case will be described where the memory cell groups MCG corresponding to the word line WL(N−1) and the word line WL0 correspond to page-by-page write of 1 page, where the memory cell groups MCG corresponding to the word lines WL(N−2) and WL(N−3) correspond to page-by-page write of 2 pages, and where the memory cell groups MCG corresponding to the other word lines WL correspond to page-by-page write of 3 pages. FIG. 28 schematically illustrates the writing order according to the present example. An example in FIG. 28 illustrates a case where the total number N of the word lines WL is 11 and where seven word lines WL correspond to write of 3 bits. In this case, the total number (J+1) of pages is 12N−24=108. The final number J of the writing order is 107. That is, the example in FIG. 28 illustrates that a total of 108 pages are present including pages (SLC) in the memory cell groups MCG corresponding to write of 1 page, lower pages (L) and upper pages (U) in the memory cell groups MCG corresponding to write of 2 pages, and lower pages (L), middle pages (M), and upper pages (U) in the memory cell groups MCG corresponding to write of 3 bits (pages).

(a) Start-Point Processing Pattern

The start-point processing pattern in the present example includes selection of the lowermost word line WL0 and corresponds to the zeroth to 37th writes. The start-point processing pattern is the same as the start-point processing pattern in the first example and the second example in the present embodiment.

(b) Steady Processing Pattern

The steady processing pattern is a main write pattern repeated according to the total number N of the word lines WL from the end of the start-point processing pattern until the uppermost word line WL(N−1) in the string unit SU0 (in the present example, the word line WL10) is selected, with the data in the page written. In the present example, the 38th to 85th writes correspond to the steady processing pattern.

First, the 38th to 49th writes are executed as is the case with the first example in the present embodiment.

A similar pattern is subsequently repeated to execute the 50th to 85th writes. However, since the memory cell group MCG corresponding to the word line WL(N−1) corresponds to write of 1 page, the data is written as the data in the page instead of the data in the lower page.

General expressions for z_low, z_mid, and z_up for the steady processing pattern are the same as the general expressions in the first example in the present embodiment.

(c) End-Point Processing Pattern

Now, the end-point processing pattern in the present example will be described. In the present example, the 86th to 107th writes corresponding to the end-point processing pattern will be described as the (J−21)th to Jth writes.

As illustrated in a right table in FIG. 28, the (J−21)th to (J−13)th writes are executed as in the case of the order of the (J−29)th to (J−21)th writes in the first example in the present embodiment. However, in the first example in the present embodiment, the memory cell group MCG corresponding to the word line WL(N−3) corresponds to write of 3 pages, whereas, in the present example, the memory cell group MCG corresponding to the word line WL(N−3) corresponds to write of 2 pages. In such a case, in the present example, the data in the upper page is written to the corresponding memory cell group MCG during write of the data in the middle page in the first example in the present embodiment.

Then, in association with the (J−12)th to (J−10)th writes, in the string unit SU3, the word line WL(N−4), the word line WL(N−5), and the word line WL(N−2) are sequentially selected, and the data in the middle page, the data in the upper page, and the data in the lower page are written, the word line WL(N−5), and the word line WL(N−2), respectively. In association with the (J−9)th to (J−7)th writes, in the string unit SU2, the word line WL(N−3), the word line WL(N−4), and the word line WL(N−1) are sequentially selected, and the data in the upper page, the data in the upper page, and the data in the page are written, the word line WL(N−4), and the word line WL(N−1), respectively.

Then, in association with the (J−6)th and (J−5)th writes, in the string unit SU3, the word line WL(N−3) is selected, with the data in the upper page written, and then, the word line WL(N−4) is selected, with the data in the upper page written.

In association with the (J−3)th to Jth writes, the word line WL(N−2) is selected in the string units SU1 to SU3, and in each of the string units, the data in the upper page is written.

8.2 Effects of the Present Embodiment

The configuration according to the present embodiment can produce effects similar to the effects of the third embodiment when 3 bits (3 pages) of data are written to the memory cell transistors MT (memory cell group MCG) on a page-by-page basis.

9. Ninth Embodiment

Now, a semiconductor memory device and a memory system according to a ninth embodiment will be described. In the ninth embodiment, the memory cell transistor MT corresponds to data of 3 bits, and the writing order described in the fourth embodiment is applied when 3 pages of data are written to the memory cell group MCG on a page-by-page basis. Only differences from the first to eighth embodiments will be described below.

9.1 Writing Order in the Block BLK

For the writing order in the present embodiment, three examples will be described according to the configuration of pages in the memory cell group MCG in the string unit SU.

9.1.1 First Example

Figure 29:
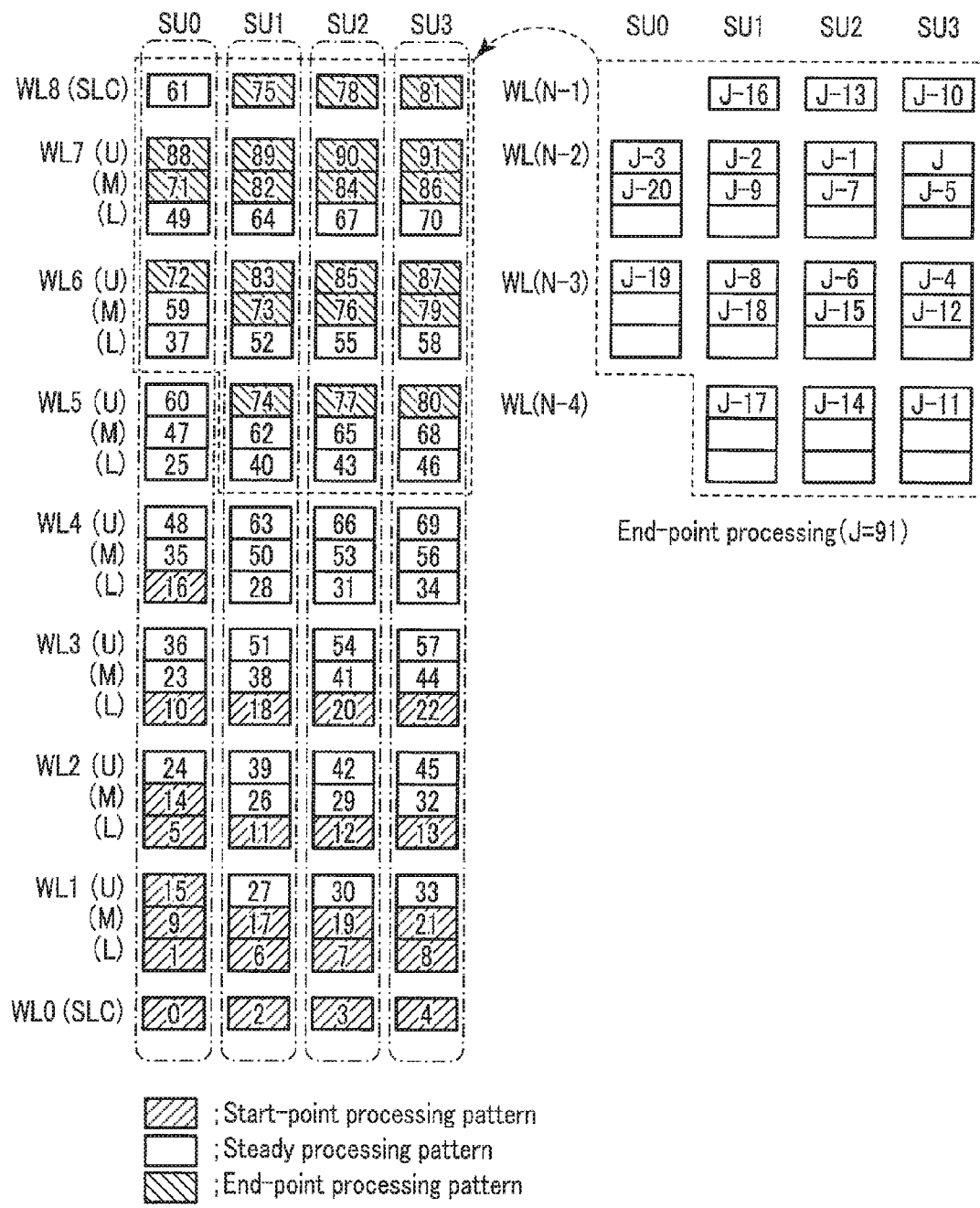
FIG. 29 is a diagram illustrating the writing order in a semiconductor memory device according to a first example in a ninth embodiment.

In a first example, a case will be described where the memory cell groups MCG corresponding to the word line WL(N−1) and the word line WL0 correspond to page-by-page write of 1 page and where the memory cell groups MCG corresponding to the other word lines WL correspond to page-by-page write of 3 pages as is the case with the first example in the eighth embodiment. FIG. 29 schematically illustrates the writing order according to the present example. An example in FIG. 29 illustrates a case where the total number N of the word lines WL is nine and where seven word lines WL correspond to write of 3 bits. In this case, the total number (J+1) of pages is 12N−16=92. The final number J of the writing order is 91. That is, the example in FIG. 29 illustrates that a total of 92 pages are present including pages (SLC) in the memory cell groups MCG corresponding to write of 1 page and lower pages (L), middle pages (M), and upper pages (U) in the memory cell groups MCG corresponding to write of 3 pages.

(a) Start-Point Processing Pattern

The start-point processing pattern in the present example includes selection of the lowermost word line WL0 and corresponds to the zeroth to 22th writes.

As a left table in FIG. 29, in association with the zeroth and first writes, in the string unit SU0, the word line WL0 is selected, with the data in the page written, and then, the word line WL1, which is the first word line WL above the word line WL0 is selected, with the data in the lower page written. Subsequently, in association with the second to fourth writes, the word line WL0 is selected in the string units SU1 to SU3, and in each of the string units, the data in the page is written.

Then, in association with the fifth write, the word line WL2 in the string unit SU0 is selected, and the data in the lower page is written. In association with the sixth to eighth writes, the word line WL1 is selected in the string units SU1 to SU3, and in each of the string units, the data in the lower page is written.

In association with the ninth and 10th writes, in the string unit SU0, the word line WL1 is selected, with the data in the middle page written, and then, the word line WL3, which is the second word line WL above the word line WL1, is selected, with the data in the lower page written. In association with the 11th to 13th writes, the word line WL2 is selected in the string units SU1 to SU3, and in each of the string units, the data in the lower page is written.

Then, in association with the 14th to 16th writes, in the string unit SU0, the word line WL2, the word line WL1, and the word line WL4 are sequentially selected, and the data in the middle page, the data in the upper page, and the data in the lower page are written, the word line WL1, and the word line WL4, respectively. In association with the 17th and 22nd writes, in each of the string units SU1 to SU3, the word line WL1 is selected, with the data in the middle page written, and then, the word line WL3 is selected, with the data in the lower page written.

(b) Steady Processing Pattern

The steady processing pattern is a main write pattern repeated according to the total number N of the word lines WL from the end of the start-point processing pattern until the word line WL(N−2) (in the present example, the word line WL7) in the string unit SU3 is selected, with the data in the lower page written. In the present example, the 23rd to 70th writes correspond to the steady processing pattern.

In association with the 23rd to 25th writes, in the string unit SU0, the word line WL3, the word line WL2, and the word line WL5 are sequentially selected, and the data in the middle page, the data in the upper page, and the data in the lower page are written, the word line WL2, and the word line WL5, respectively. In association with the 26th to 34th writes, in each of the string units SU1 to SU3, the word line WL2, the word line WL1, and the word line WL4 are sequentially selected, and the data in the middle page, the data in the upper page, and the data in the lower page are written, the word line WL1, and the word line WL4, respectively. That is, in write of the data in the lower page, the data in the middle page, and the data in the upper page, only in the string unit SU0, the word line WL immediately above the word line selected in the other string units SU1 to SU3 is selected.

A similar pattern is subsequently repeated to execute the 35th to 70th writes. However, since the memory cell group MCG corresponding to the word line WL(N−1) corresponds to write of 1 page, the data is written as the data in the page instead of the data in the lower page.

The writing order of the data in the lower pages in the string unit SU0 is denoted by "z_low(y=0)", and the writing order of the data in the lower pages in the string units SU1 to SU3 is denoted by "z_low(y>1)". Similarly, the writing order of the data in the middle pages in the string unit SU0 is denoted by "z_mid(y=0)", and the writing order of the data in the middle pages in the string units SU1 to SU3 is denoted by "z_mid(y>1)". The writing order of the data in the upper pages in the string unit SU0 is denoted by "z_up(y=0)", and the writing order of the data in the upper pages in the string units SU1 to SU3 is denoted by "z_up(y>1)". General expressions for "z_low(y=0)", "z_low(y>1)", "z_mid(y=0)", "z_mid(y>1)", "z_up(y=0)", and "z_up(y>1)" are as follows when K=4 (the number of string units per block BLK is four).

"z_low(y=0)"=12x−35    Lower page;

"z_low(y>1)"=12x+3y−23    Lower page;

"z_mid(y=0)"=12x−13    Middle page;

"z_mid(y>1)"=12x+3y−1    Middle page;

"z_up(y=0)"=12x    Upper page;

"z_up(y>1)"=12x+3y+12    Upper page;

When the memory cell group MCG corresponds to write of 1 page, the general expression for the lower page can be applied.

(c) End-Point Processing Pattern

Now, the end-point processing pattern in the present example will be described. In the present example, the 71st to 91st writes corresponding to the end-point processing pattern will be described as the (J−20)th to Jth writes.

As a left table in FIG. 29, in association with the (J−20)th and (J−19)th writes, in the string unit SU0, the word line WL(N−2) is selected, with the data in the middle page written, and then, the word line WL(N−3) is selected, with the data in the upper page written. In association with the (J−18)th to (J−10)th writes, in the string units SU0 to SU3, the word line WL(N−3), the word line WL(N−4), and the word line WL(N−1) are sequentially selected, and the data in the middle page, the data in the upper page, and the data in the page are written, the word line WL(N−4), and the word line WL(N−1), respectively.

Then, in association with the (J−9)th to (J−4)th writes, in each of the string units SU1 to SU3, the word line WL(N−2) is selected, with the data in the middle page written, and then, the word line WL(N−3) is selected, with the data in the upper page written.

In association with the (J−3)th to Jth writes, the word line WL(N−2) is selected in the string units SU0 to SU3, and in each of the string units, the data in the upper page is written.

9.1.2 Second Example

Figure 30:
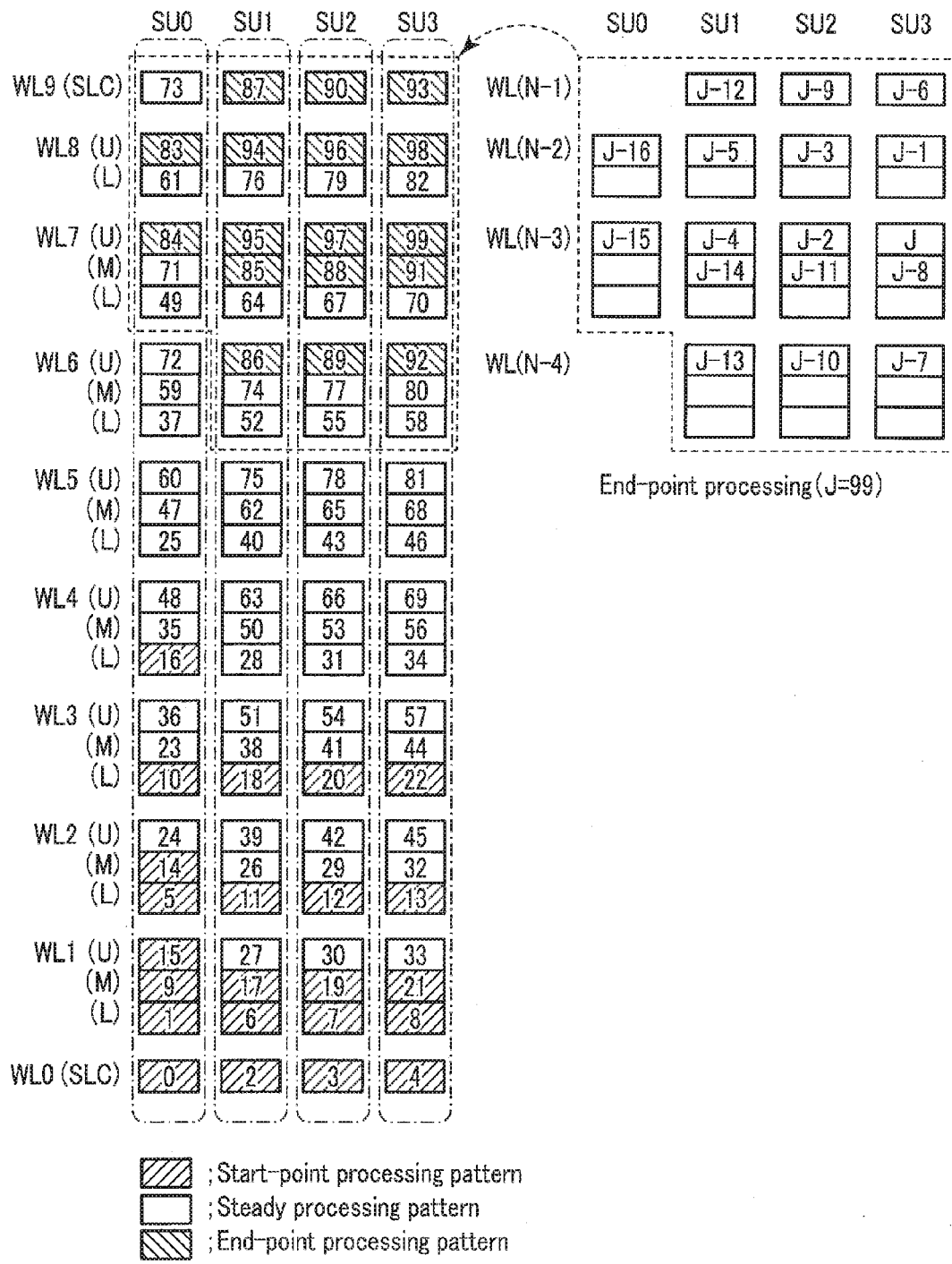
FIG. 30 is a diagram illustrating the writing order in a semiconductor memory device according to a second example in the ninth embodiment.

In a second example, a case will be described where the memory cell groups MCG corresponding to the word line WL(N−1) and the word line WL0 correspond to page-by-page write of 1 page, where the memory cell group MCG corresponding to the word line WL(N−2) corresponds to page-by-page write of 2 page, and where the memory cell groups MCG corresponding to the other word lines WL correspond to page-by-page write of 3 pages, as is the case with the second example in the eighth embodiment. FIG. 30 schematically illustrates the writing order according to the present example. An example in FIG. 30 illustrates a case where the total number N of the word lines WL is 10 and where seven word lines WL correspond to write of 3 bits. In this case, the total number (J+1) of pages is 12N−20=100. The final number J of the writing order is 99. That is, the example in FIG. 30 illustrates that a total of 100 pages are present including pages (SLC) in the memory cell groups MCG corresponding to write of 1 page, lower pages (L) and upper pages (U) in the memory cell groups MCG corresponding to write of 2 pages, and lower pages (L), middle pages (M), and upper pages (U) in the memory cell groups MCG corresponding to write of 3 bits (pages).

(a) Start-Point Processing Pattern

The start-point processing pattern in the present example includes selection of the lowermost word line WL0 and corresponds to the zeroth to 22nd writes. The start-point processing pattern is the same as the start-point processing pattern in the first example in the present embodiment.

(b) Steady Processing Pattern

The steady processing pattern is a main write pattern repeated according to the total number N of the word lines WL from the end of the start-point processing pattern until the word line WL(N−2) (in the present example, the word line WL8) in the string unit SU3 is selected, with the data in the lower page written. In the present example, the 23rd to the 82nd writes correspond to the steady processing pattern.

First, the 23rd to 34th writes are executed as is the case with the first example in the present embodiment.

A similar pattern is subsequently repeated to execute the 35th to 82nd writes. However, since the memory cell group MCG corresponding to the word line WL(N−1) corresponds to write of 1 page, the data is written as the data in the page instead of the data in the lower page.

General expressions for "z_low(y=0)", "z_low(y>1)", "z_mid(y=0)", "z_mid(y>1)", "z_up(y=0)", and "z_up(y>1)" for the steady processing pattern are the same as the general expressions in the first example in the present embodiment.

(c) End-Point Processing Pattern

Now, the end-point processing pattern in the present example will be described. In the present example, the 83rd to 99th writes corresponding to the end-point processing pattern will be described as the (J−16)th to Jth writes.

As illustrated in a right table in FIG. 30, the (J−16)th to (J−6)th writes are executed as in the case of the order of the (J−20)th to (J−10)th writes in the first example in the present embodiment. However, in the first example in the present embodiment, the memory cell group MCG corresponding to the word line WL(N−2) corresponds to write of 3 pages, whereas, in the present example, the memory cell group MCG corresponding to the word line WL(N−2) corresponds to write of 2 pages. In such a case, in the present example, the data in the upper page is written to the corresponding memory cell group MCG during write of the data in the middle page in the first example in the present embodiment.

Then, in association with the (J−5)th and Jth writes, in each of the string units SU1 to SU3, the word line WL(N−2) is selected, with the data in the upper page written, and then, the word line WL(N−3) is selected, with the data in the upper page written.

9.1.3 Third Example

Figure 31:
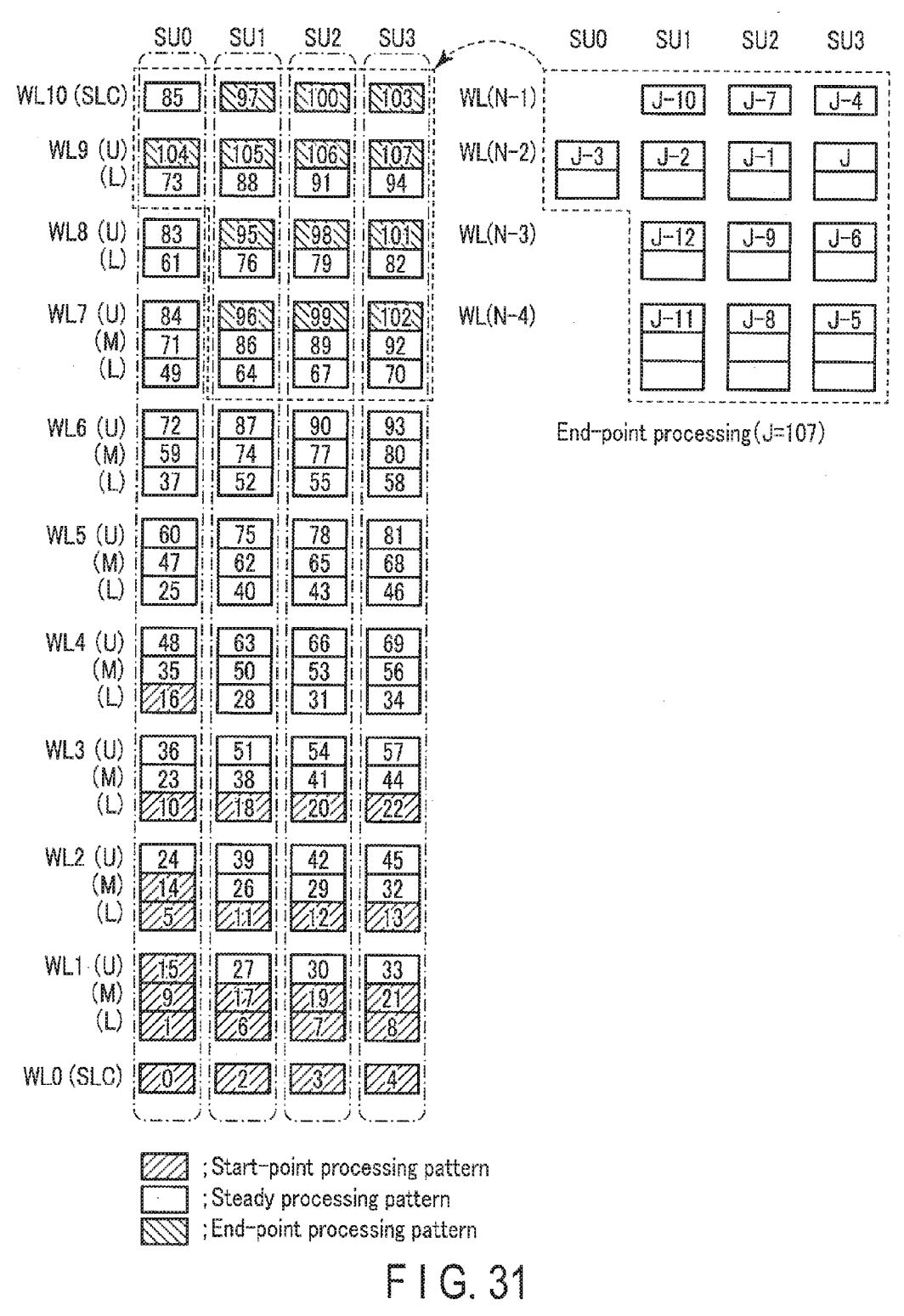

In a third example, a case will be described where the memory cell groups MCG corresponding to the word line WL(N−1) and the word line WL0 correspond to page-by-page write of 1 page, where the memory cell groups MCG corresponding to the word lines WL(N−2) and WL(N−3) correspond to page-by-page write of 2 page, and where the memory cell groups MCG corresponding to the other word lines WL correspond to page-by-page write of 3 pages, as is the case with the third example in the eighth embodiment. FIG. 31 schematically illustrates the writing order according to the present example. An example in FIG. 31 illustrates a case where the total number N of the word lines WL is 11 and where seven word lines WL correspond to write of 3 bits. In this case, the total number (J+1) of pages is 12N−24=108. The final number J of the writing order is 107. That is, the example in FIG. 31 illustrates that a total of 108 pages are present including pages (SLC) in the memory cell groups MCG corresponding to write of 1 page, lower pages (L) and upper pages (U) in the memory cell groups MCG corresponding to write of 2 pages, and lower pages (L), middle pages (M), and upper pages (U) in the memory cell groups MCG corresponding to write of 3 bits (pages).

(a) Start-Point Processing Pattern

The start-point processing pattern in the present example includes selection of the lowermost word line WL0 and corresponds to the zeroth to 22nd writes. The start-point processing pattern is the same as the start-point processing pattern in the first example and the second example in the present embodiment.

(b) Steady Processing Pattern

The steady processing pattern is a main write pattern repeated according to the total number N of the word lines WL from the end of the start-point processing pattern until the word line WL(N−2) (in the present example, the word line WL9) in the string unit SU3 is selected, with the data in the lower page written. In the present example, the 23rd to 94th writes correspond to the steady processing pattern.

First, the 23rd to 34th writes are executed as is the case with the first example in the present embodiment.

A similar pattern is subsequently repeated to execute the 35th to 94th writes. However, since the memory cell group MCG corresponding to the word line WL(N−1) corresponds to write of 1 page, the data is written as the data in the page instead of the data in the lower page.

General expressions for "z_low(y=0)", "z_low(y>1)", "z_mid(y=0)", "z_mid(y>1)", "z_up(y=0)", and "z_up(y>1)" for the steady processing pattern are the same as the general expressions in the first example and the second example in the present embodiment.

(c) End-Point Processing Pattern

Now, the end-point processing pattern in the present example will be described. In the present example, the 95th to 107th writes corresponding to the end-point processing pattern will be described as the (J−12)th to Jth writes.

As illustrated in a right table in FIG. 31, the (J−12)th to (J−4)th writes are executed as in the case of the order of the (J−18)th to (J−10)th writes in the first example in the present embodiment. However, in the first example in the present embodiment, the memory cell group MCG corresponding to the word line WL(N−3) corresponds to write of 3 pages, whereas, in the present example, the memory cell group MCG corresponding to the word line WL(N−3) corresponds to write of 2 pages. In such a case, in the present example, the data in the upper page is written to the corresponding memory cell group MCG in the write operation of the data in the middle page in the first example in the present embodiment.

In association with the (J−3)th to Jth writes, the word line WL(N−2) is selected in the string units SU1 to SU3, and in each of the string units, the data in the upper page is written.

9.2 Effects of the Present Embodiment

The configuration according to the present embodiment can produce effects similar to the effects of the fourth embodiment when 3 bits (3 pages) of data are written to the memory cell transistors MT (memory cell group MCG) on a page-by-page basis.

10. 10th Embodiment

Now, a semiconductor memory device and a memory system according to a 10th embodiment will be described. The 10th embodiment is different from the sixth and seventh embodiments in that the memory cell transistor MT corresponds to 2 bits of data and in the order in which 2 pages of data are written to the memory cell group MCG on a page-by-page basis. Only differences from the first to ninth embodiments will be described below.

10.1 Writing Order in the Block BLK

For the writing order in the present embodiment, three examples will be described according to the configuration of pages in the memory cell group MCG in the string unit SU.

10.1.1 First Example

In a first example, the memory cell groups MCG corresponding to all the word lines WL correspond to page-by-page write of 2 pages as is the case with the first examples in the sixth and seventh embodiments. FIG. 32 schematically illustrates the writing order according to the present example. In an example in FIG. 32, the total number N of the word lines WL is eight, the total number (J+1) of pages is 64, and the final number J of the writing order is 63. That is, the example in FIG. 32 illustrates that a total of 64 pages are present including lower pages (L) and upper pages (U).

In the writing order in the present embodiment, in the string units SU0 to SU3, the same word line WL is selected and data in the same page (lower page or upper page) is written. The writing order will be described with the order of selection of the word line WL taken into account. The present example also involves three patterns.

(a) Start-Point Processing Pattern

As depicted in a left table in FIG. 32, in association with the zeroth to third writes, the word line WL0 is selected in the string units SU0 to SU3, and in each of the string units, the data in the lower page is written.

(b) Steady Processing Pattern

The steady processing pattern is a main write pattern repeated according to the total number of the word lines WL from the end of the start-point processing pattern until the word line WL(N−2) (in the present example, the word line WL6) is selected in the string units SU0 to SU3, with the data in the upper page written in each of the string units SU0 to SU3. In the present example, the fourth to 59th writes correspond to the steady processing pattern.

First, in association with the fourth to seventh writes, the word line WL1 is selected in the string units SU0 to SU3, and in each of the string units, the data in the lower page is written. In association with the eighth to 11th writes, the word line WL0 is selected in the string units SU0 to SU3, and in each of the string units, the data in the upper page is written. That is, before a certain word line WL is selected and the data in the upper page is written through the certain word line WL, the first word line WL above the certain word line WL is selected and the data in the lower page is written through this word line WL.

A similar pattern is subsequently repeated to execute the 12th to 59th writes.

(c) End-Point Processing Pattern

Now, the end-point processing pattern in the present example will be described. In the present example, the 60th to 63rd writes corresponding to the end-point processing pattern will be described as the (J−3)th to Jth writes.

As depicted in a right table in FIG. 32, in association with the (J−3)th to Jth writes, the word line WL(N−1) is selected in the string units SU0 to SU3, and in each of the string units, the data in the upper page is written.

10.1.2 Second Example

Figure 33:
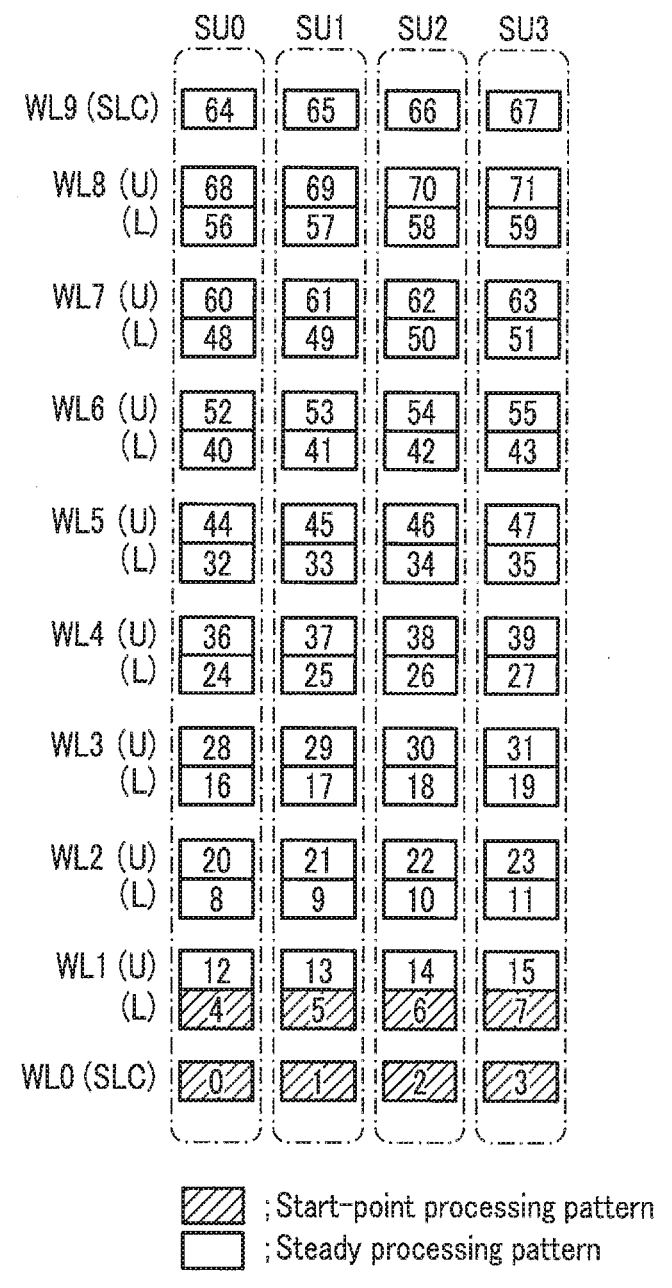

In a second example, a case will be described where the memory cell groups MCG corresponding to the uppermost word line WL(N−1) and the lowermost word line WL0 correspond to page-by-page write of 1 page and where the memory cell groups MCG corresponding to the other word lines WL correspond to page-by-page write of 2 pages, as is the case with the second examples in the sixth and seventh embodiments. FIG. 33 schematically illustrates the writing order according to the present example. In an example in FIG. 33, the total number N of the word lines WL is 10, the total number (J+1) of pages is 72, and the final number J of the writing order is 71. That is, the example in FIG. 33 illustrates that a total of 72 pages are present including pages (SLC) in the memory cell groups MCG corresponding to write of 1 page and lower pages (L) and upper pages (U) in the memory cell groups MCG corresponding to write of 2 pages. Only differences from the first example in the first embodiment will be described below. The present example involves no end-point processing pattern, and thus, uses two write patterns including the start-point processing pattern and the steady processing pattern.

(a) Start-Point Processing Pattern

As depicted in a left table in FIG. 33, in association with the zeroth to third writes, the word line WL0 is selected in the string units SU0 to SU3, and in each of the string units, the data in the page is written.

In association with the fourth to seventh writes, the word line WL1 is selected in the string units SU0 to SU3, and in each of the string units, the data in the lower page is written.

(b) Steady Processing Pattern

The steady processing pattern is a main write pattern repeated according to the total number N of the word lines WL from the end of the start-point processing pattern until the word line WL(N−1) (in the present example, the word line WL9) is selected in the string units SU0 to SU3, with the data in the page written in each of the string units SU0 to SU3. That is, the steady processing pattern is a main write pattern repeated until the final number J (in the present example, J=71) is selected. A basic pattern for the writing order is the same as the basic pattern in the first example in the present embodiment.

In association with the eighth to 11th writes, the word line WL2 is selected in the string units SU0 to SU3, and in each of the string units, the data in the lower page is written. In association with the 12th to 15th writes, the word line WL0 is selected in the string units SU0 to SU3, and in each of the string units, the data in the upper page is written.

A similar pattern is subsequently repeated to execute the 16th to 71st writes. However, since the memory cell group MCG corresponding to the word line WL(N−1) corresponds to write of 1 page, the data is written as the data in the page instead of the data in the lower page.

10.1.3 Third Example

Figure 34:
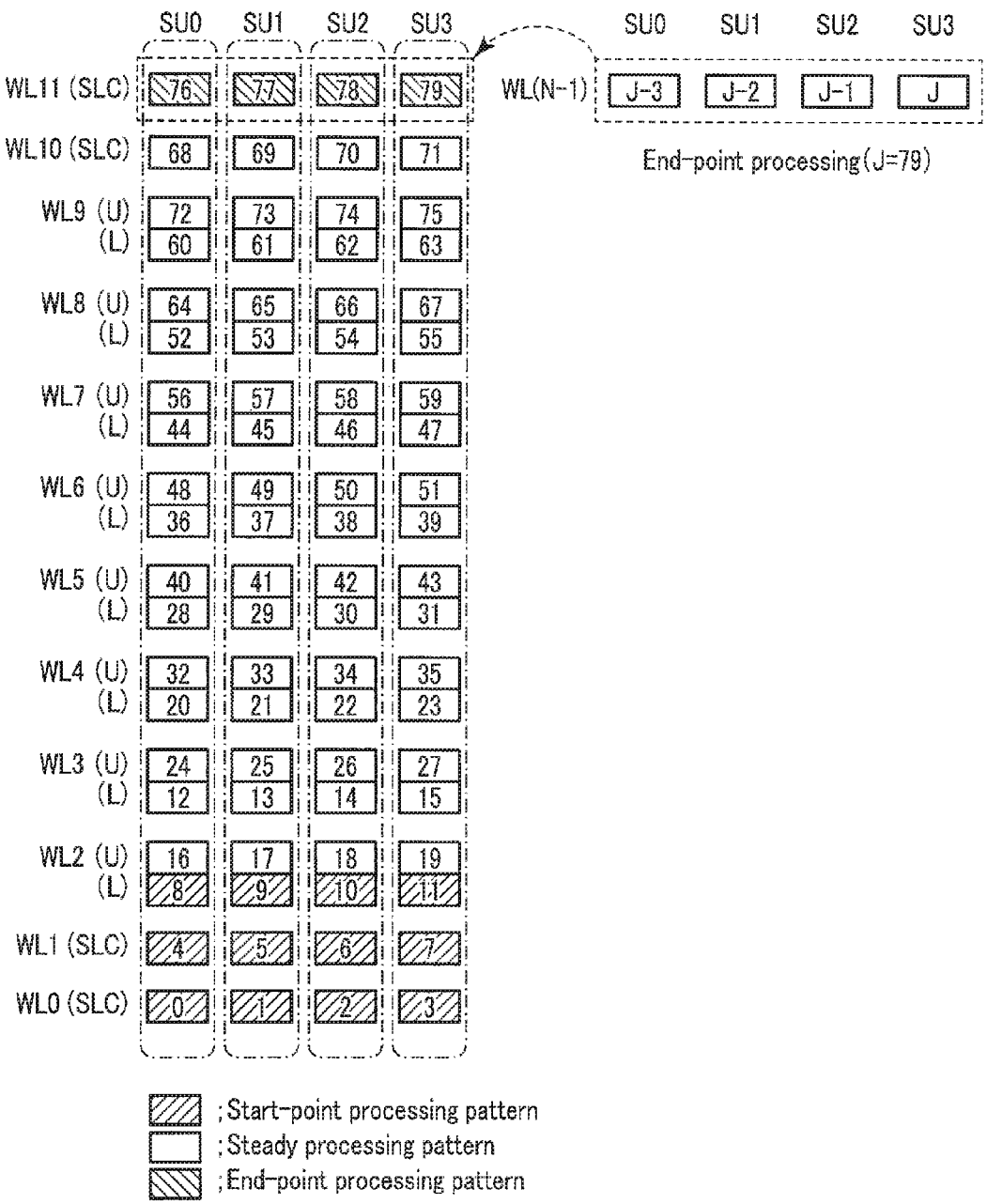
FIG. 34 is a diagram illustrating the writing order in a semiconductor memory device according to a third example in the 10th embodiment.

In a second example, a case will be described where the memory cell groups MCG corresponding to the word lines WL0, WL1, WL(N−2), and WL(N−1) correspond to page-by-page write of 1 page and where the memory cell groups MCG corresponding to the other word lines WL correspond to page-by-page write of 2 pages, as is the case with the third examples in the sixth and seventh embodiments. FIG. 34 schematically illustrates the writing order according to the present example. In an example in FIG. 34, the total number N of the word lines WL is 12, the total number (J+1) of pages is 80, and the final number J of the writing order is 79. That is, the example in FIG. 34 illustrates that a total of 80 pages are present including pages (SLC) in the memory cell groups MCG corresponding to write of 1 page and lower pages (L) and upper pages (U) in the memory cell groups MCG corresponding to write of 2 pages. Only differences from the first example and the second example in the present embodiment will be described.

(a) Start-Point Processing Pattern

As depicted in a left table in FIG. 34, in association with the zeroth to seventh writes, in the string units SU0 to SU3, the word line WL0 is selected, with the data in the page written, and then, the word line WL1 is selected, with the data in the page written.

In association with the eighth to 11th writes, the word line WL2 is selected in the string units SU0 to SU3, and in each of the string units, the data in the lower page is written WL2.

(b) Steady Processing Pattern

The steady processing pattern is a main write pattern repeated according to the total number N of the word lines WL from the end of the start-point processing pattern until the word line WL(N−2) (in the present example, the word line WL10) is selected in the string units SU0 to SU3, with the data in the page written in each of the string units SU0 to SU3. A basic pattern for the writing order is the same as the basic pattern in the first example and the second example in the present embodiment. In the present example, the 12th to 75th writes correspond to the steady processing pattern.

In association with the 12th to 15th writes, the word line WL3 is selected in the string units SU0 to SU3, and in each of the string units, the data in the lower page is written. In association with the 16th to 19th writes, the word line WL2 is selected in the string units SU0 to SU3, and in each of the string units, the data in the upper page is written WL2.

A similar pattern is subsequently repeated to execute the 20th to 75th writes. However, since the memory cell group MCG corresponding to the word line WL(N−2) corresponds to write of 1 page, the data is written as the data in the page instead of the data in the lower page.

(c) End-Point Processing Pattern

Now, the end-point processing pattern in the present example will be described. In the present example, the 76th to 79th writes corresponding to the end-point processing pattern will be described as the (J−3)th to Jth writes.

As depicted in a right table in FIG. 34, in association with the (J−3)th to Jth writes, the word line WL(N−1) is selected in the string units SU0 to SU3, and in each of the string units, the data in the page is written.

10.2 Effects of the Present Embodiment

The configuration according to the present embodiment enables a reduction in the number of pages lost as a result of WL leakage when 2 bits (2 pages) of data are written to the memory cell transistors MT (memory cell group MCG) on a page-by-page basis. This will be specifically described below.

In the configuration according to the present embodiment, before a certain word line WL is selected and the data in the upper page is written through the certain word line WL, the first word line WL above the certain word line WL is selected and the data in the lower page is written through this word line WL. Consequently, for example, if WL leakage occurs between a certain word line WL through which the data in the lower page is being written and the first word line WL below the certain word line WL, only the data in the lower page has been written to the memory cell group MCG corresponding to the first word line WL below the certain word line WL. Consequently, the amount of data lost can be limited to the lower page. Therefore, the number of pages from which data is lost can be reduced. Therefore, reliability of the memory system and the semiconductor memory device can be enhanced.

Moreover, since the number of pages from which data is lost can be reduced, the amount of data can be reduced which is held by the controller 200 for backup.

Moreover, the configuration according to the present embodiment enables a reduction in variation in threshold voltage caused by interference between the adjacent memory cell transistors MT in the NAND string 114. For example, after the data of the upper bit is written to the memory cell transistor MT1, the data of the lower bit is written to the adjacent memory cell transistor MT2. Then, disadvantageously, the write may raise the threshold voltage for the memory cell transistor MT1. As a result, the memory cell transistor MT1 may fail to read correct data. In contrast, the configuration according to the present embodiment writes the data in the lower page to the memory cell transistor MT2 with only the data in the lower page written to the memory cell transistor MT1. As a result, even with a rise in the threshold voltage for the memory cell transistor MT1, the adverse effect of the rise in threshold voltage can be reduced when the data of the upper bit is written to the memory cell transistor MT1. Even when the data of the upper bit is subsequently written to the memory cell transistor MT2, the adverse effect on the memory cell transistor MT1 is smaller than when the lower page and the upper page are consecutively written to the memory cell transistor MT2. Therefore, a variation in the threshold for the memory cell transistor MT1 can be reduced to suppress data misreading.

Therefore, reliability of the memory system and the semiconductor memory device can be enhanced.

11. 11th Embodiment

Now, a semiconductor memory device and a memory system according to an 11th embodiment will be described. In the 11th embodiment, the memory cell transistor MT corresponds to data of 3 bits, and the writing order described in the 10th embodiment is applied as the order in which 3 pages of data are written to the memory cell group MCG on a page-by-page basis. Only differences from the first to 10th embodiments will be described below.

11.1 Writing Order in the Block BLK

For the writing order in the present embodiment, three examples will be described according to the configuration of pages in the memory cell group MCG in the string unit SU.

11.1.1 First Example

Figure 35:
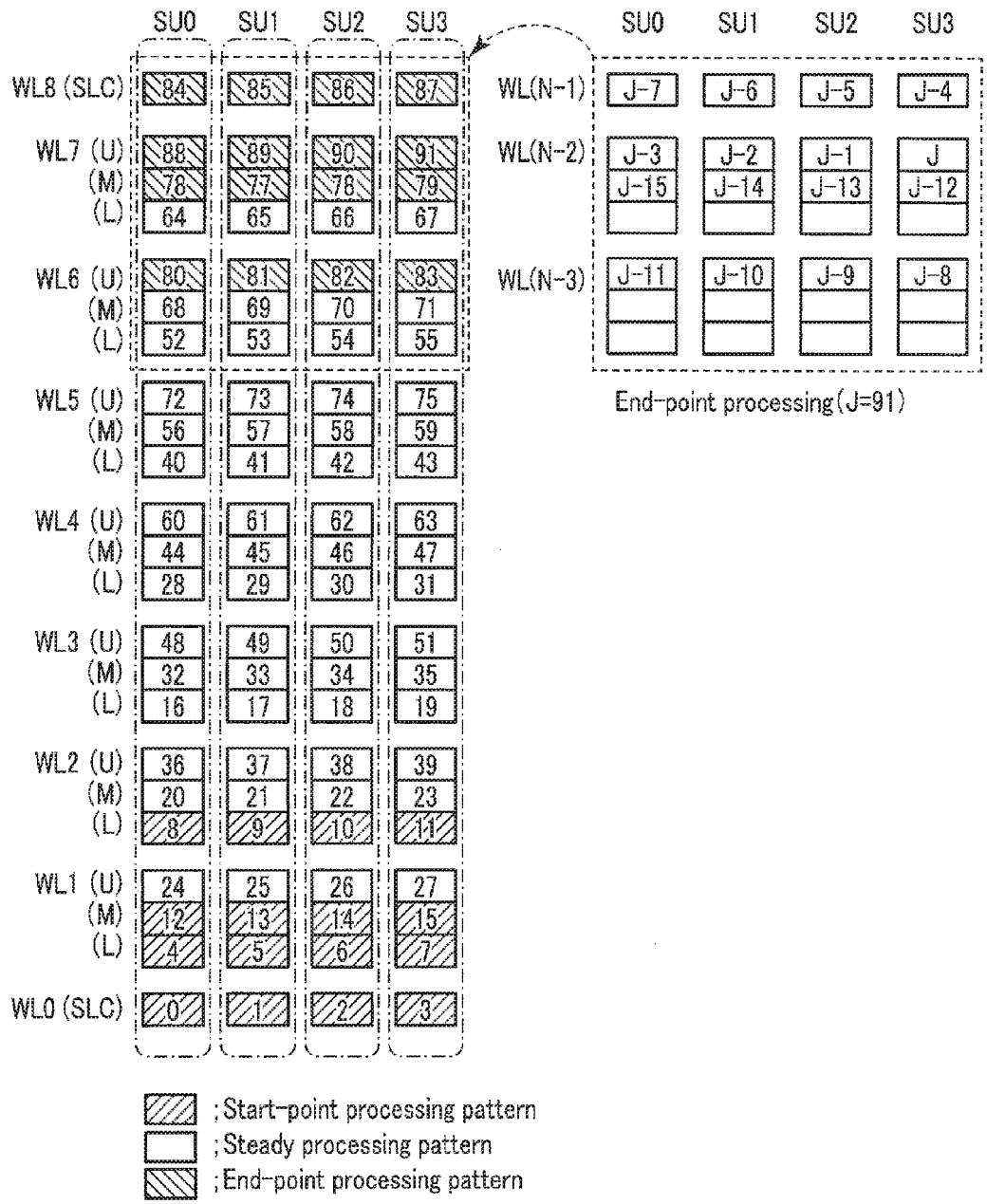
FIG. 35 is a diagram illustrating the writing order in a semiconductor memory device according to a first example in an 11th embodiment.

In a first example, a case will be described where the memory cell groups MCG corresponding to the uppermost word line WL(N−1) and the lowermost word line WL0 correspond to page-by-page write of 1 page and where the memory cell groups MCG corresponding to the other word lines WL correspond to page-by-page write of 3 pages, as is the case with the first examples in the eighth and ninth embodiments. FIG. 35 schematically illustrates the writing order according to the present example. An example in FIG. 35 illustrates a case where the total number N of the word lines WL is nine and where seven word lines WL correspond to write of 3 bits. In this case, the total number (J+1) of pages is 12N−16=92. The final number J of the writing order is 91. That is, the example in FIG. 35 illustrates that a total of 92 pages are present including pages (SLC) in the memory cell groups MCG corresponding to write of 1 page and lower pages (L), middle pages (M), and upper pages (U) in the memory cell groups MCG corresponding to write of 3 pages.

(a) Start-Point Processing Pattern

The start-point processing pattern in the present example includes selection of the lowermost word line WL0 and corresponds to the zeroth to 15th writes.

As depicted in a left table in FIG. 35, in association with the zeroth to third writes, the word line WL0 is selected in the string units SU0 to SU3, and in each of the string units, the data in the page is written.

Then, in association with the fourth to seventh writes, the word line WL1 is selected in the string units SU0 to SU3, and in each of the string units, the data in the lower page is written.

Then, in association with the eighth to 11th writes, the word line WL2 is selected in the string units SU0 to SU3, and in each of the string units, the data in the lower page is written2.

Then, in association with the 12th to 15th writes, the word line WL1 is selected in the string units SU0 to SU3, and in each of the string units, the data in the middle page is written.

(b) Steady Processing Pattern

The steady processing pattern is a main write pattern repeated according to the total number of the word lines WL from the end of the start-point processing pattern until the word line WL(N−4) (in the present example, the word line WL5) is selected in the string units SU0 to SU3, with the data in the upper page written in each of the string units SU0 to SU3. In the present example, the 16th to 75th writes correspond to the steady processing pattern.

First, in association with the 16th to 19th writes, the word line WL3 is selected in the string units SU0 to SU3, and in each of the string units, the data in the lower page is written. In association with the 20th to 23rd writes, the word line WL2 is selected in the string units SU0 to SU3, and in each of the string units, the data in the middle page is written. In association with the 24th to 27th writes, the word line WL1 is selected in the string units SU0 to SU3, and in each of the string units, the data in the upper page is written.

That is, after a certain word line WL (for example, the word line WL3) in each string unit SU is selected and the data in the lower page is written through the certain word line WL, the word line WL (for example, the word line WL2) below the certain word line WL in each string unit SU is selected and the data in the middle page is written through this word line WL. Subsequently, in each string unit SU, the second word line WL (for example, the word line WL1) below the certain word line WL is selected, and the data in the upper page is written through the newly selected word line WL.

A similar pattern is subsequently repeated to execute the 28th to 75th writes.

(c) End-Point Processing Pattern

Now, the end-point processing pattern in the present example will be described. In the present example, the 76th to 91st writes corresponding to the end-point processing pattern will be described as the (J−5)th to Jth writes.

As depicted in a right table in FIG. 35, in association with the (J−15)th to (J−12)th writes, the word line WL(N−2) is selected in the string units SU0 to SU3, and in each of the string units, the data in the medium page is written.

Then, in association with the (J−11)th to (J−8)th writes, the word line WL(N−3) is selected in the string units SU0 to SU3, and in each of the string units, the data in the upper page is written.

Then, in association with the (J−7)th to (J−4)th writes, the word line WL(N−1) is selected in the string units SU0 to SU3, and in each of the string units, the data in the page is written.

Then, in association with the (J−3)th to Jth writes, the word line WL(N−2) is selected in the string units SU0 to SU3, and in each of the string units, the data in the upper page is written.

11.1.2 Second Example

Figure 36:
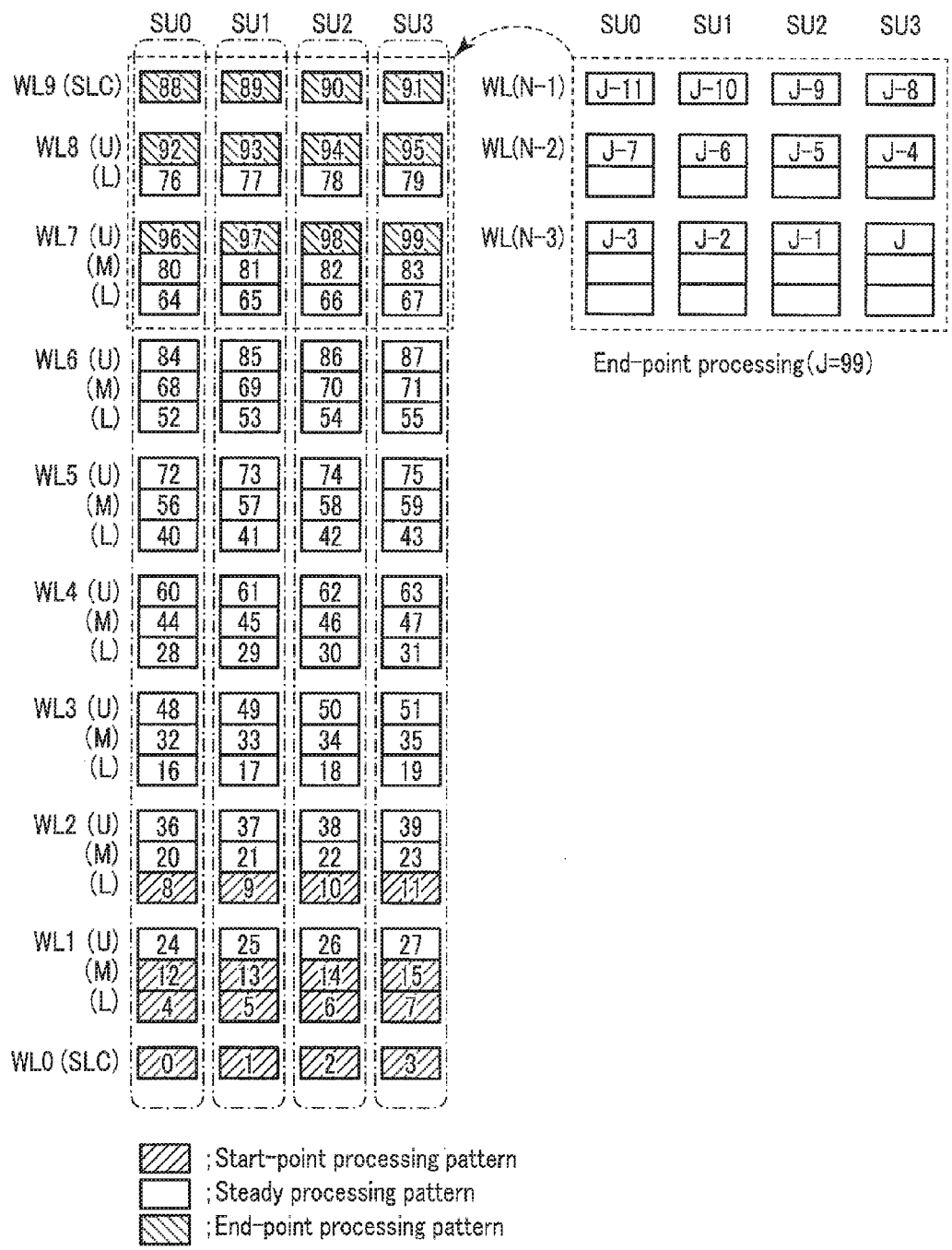
FIG. 36 is a diagram illustrating the writing order in a semiconductor memory device according to a second example in the 11th embodiment.

In a second example, a case will be described where the memory cell groups MCG corresponding to the word line WL(N−1) and the word line WL0 correspond to page-by-page write of 1 page, where the memory cell group MCG corresponding to the word line WL(N−2) corresponds to page-by-page write of 2 page, and where the memory cell groups MCG corresponding to the other word lines WL correspond to page-by-page write of 3 pages, as is the case with the second examples in the eighth and ninth embodiments. FIG. 36 schematically illustrates the writing order according to the second example. An example in FIG. 36 illustrates a case where the total number N of the word lines WL is 10 and where seven word lines WL correspond to write of 3 bits. In this case, the total number (J+1) of pages is 12N−20=100. The final number J of the writing order is 99. That is, the example in FIG. 36 illustrates that a total of 100 pages are present including pages (SLC) in the memory cell groups MCG corresponding to write of 1 page, lower pages (L) and upper pages (U) in the memory cell groups MCG corresponding to write of 2 pages, and lower pages (L), middle pages (M), and upper pages (U) in the memory cell groups MCG corresponding to write of 3 bits (pages).

(a) Start-Point Processing Pattern

The start-point processing pattern in the present example includes selection of the lowermost word line WL0 and corresponds to the zeroth to 15th writes. The start-point processing pattern is the same as the start-point processing pattern in the first example in the present embodiment.

(b) Steady Processing Pattern

The steady processing pattern is a main write pattern repeated according to the total number of the word lines WL from the end of the start-point processing pattern until the word line WL(N−4) (in the present example, the word line WL6) is selected in the string units SU0 to SU3, with the data in the upper page written in each of the string units SU0 to SU3. A basic write pattern is the same as the basic write pattern in the first example in the present embodiment. In the present example, the 16th to 87th writes correspond to the steady processing pattern.

First, the 16th to 27th writes are executed as is the case with the first example in the present embodiment.

A similar pattern is subsequently repeated to execute the 28th to 87th writes.

(c) End-Point Processing Pattern

Now, the end-point processing pattern in the present example will be described. In the present example, the 88th to 99th writes corresponding to the end-point processing pattern will be described as the (J−11)th to Jth writes.

As depicted in a right table in FIG. 36, in association with the (J−11)th to (J−8)th writes, the word line WL(N−1) is selected in the string units SU0 to SU3, and in each of the string units, the data in the page is written.

Then, in association with the (J−7)th to (J−4)th writes, the word line WL(N−2) is selected in the string units SU0 to SU3, and in each of the string units, the data in the upper page is written.

Then, in association with the (J−3)th to Jth writes, the word line WL(N−3) is selected in the string units SU0 to SU3, and in each of the string units, the data in the upper page is written.

11.1.3 Third Example

Figure 37:
FIG. 37 is a diagram illustrating the writing order in a semiconductor memory device according to a third example in the 11th embodiment.

In a second example, a case will be described where the memory cell groups MCG corresponding to the word line WL(N−1) and the word line WL0 correspond to page-by-page write of 1 page, where the memory cell groups MCG corresponding to the word lines WL(N−2) and WL(N−3) corresponds to page-by-page write of 2 page, and where the memory cell groups MCG corresponding to the other word lines WL correspond to page-by-page write of 3 pages, as is the case with the third examples in the eighth and ninth embodiments. FIG. 37 schematically illustrates the writing order according to the present example. An example in FIG. 37 illustrates a case where the total number N of the word lines WL is 11 and where seven word lines WL correspond to write of 3 bits. In this case, the total number (J+1) of pages is 12N−24=108. The final number J of the writing order is 107. That is, the example in FIG. 37 illustrates that a total of 108 pages are present including pages (SLC) in the memory cell groups MCG corresponding to write of 1 page, lower pages (L) and upper pages (U) in the memory cell groups MCG corresponding to write of 2 pages, and lower pages (L), middle pages (M), and upper pages (U) in the memory cell groups MCG corresponding to write of 3 bits (pages).

(a) Start-Point Processing Pattern

The start-point processing pattern in the present example includes selection of the lowermost word line WL0 and corresponds to the zeroth to 15th writes. The start-point processing pattern is the same as the start-point processing pattern in the first example and the second example in the present embodiment.

(b) Steady Processing Pattern

The steady processing pattern is a main write pattern repeated according to the total number of the word lines WL from the end of the start-point processing pattern until the word line WL(N−5) (in the present example, the word line WL6) is selected in the string units SU0 to SU3, with the data in the upper page written in each of the string units SU0 to SU3. A basic write pattern is the same as the basic write pattern in the first example and the second example in the present embodiment. In the present example, the 16th to 87th writes correspond to the steady processing pattern.

First, the 16th to 27th writes are executed as is the case with the first example in the present embodiment.

A similar pattern is subsequently repeated to execute the 28th to 87th writes.

(c) End-Point Processing Pattern

Now, the end-point processing pattern in the present example will be described. In the present example, the 88th to 107th writes corresponding to the end-point processing pattern will be described as the (J−19)th to Jth writes.

As depicted in a right table in FIG. 37, in association with the (J−19)th to (J−16)th writes, the word line WL(N−2) is selected in the string units SU0 to SU3, and in each of the string units, the data in the lower page is written.

In association with the (J−15)th to (J−12)th writes, the word line WL(N−3) is selected in the string units SU0 to SU3, and in each of the string units, the data in the upper page is written.

Then, in association with the (J−11)th to (J−8)th writes, the word line WL(N−4) is selected in the string units SU0 to SU3, and in each of the string units, the data in the upper page is written.

Then, in association with the (J−7)th to (J−4)th writes, the word line WL(N−1) is selected in the string units SU0 to SU3, and in each of the string units, the data in the page is written.

Then, in association with the (J−3)th to Jth writes, the word line WL(N−2) is selected in the string units SU0 to SU3, and in each of the string units, the data in the upper page is written.

11.2 Effects of the Present Embodiment

The configuration according to the present embodiment can produce effects similar to the effects of the 10th embodiment when 3 bits (3 pages) of data are written to the memory cell transistors MT (memory cell group MCG) on a page-by-page basis.

12. Modifications

The semiconductor memory device according to the above-described embodiments include a first memory unit (SU0 in FIG. 9) including first to fourth memory cells (MT1 to MT4 in SU0@FIG. 4, "9", "1", "17", and "8" pages in FIG. 9) stacked above a semiconductor substrate in order, a second memory unit (SU1 in FIG. 9) including fifth to eighth memory cells (MT1 to MT4 in SU1 in FIG. 4, "11", "3", "19", and "10" pages in FIG. 9) stacked above the semiconductor substrate in order, a first word line (WL1 in FIGS. 4 and 9) coupled to gates of the first and fifth memory cells, a second word line (WL2 in FIGS. 4 and 9) coupled to gates of the second and sixth memory cells, a third word line (WL3 in FIGS. 4 and 9) coupled to gates of the third and seventh memory cells, and a fourth word line (WL4 in FIGS. 4 and 9) coupled to gates of the fourth and eighth memory cells. In a write operation, writes to the fourth memory cell ("8" in FIG. 9), the first memory cell ("9" in FIG. 9), the eighth memory cell ("10" in FIG. 9), and the fifth memory cell ("11" in FIG. 9) are executed in order.

Application of the above-described embodiments allows provision of a semiconductor memory device and a memory system that can be made more reliable.

The embodiments are not limited to the above-described forms, but various modifications may be made to the embodiments.

12.1 First Modification

For example, in the first, third, fourth, and fifth embodiments, the number of bits of data that can be held by the memory cell transistor MT may vary according to the corresponding word line WL. That is, when data is written in the full sequence, the number of pages contained in the full sequence unit FSU may vary according to the corresponding word line WL. An example will be described using FIG. 38.

FIG. 38 is a block diagram depicting a configuration of the full sequence units FSU in one block BLK in the present modification. Each rectangle in FIG. 38 represents one full sequence unit FSU corresponding to one word line WL in a certain string unit SU. SLC in the rectangle indicates that the corresponding memory cell transistor MT can hold 1 bit of data. That is, SLC indicates that the full sequence unit FSU contains 1 page of data. MLC in the rectangle indicates that the corresponding memory cell transistor MT can hold 2 bits of data. That is, MLC indicates that the full sequence unit FSU contains 2 pages of data. QLC in the rectangle indicates that the corresponding memory cell transistor MT can hold 4 bits of data. That is, QLC indicates that the full sequence unit FSU contains 4 pages of data.

As depicted in FIG. 38, the total number N of the word lines WL is 13. The full sequence unit FSU corresponding to the word lines WL0 and WL12 (that is, the word line WL(N−1)) contains 1 page of data. The full sequence unit FSU corresponding to the word lines WL1 and WL11 (that is, the word line WL(N−2)) contains 2 pages of data. The full sequence unit FSU corresponding to the other word lines contains 4 page of data. Even this configuration produces effects similar to the effects of the first, third, fourth, and fifth embodiments.

12.2 Second Modification

Figure 39:
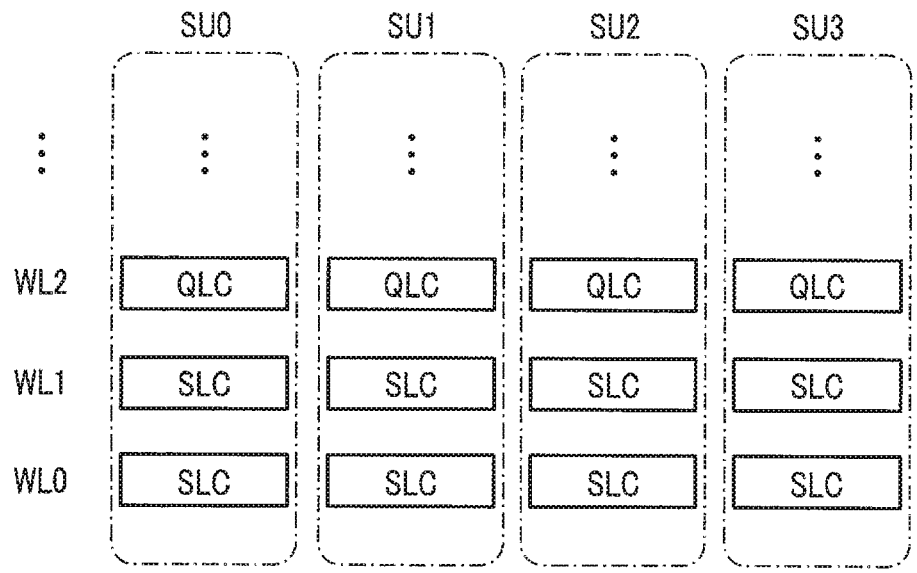
FIG. 39 is a block diagram depicting a configuration of full sequence units FSU in one block in a semiconductor memory device according to a second modification.

In a second modification, a configuration of the full sequence units FSU different from the configuration in the first modification will be described. FIG. 39 is a block diagram depicting a configuration of the full sequence units FSU in one block BLK in the present modification. An example in FIG. 39 illustrates a configuration of the full sequence units FSU corresponding to the word lines WL0 to WL2. Only differences from the first modification will be described.

As depicted in FIG. 39, the full sequence unit FSU corresponding to the word lines WL0 and WL1 may contain 1 page of data, and the full sequence unit FSU corresponding to the word line WL2 may contain 4 pages of data. Even this configuration produces effects similar to the effects of the first, third, fourth, and fifth embodiments.

12.3 Third Modification

Figure 40:
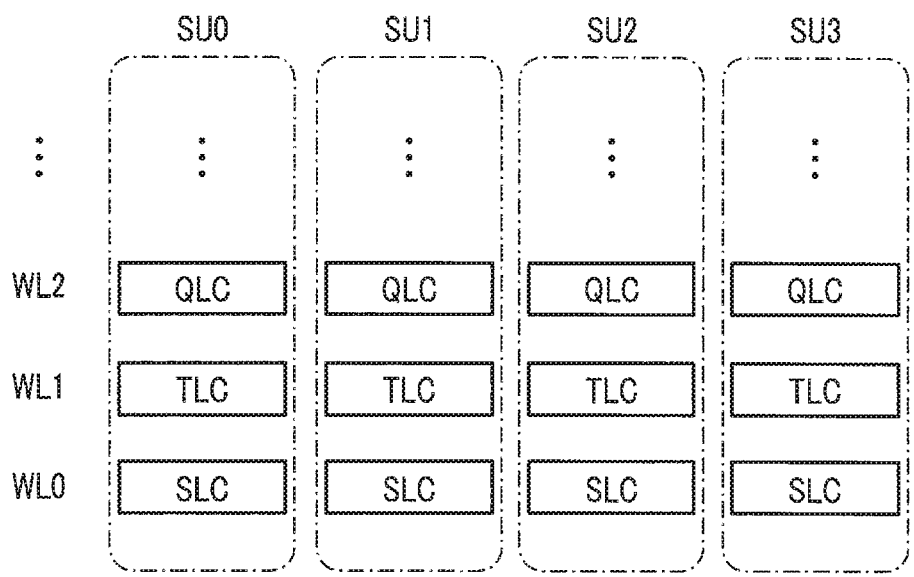
FIG. 40 is a block diagram depicting a configuration of full sequence units FSU in one block in a semiconductor memory device according to a third modification.

In a third modification, a configuration of the full sequence units FSU different from the configurations in the first and second modifications will be described. FIG. 40 is a block diagram depicting a configuration of the full sequence units FSU in one block BLK in the present modification. An example in FIG. 40 illustrates a configuration of the full sequence units FSU corresponding to the word lines WL0 to WL2. TLC in rectangles in FIG. 40 indicates that the corresponding memory cell transistors MT can each hold 3 bits of data. That is, QLC indicates that the full sequence unit FSU contains 3 pages of data. Only differences from the first and second modifications will be described.

As depicted in FIG. 40, the full sequence unit FSU corresponding to the word line WL0 may contain 1 page of data. The full sequence unit FSU corresponding to the word line WL1 contains 3 pages of data. The full sequence unit FSU corresponding to the word line WL2 may contain 4 pages of data. Even this configuration produces effects similar to the effects of the first, third, fourth, and fifth embodiments.

12.4 Fourth Modification

Figure 41:
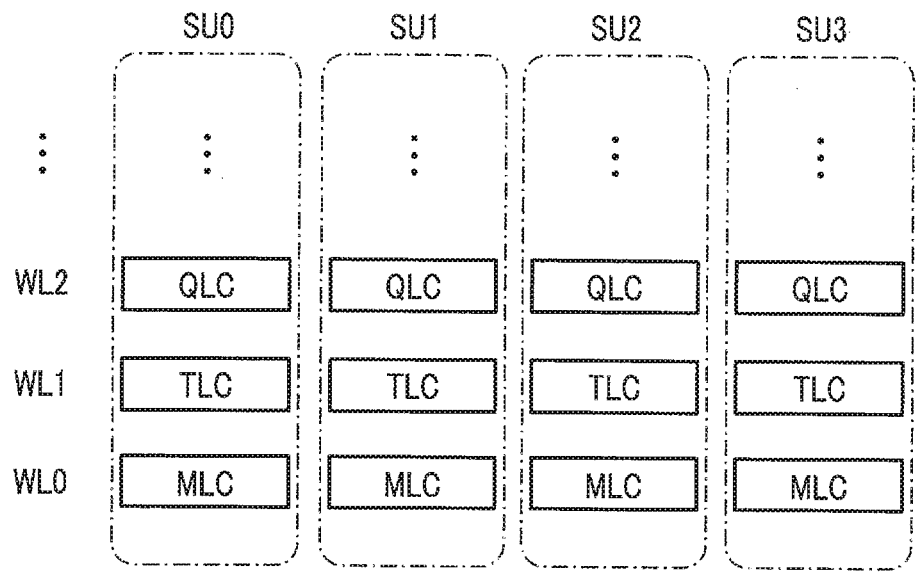
FIG. 41 is a block diagram depicting a configuration of full sequence units FSU in one block in a semiconductor memory device according to a fourth modification.

In a fourth modification, a configuration of the full sequence units FSU different from the configurations in the first to third modifications will be described. FIG. 41 is a block diagram depicting a configuration of the full sequence units FSU in one block BLK in the present modification. An example in FIG. 41 illustrates a configuration of the full sequence units FSU corresponding to the word lines WL0 to WL2. Only differences from the first to third modifications will be described below.

As depicted in FIG. 41, the full sequence unit FSU corresponding to the word line WL0 may contain 2 pages of data. The full sequence unit FSU corresponding to the word line WL1 contains 3 pages of data. The full sequence unit FSU corresponding to the word line WL2 may contain 4 pages of data. Even this configuration produces effects similar to the effects of the first, third, fourth, and fifth embodiments.

12.5 Fifth Modification

Figure 42:
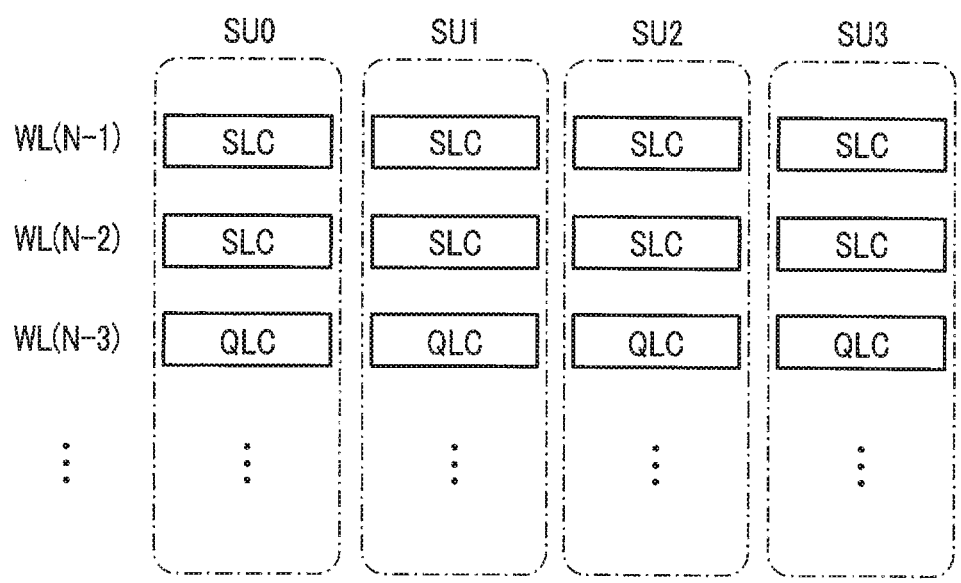
FIG. 42 is a block diagram depicting a configuration of full sequence units FSU in one block in a semiconductor memory device according to a fifth modification.

In a fifth modification, a configuration of the full sequence units FSU different from the configurations in the first to fourth modifications will be described. FIG. 42 is a block diagram depicting a configuration of the full sequence units FSU in one block BLK in the present modification. An example in FIG. 42 illustrates a configuration of the full sequence units FSU corresponding to the word lines WL(N−1) to WL(N−3). Only differences from the first modification will be described.

As depicted in FIG. 42, the full sequence unit FSU corresponding to the word lines WL(N−1) and WL(N−2) may contain 1 page of data. The full sequence unit FSU corresponding to the word line WL(N−3) contains 4 pages of data. Even this configuration produces effects similar to the effects of the first, third, fourth, and fifth embodiments.

12.6 Sixth Modification

Figure 43:
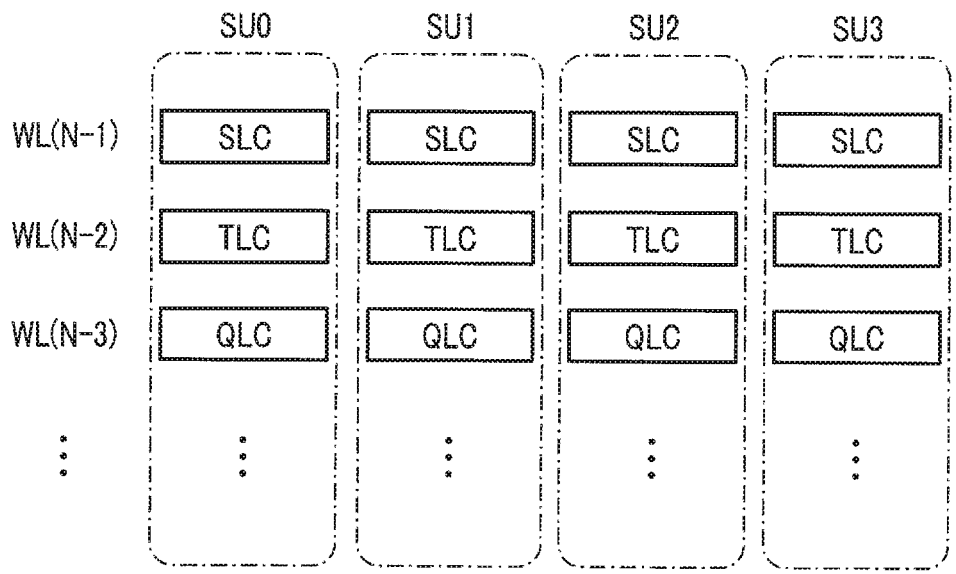
FIG. 43 is a block diagram depicting a configuration of full sequence units FSU in one block in a semiconductor memory device according to a sixth modification.

In a sixth modification, a configuration of the full sequence units FSU different from the configurations in the first to fifth modifications will be described. FIG. 43 is a block diagram depicting a configuration of the full sequence units FSU in one block BLK in the present modification. An example in FIG. 43 illustrates a configuration of the full sequence units FSU corresponding to the word lines WL(N−1) to WL(N−3). Only differences from the first and fifth modifications will be described.

As depicted in FIG. 43, the full sequence unit FSU corresponding to the word line WL(N−1) may contain 1 page of data. The full sequence unit FSU corresponding to the word line WL(N−2) contains 3 pages of data. The full sequence unit FSU corresponding to the word line WL(N−3) contains 4 pages of data. Even this configuration produces effects similar to the effects of the first, third, fourth, and fifth embodiments.

12.7 Seventh Modification

Figure 44:
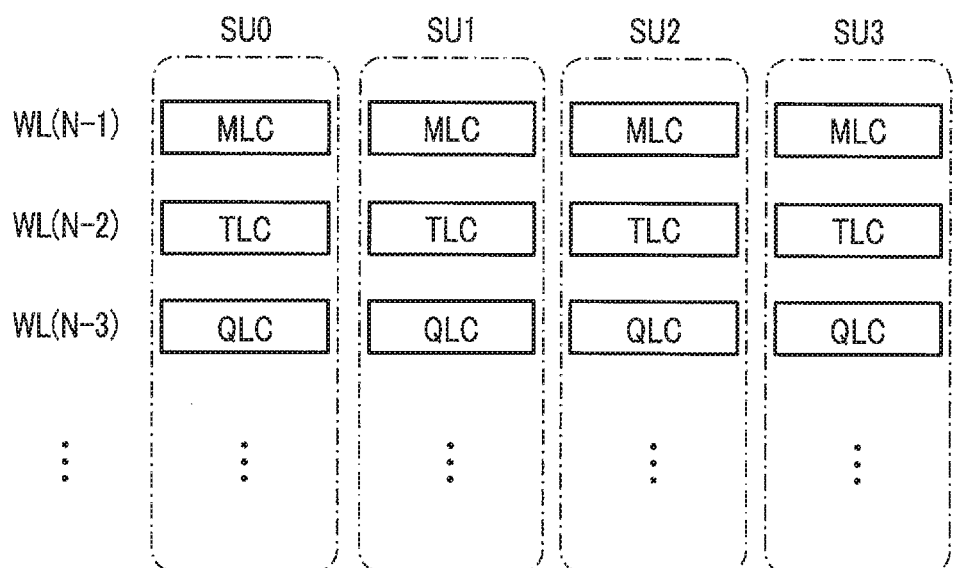
FIG. 44 is a block diagram depicting a configuration of full sequence units FSU in one block in a semiconductor memory device according to a seventh modification.

In a seventh modification, a configuration of the full sequence units FSU different from the configurations in the first to sixth modifications will be described. FIG. 44 is a block diagram depicting a configuration of the full sequence units FSU in one block BLK in the present modification. An example in FIG. 44 illustrates a configuration of the full sequence units FSU corresponding to the word lines WL(N−1) to WL(N−3). Only differences from the first, fifth, and sixth modifications will be described.

As depicted in FIG. 44, the full sequence unit FSU corresponding to the word line WL(N−1) may contain 2 pages of data. The full sequence unit FSU corresponding to the word line WL(N−2) contains 3 pages of data. The full sequence unit FSU corresponding to the word line WL(N−3) contains 4 pages of data. Even this configuration produces effects similar to the effects of the first, third, fourth, and fifth embodiments.

12.8 Other Modifications

In the above-described modifications, the first to seventh modifications may be combined together wherever possible. For example, the first modification, the second modification, and the fifth modification may be combined together. More specifically, the full sequence unit FSU corresponding to the word lines WL0, WL1, WL11 (that is, the word line WL(N−2)), and WL12 (that is, the word line WL(N−1)) contains 1 page of data. The full sequence unit FSU corresponding to the word line WL2, the word line WL10 (that is, WL(N−3)), and the other word lines WL contains 4 pages of data. Such a configuration may be applied.

Moreover, in the sixth to 11th embodiments, the order in which data is written on a page-by-page basis has been described which is used when the memory cell transistor MT can hold 2 bits or 3 bits of data. However, The number of bits of data that can be held by the memory cell transistor MT may be four or more. That is, the number of pages contained in the memory cell group MCG may be four or more. Moreover, the number of bits of data that can be held by the memory cell transistor MT may vary according to the corresponding word line WL.

Moreover, the above-described embodiments may be applied to a three-dimensional stacked NAND flash memory or a planar NAND flash memory 100. The above-described embodiments are not limited to the NAND flash memory but may be applied to a semiconductor memory device including nonvolatile storage elements.

The terms "couple" and "connect" in the above-described embodiments include a state of indirect coupling or connection between objects via another object, for example, a transistor or a resistor.

The above-described embodiments may also be as described below. For example, the memory cell transistor MT is assumed to be able to hold 2 bits (four values), and possible threshold levels when the memory cell transistor MT holds one of the four values are assumed to include an E level (erase level), an A level, a B level, and a C level in order of increasing level.

(1) In a read operation, a voltage applied to a word line selected for a read operation at the A level is, for example, between 0 V and 0.55 V. The embodiments are not limited to this. The voltage may be between 0.1 V and 0.24 V, between 0.21 V and 0.31 V, between 0.31 V and 0.4 V, between 0.4 V and 0.5 V, or between 0.5 V and 0.55 V.

A voltage applied to a word line selected for a read operation at the B level is, for example, between 1.5 V and 2.3 V. The embodiments are not limited to this. The voltage may be between 1.65V and 1.8V, between 1.8V and 1.95V, between 1.95V and 2.1V, or between 2.1V and 2.3V.

A voltage applied to a word line selected for a read operation at the C level is, for example, between 3.0 V and 4.0 V. The embodiments are not limited to this. The voltage may be between 3.0V and 3.2V, between 3.2V and 3.4V, between 3.4V and 3.5V, between 3.5V and 3.6V, or between 3.6V and 4.0V.

A time (tR) for the read operation may be, for example, between 25 µs and 38 µs, between 38 µs and 70 µs, or between 70 µs and 80 µs.

(2) The write operation includes the program operation and the verify operation as described above. In the write operation, a voltage applied first to a word line selected during the program operation is, for example, between 13.7 V and 14.3 V. The embodiments are not limited to this. The voltage may be, for example, between 13.7 V and 14.0 V or between 14.0 V and 14.6 V.

A voltage applied first to a selected word line when write is executed through an odd-numbered word line may be different from a voltage applied first to a selected word line when write is executed through an even-numbered word line.

When the program operation is based on an ISPP (Incremental Step Pulse Program) scheme, a step-up voltage may be, for example, approximately 0.5 V.

A voltage applied to the unselected word lines may be, for example, between 6.0 V and 7.3 V. The embodiments are not limited to this. For example, the voltage may be between 7.3 v and 8.4 V or may be 6.0 V or less.

A pass voltage applied to the unselected word line may vary depending on whether the unselected word line is odd- or even-numbered.

A time (tProg) for the write operation may be, for example, between 1700 µs and 1800 µs, between 1800 µs and 1900 µs, or between 1900 µs and 2000 µs.

(3) In the erase operation, a voltage between, for example, 12 V and 13.6 V is applied first to a well formed in an upper portion of the semiconductor substrate and over which the memory cells are arranged. The embodiments are not limited to this. The voltage may be, for example, between 13.6V and 14.8V, between 14.8V and 19.0V, between 19.0 and 19.8V, or between 19.8 V and 21 V.

A time (tErase) for the erase operation may be, for example, between 3000 µs and 4000 µs, between 4000 µs and 5000 µs, or between 4000 µs and 9000 µs.

(4) The memory cell is structured to have a charge storage layer arranged on the semiconductor substrate (silicon substrate) via a tunnel insulating film with a film thickness of 4 to 10 mm. The charge storage layer may have a stack structure including an insulating film such as SiN or SiON having a film thickness of 2 to 3 nm and a polysilicon film having a film thickness of 3 to 8 nm. Metal such as Ru may be applied to the polysilicon. An insulating film is provided on the charge storage layer. The insulating film has a silicon oxide film having a film thickness of 4 to 10 nm and sandwiched between an underlayer high-k film with a film thickness of 3 to 10 nm and an upper-layer high-k film with a film thickness of 3 to 10 nm. The high-k film may be HfO. The silicon oxide film may have a larger film thickness than the high-k film. A control electrode with a film thickness of 30 nm to 70 nm is formed on the insulating film via a material for work function adjustment having a film thickness of 3 to 10 nm. The material for work function adjustment may be a metal oxide film such as TaO or a metal nitride film such as TaN. The control electrode may be W or the like.

An air gap may be formed between the memory cell transistors.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory unit including first to fourth memory cells stacked above a semiconductor substrate in order;
   a second memory unit including fifth to eighth memory cells stacked above the semiconductor substrate in order;
   a first word line coupled to gates of the first and fifth memory cells;
   a second word line coupled to gates of the second and sixth memory cells;
   a third word line coupled to gates of the third and seventh memory cells; and
   a fourth word line coupled to gates of the fourth and eighth memory cells,
   wherein, in a write operation, writes to the fourth memory cell, the first memory cell, the eighth memory cell, and the fifth memory cell are executed in order.

2. The device according to claim 1, wherein
   in the write operation, when the write to the fourth memory cell is executed, the second and sixth memory cells are in written states and the third and seventh memory cells are in unwritten states.

3. The device according to claim 1 further comprising:
   a third memory cell unit including ninth to 14th memory cells stacked above the semiconductor substrate in order;
   a fifth word line coupled to a gate of the 13th memory cell; and
   a sixth word line coupled to a gate of the 14th memory cell,
   wherein gates of the ninth to 12th memory cells are coupled to the first to fourth word lines, respectively, and
   in the write operation, writes to the fifth memory cell and the 14th memory cell are executed in order.

4. The device according to claim 3, wherein
   writes to the 14th memory cell and the 11th memory cell are executed in order.

5. The device according to claim 1 further comprising:
   a ninth memory cell included in the first memory cell unit and located below the first memory cell;
   a 10th memory cell included in the second memory cell unit and located below the fifth memory cell; and
   a fifth word line coupled to gates of the ninth and 10th memory cells,
   wherein when the fourth memory cell is in a unwritten state, writes to the ninth memory cell, the second memory cell, the 10th memory cell, and the sixth memory cell are executed in order.

6. The device according to claim 1 further comprising:
a first bit line coupled to the first to fourth memory cells; and
a second bit line coupled to the fifth to eighth memory cells.

7. The device according to claim 1, wherein
each of the first to eighth memory cells includes a charge storage layer to store data in a nonvolatile manner.

8. A memory system comprising:
a semiconductor memory device; and
a controller controlling a writing order in the device,
wherein the semiconductor memory device includes:
a first memory unit including first to fourth memory cells stacked above a semiconductor substrate in order;
a second memory unit including fifth to eighth memory cells stacked above the semiconductor substrate in order;
a first word line coupled to gates of the first and fifth memory cells;
a second word line coupled to gates of the second and sixth memory cells;
a third word line coupled to gates of the third and seventh memory cells; and
a fourth word line coupled to gates of the fourth and eighth memory cells, and
in a write operation, the controller orders the device to write to the fourth memory cell, the first memory cell, the eighth memory cell, and the fifth memory cell in order.

9. The system according to claim 8, wherein
in the write operation, when the write to the fourth memory cell is executed, the second and sixth memory cells are in written states and the third and seventh memory cells are in unwritten states.

10. The system according to claim 8, wherein
the device further includes:
a third memory cell unit including ninth to 14th memory cells stacked above the semiconductor substrate in order;
a fifth word line coupled to a gate of the 13th memory cell; and
a sixth word line coupled to a gate of the 14th memory cell,
gates of the ninth to 12th memory cells are coupled to the first to fourth word lines, respectively, and
in the write operation, the controller orders the device to write to the fifth memory cell and the 14th memory cell in order.

11. The system according to claim 10, wherein
writes to the 14th memory cell and the 11th memory cell are executed in order.

12. The system according to claim 8, wherein
the device further includes:
a ninth memory cell included in the first memory cell unit and located below the first memory cell;
a 10th memory cell included in the second memory cell unit and located below the fifth memory cell; and
a fifth word line coupled to gates of the ninth and 10th memory cells, and
the controller orders the device to write to the ninth memory cell, the second memory cell, the 10th memory cell, and the sixth memory cell in order when the fourth memory cell is in a unwritten state.

13. The system according to claim 8, wherein
the device further includes:
a first bit line coupled to the first to fourth memory cells; and
a second bit line coupled to the fifth to eighth memory cells.

14. The system according to claim 8, wherein
each of the first to eighth memory cells includes a charge storage layer to store data in a nonvolatile manner.

15. A semiconductor memory device comprising:
a first memory unit including first to third memory cells stacked above a semiconductor substrate in order;
a second memory unit including fourth to sixth memory cells stacked above the semiconductor substrate in order;
a third memory unit including seventh to ninth memory cells stacked above the semiconductor substrate in order;
a first word line coupled to gates of the first, fourth, and seventh memory cells;
a second word line coupled to gates of the second, fifth, and eighth memory cells; and
a third word line coupled to gates of the third, sixth, and ninth memory cells,
wherein, in a write operation, writes to the seventh memory cell, the fifth memory cell, and the third memory cell are executed in order.

16. The device according to claim 15, wherein
in the write operation, when the write to the seventh memory cell is executed, first, second, and fourth memory cells are in written states and the sixth, eighth, and ninth memory cells are in unwritten states.

17. The device according to claim 15, wherein
in the write operation, when the seventh memory cell is in a unwritten state, writes to the fourth memory cell and the second memory cell are executed in order.

18. The device according to claim 15, wherein
in the write operation, when the third memory cell is in a written state, writes to the eighth memory cell and the sixth memory cell are executed in order.

19. The device according to claim 15 further comprising:
a first bit line coupled to the first to third memory cells;
a second bit line coupled to the fourth to sixth memory cells; and
a third bit line coupled to the seventh to ninth memory cells.

20. The device according to claim 15, wherein
each of the first to ninth memory cells includes a charge storage layer to store data in a nonvolatile manner.

* * * * *